United States Patent
Yamazaki et al.

(10) Patent No.: US 9,520,410 B2
(45) Date of Patent: *Dec. 13, 2016

(54) DISPLAY DEVICE AND METHOD FOR MANUFACTURING THE SAME

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Satoshi Murakami, Kanagawa (JP); Motomu Kurata, Kanagawa (JP); Hiroyuki Hata, Tochigi (JP); Mitsuhiro Ichijo, Tochigi (JP); Takashi Ohtsuki, Kanagawa (JP); Aya Anzai, Kanagawa (JP); Masayuki Sakakura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 198 days.

This patent is subject to a terminal disclaimer.

(21) Appl. No.: 14/446,934

(22) Filed: Jul. 30, 2014

(65) Prior Publication Data

US 2014/0332819 A1    Nov. 13, 2014

Related U.S. Application Data

(63) Continuation of application No. 13/615,805, filed on Sep. 14, 2012, now Pat. No. 8,829,527, which is a (Continued)

(30) Foreign Application Priority Data

Jul. 30, 2004  (JP) .................................. 2004-224660

(51) Int. Cl.
*H01L 27/14* (2006.01)
*H01L 29/04* (2006.01)
(Continued)

(52) U.S. Cl.
CPC .......... *H01L 27/1222* (2013.01); *H01L 27/12* (2013.01); *H01L 27/124* (2013.01);
(Continued)

(58) Field of Classification Search
CPC .......... H01L 27/1214; H01L 29/78621; H01L 29/4908; H01L 29/78675; H01L 2251/5315; H01L 27/13; H01L 29/66765; H01L 51/5237; H01L 27/3248; H01L 51/5246; H01L 51/5253; H01L 2251/5323; H01L 27/12; H01L 27/1222; H01L 27/124; H01L 27/1248; H01L 27/3244; H01L 27/3276; H01L 33/60; H01L 51/0005; H01L 51/56
See application file for complete search history.

(56) References Cited

U.S. PATENT DOCUMENTS 5,623,157 A    4/1997  Miyazaki et al.
6,288,764 B1   9/2001  Zhang et al.
(Continued)

FOREIGN PATENT DOCUMENTS

CN    001310480 A    8/2001
CN    001409581 A    4/2003
(Continued)

OTHER PUBLICATIONS

Chinese Office Action (Application No. 200510087905.8) Dated Jul. 4, 2008.
(Continued)

*Primary Examiner* — Meiya Li
(74) *Attorney, Agent, or Firm* — Nixon Peabody LLP; Jeffrey L. Costellia

(57) ABSTRACT

The present invention provides a method for manufacturing a highly reliable display device at a low cost with high yield. According to the present invention, a step due to an opening
(Continued)

in a contact is covered with an insulating layer to reduce the step, and is processed into a gentle shape. A wiring or the like is formed to be in contact with the insulating layer and thus the coverage of the wiring or the like is enhanced. In addition, deterioration of a light-emitting element due to contaminants such as water can be prevented by sealing a layer including an organic material that has water permeability in a display device with a sealing material. Since the sealing material is formed in a portion of a driver circuit region in the display device, the frame margin of the display device can be narrowed.

16 Claims, 27 Drawing Sheets

Related U.S. Application Data continuation of application No. 13/486,017, filed on Jun. 1, 2012, now Pat. No. 8,823,009, which is a continuation of application No. 11/184,086, filed on Jul. 19, 2005, now Pat. No. 8,217,396.

(51) Int. Cl.
| | | |
|---|---|---|
| *H01L 29/15* | (2006.01) | |
| *H01L 31/036* | (2006.01) | |
| *H01L 27/12* | (2006.01) | |
| *H01L 27/32* | (2006.01) | |
| *H01L 51/52* | (2006.01) | |
| *H01L 33/60* | (2010.01) | |
| H01L 51/00 | (2006.01) | |
| H01L 51/56 | (2006.01) | |

(52) U.S. Cl.
CPC ...... *H01L 27/1214* (2013.01); *H01L 27/1248* (2013.01); *H01L 27/3244* (2013.01); *H01L 33/60* (2013.01); *H01L 51/5246* (2013.01); H01L 27/3276 (2013.01); H01L 51/0005 (2013.01); H01L 51/56 (2013.01); H01L 2224/4847 (2013.01); H01L 2251/5323 (2013.01)

(56) References Cited

U.S. PATENT DOCUMENTS

| | | | |
|---|---|---|---|
| 6,531,815 B1 | 3/2003 | Okuyama et al. | |
| 6,690,110 B1 | 2/2004 | Yamada et al. | |
| 6,739,931 B2 | 5/2004 | Yamazaki et al. | |
| 6,781,162 B2 | 8/2004 | Yamazaki et al. | |
| 6,822,264 B2 | 11/2004 | Yamazaki et al. | |
| 6,833,560 B2 | 12/2004 | Konuma et al. | |
| 6,867,541 B2 | 3/2005 | Okuyama et al. | |
| 6,911,688 B2 | 6/2005 | Yamazaki et al. | |
| 6,992,332 B2 | 1/2006 | Yamazaki et al. | |
| 6,995,048 B2 | 2/2006 | Yoneda et al. | |
| 6,995,511 B2 | 2/2006 | Yamazaki et al. | |
| 7,042,024 B2 | 5/2006 | Yamazaki et al. | |
| 7,108,574 B2 | 9/2006 | Seo et al. | |
| 7,109,650 B2 | 9/2006 | Park et al. | |
| 7,132,693 B2 | 11/2006 | Konuma et al. | |
| 7,148,510 B2 | 12/2006 | Yamazaki et al. | |
| 7,193,359 B2 | 3/2007 | Seo et al. | |
| 7,265,391 B2 | 9/2007 | Yamazaki et al. | |
| 7,288,420 B1 | 10/2007 | Yamazaki et al. | |
| 7,375,376 B2 | 5/2008 | Yamazaki et al. | |
| 7,393,707 B2 | 7/2008 | Yamazaki et al. | |
| 7,402,945 B2 | 7/2008 | Yamazaki et al. | |
| 7,442,963 B2 | 10/2008 | Yamazaki et al. | |
| 7,459,849 B2 | 12/2008 | Yamazaki et al. | |
| 7,462,501 B2 | 12/2008 | Yamazaki et al. | |
| 7,514,868 B2 | 4/2009 | Yamazaki et al. | |
| 7,709,846 B2 | 5/2010 | Yamazaki et al. | |
| 7,723,179 B2 | 5/2010 | Yamazaki et al. | |
| 7,880,167 B2 | 2/2011 | Yamazaki et al. | |
| 7,939,835 B2 | 5/2011 | Yamazaki et al. | |
| 7,964,874 B2 | 6/2011 | Yamazaki et al. | |
| 2001/0011868 A1* | 8/2001 | Fukunaga | H01L 27/1214 313/506 |
| 2002/0004361 A1 | 1/2002 | Izumi et al. | |
| 2002/0013022 A1 | 1/2002 | Yamazaki et al. | |
| 2002/0021266 A1 | 2/2002 | Koyama et al. | |
| 2002/0153831 A1 | 10/2002 | Sakakura et al. | |
| 2003/0057422 A1 | 3/2003 | Yamazaki et al. | |
| 2003/0156239 A1* | 8/2003 | Inoue | G02F 1/133553 349/113 |
| 2003/0193054 A1 | 10/2003 | Hayakawa et al. | |
| 2003/0197178 A1 | 10/2003 | Yamazaki et al. | |
| 2003/0230764 A1 | 12/2003 | Yamazaki et al. | |
| 2004/0072380 A1 | 4/2004 | Yamazaki et al. | |
| 2006/0084213 A1 | 4/2006 | Yamazaki et al. | |
| 2006/0202615 A1 | 9/2006 | Murakami et al. | |
| 2007/0051959 A1 | 3/2007 | Konuma et al. | |
| 2007/0114921 A1 | 5/2007 | Yamazaki et al. | |
| 2009/0243464 A1 | 10/2009 | Yamazaki et al. | |
| 2011/0108863 A1 | 5/2011 | Yamazaki et al. | |
| 2011/0133635 A1 | 6/2011 | Yamazaki et al. | |
| 2011/0180801 A1 | 7/2011 | Yamazaki et al. | |
| 2013/0134401 A1 | 5/2013 | Murakami et al. | |
| 2015/0001545 A1 | 1/2015 | Yamazaki et al. | |

FOREIGN PATENT DOCUMENTS

| | | |
|---|---|---|
| CN | 001434668 A | 8/2003 |
| CN | 001444427 A | 9/2003 |
| CN | 001458640 A | 11/2003 |
| EP | 1058314 A | 12/2000 |
| EP | 1128436 A | 8/2001 |
| EP | 1298736 A | 4/2003 |
| EP | 1331666 A | 7/2003 |
| EP | 1343206 A | 9/2003 |
| EP | 1376713 A | 1/2004 |
| EP | 1388897 A | 2/2004 |
| JP | 11-109889 A | 4/1999 |
| JP | 2001-102169 A | 4/2001 |
| JP | 2001-109395 A | 4/2001 |
| JP | 2001-203076 A | 7/2001 |
| JP | 2002-164181 A | 6/2002 |
| JP | 2003-308027 A | 10/2003 |
| JP | 2004-006243 A | 1/2004 |
| JP | 2004-047411 A | 2/2004 |
| JP | 2004-047446 A | 2/2004 |
| JP | 2004-111361 A | 4/2004 |
| KR | 2003-0029108 A | 4/2003 |
| WO | WO02/095834 | 11/2002 |

OTHER PUBLICATIONS

Korean Office Action (Application No. 2005-0069448) Dated Mar. 23, 2012.

Amendment (U.S. Appl. No. 14/481,458) filed Nov. 11, 2015.

* cited by examiner

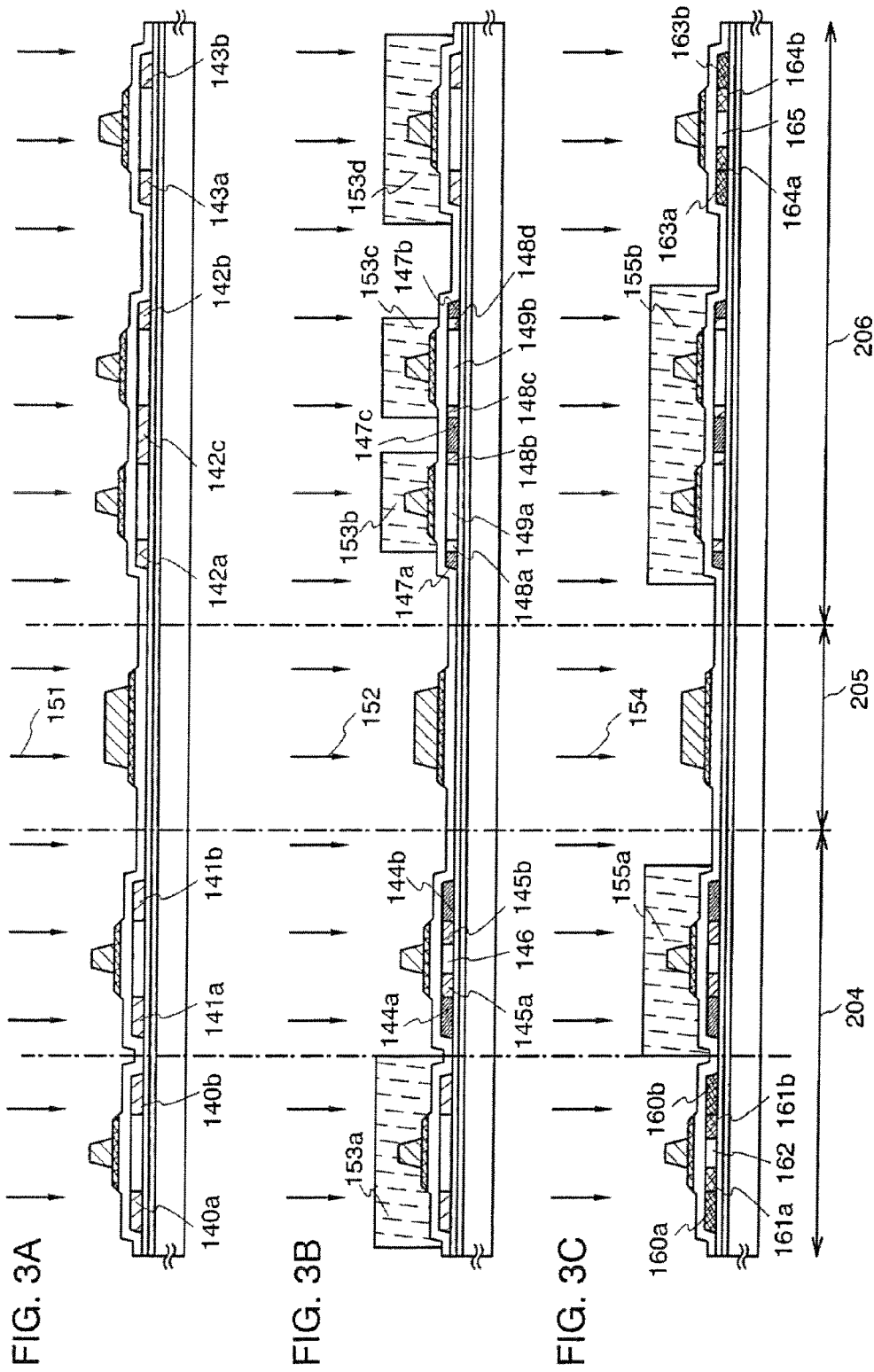

FIG. 4A
FIG. 4B
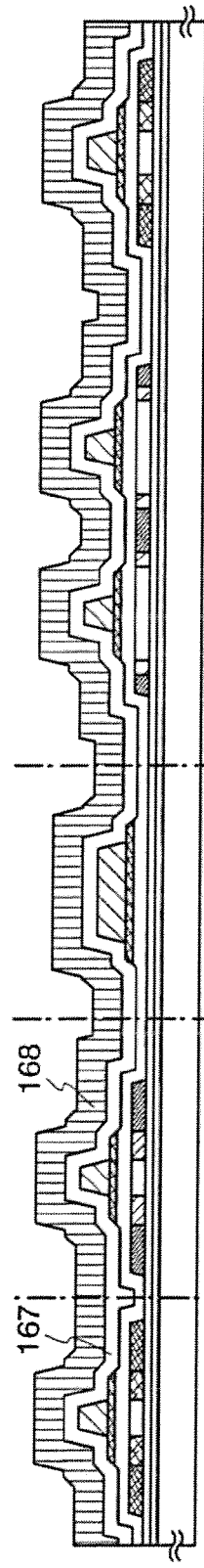
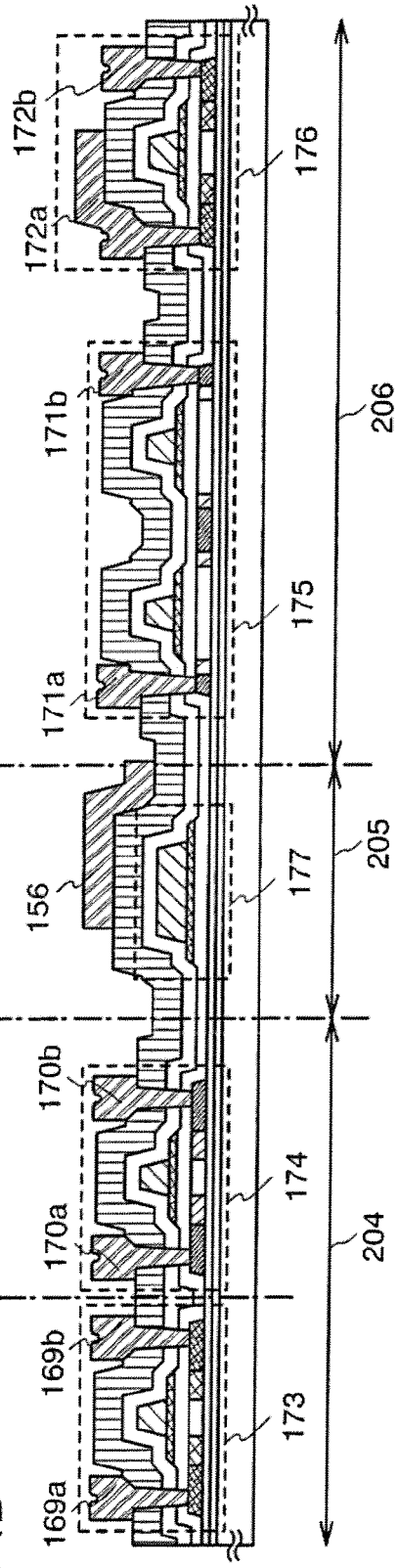

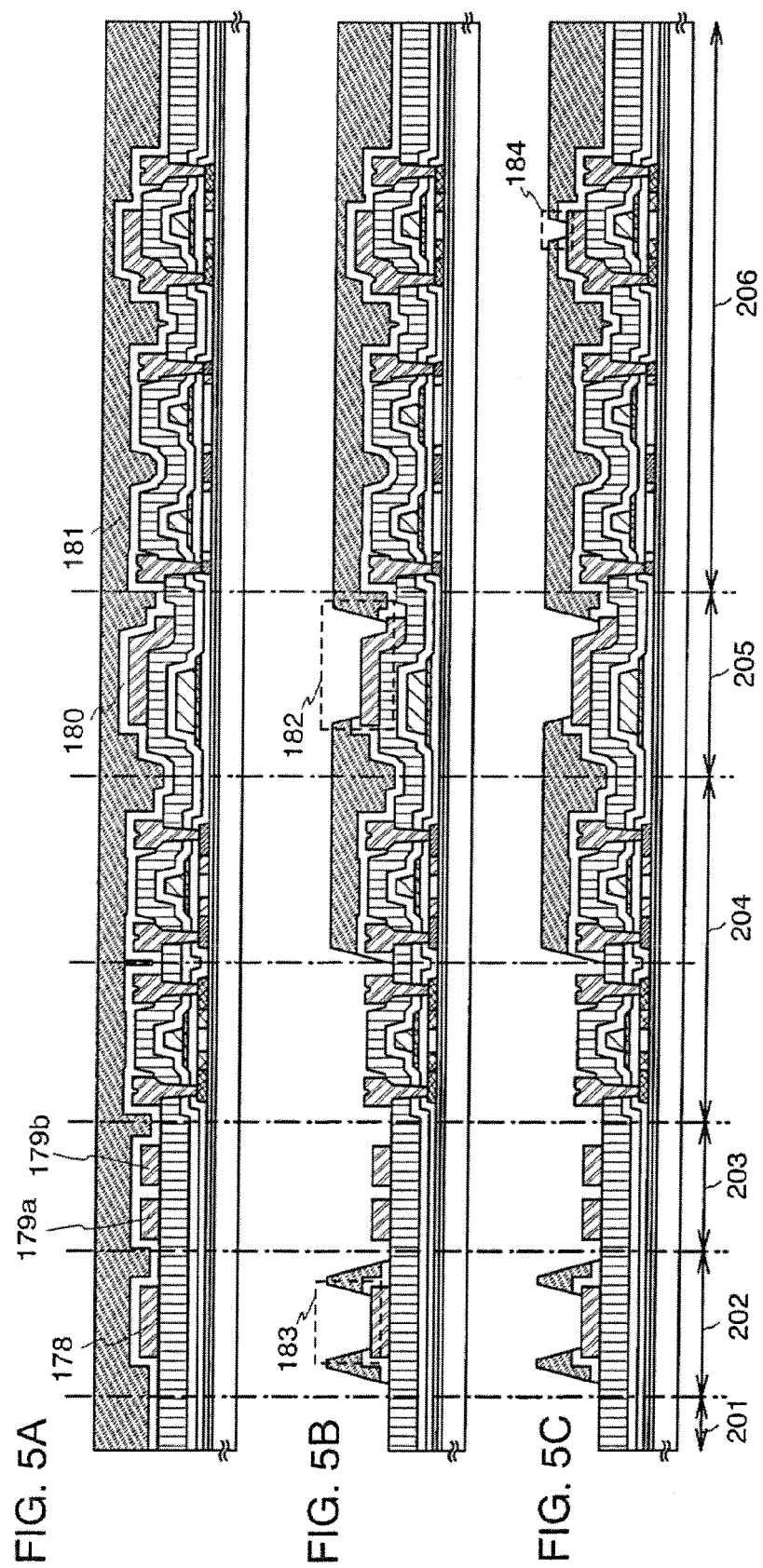

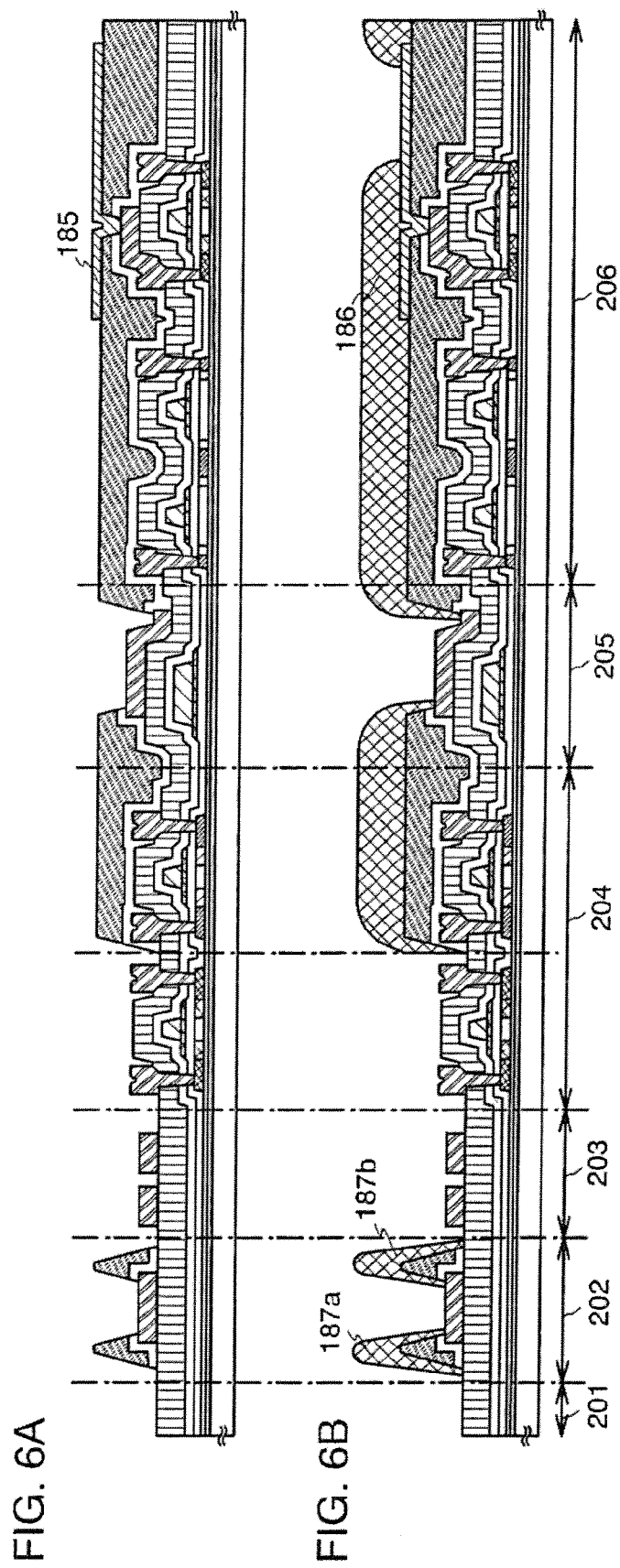

FIG. 22A CONDITION A
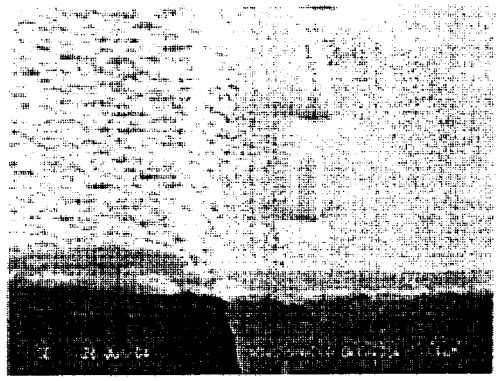
FIG. 22B CONDITION B
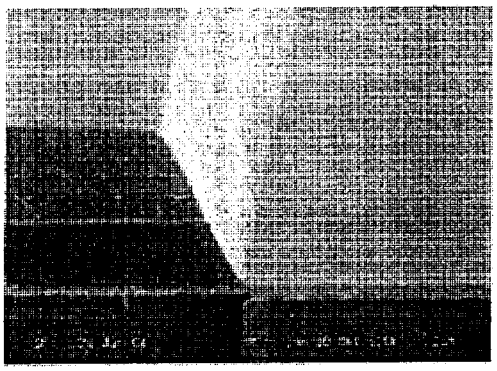
FIG. 22C CONDITION C
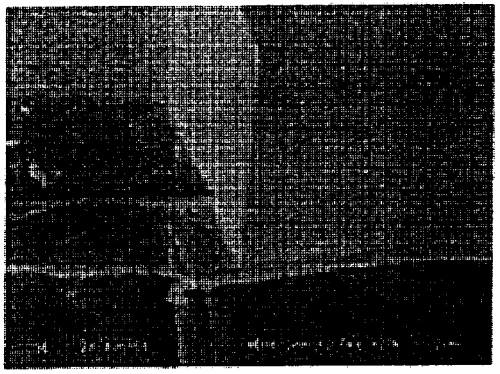
FIG. 22D CONDITION D
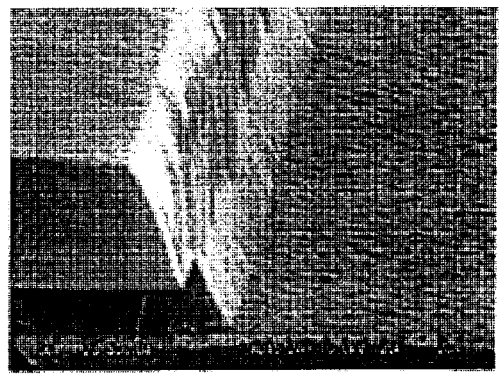
FIG. 22E CONDITION E
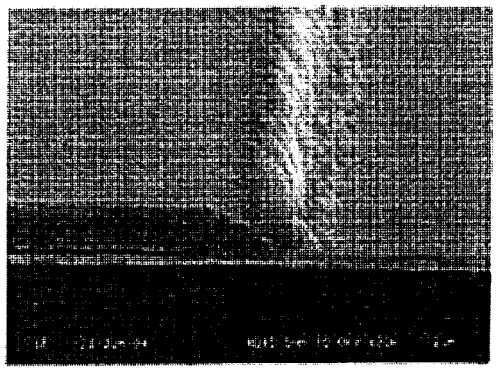

FIG. 22F CONDITION F
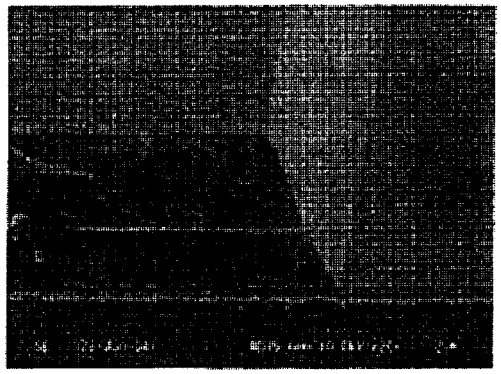
FIG. 22H CONDITION H
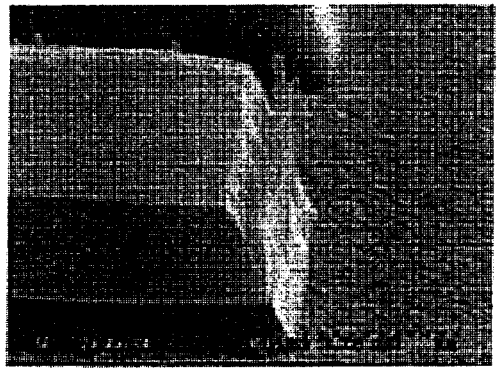
FIG. 22G CONDITION G
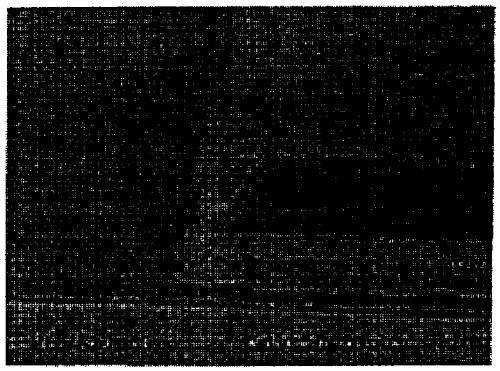
FIG. 22I CONDITION I
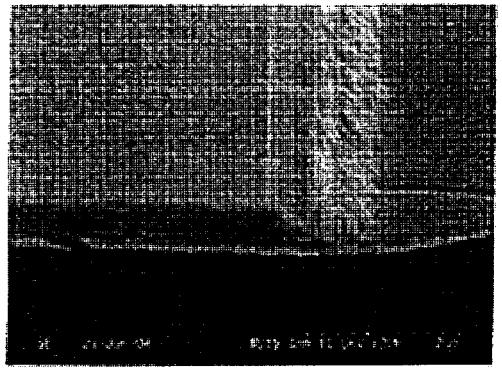

FIG. 23A CONDITION J
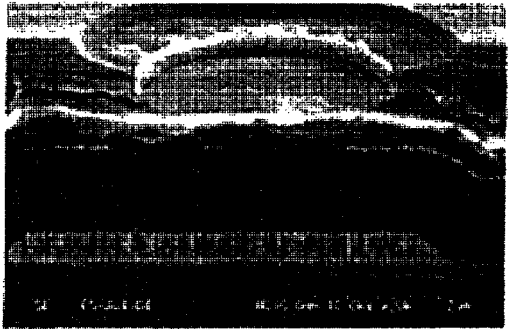
FIG. 23E CONDITION N
FIG. 23B CONDITION K
FIG. 23F CONDITION O
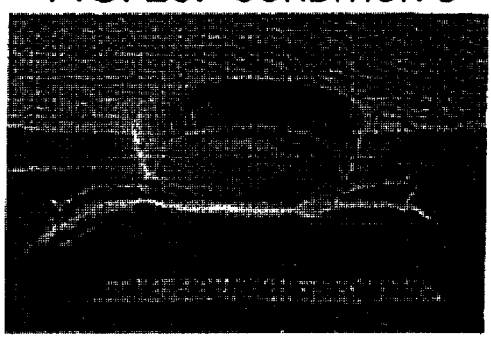
FIG. 23C CONDITION L
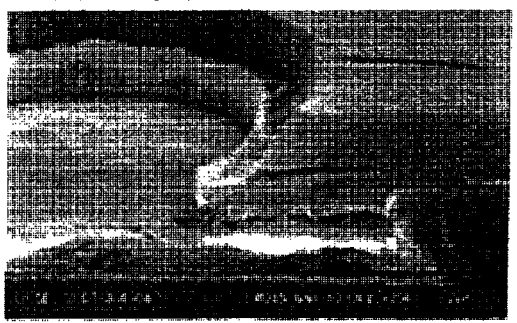
FIG. 23G CONDITION P
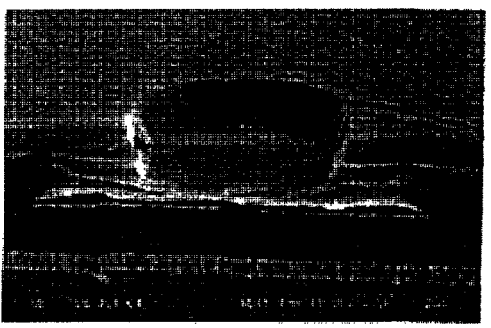
FIG. 23D CONDITION M
FIG. 23H CONDITION Q
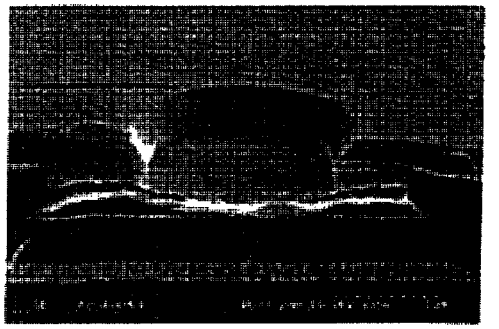

DISPLAY DEVICE AND METHOD FOR MANUFACTURING THE SAME

BACKGROUND OF THE INVENTION

1. Field of the Present Invention

The present invention relates to a display device and a method for manufacturing the same.

2. Description of the Related Art

An EL element has a problem in that luminescence properties such as luminance or evenness of luminescence significantly deteriorate with time, as compared with an early period. The low reliability is a factor in the limited practical application.

As one factor of worsening reliability, water or oxygen which intrudes into the EL element from outside is given.

Accordingly, a display device having a structure for preventing the deterioration of the EL element has been developed. In addition, there is a method by which a sealing material is formed over an insulator provided with an EL element, and an enclosed space surrounded by a covering material and the sealing material is filled with a filler made of resin or the like; therefore, the EL element is blocked off from outside (for example, Reference 1: Japanese Patent Application Laid-Open No. 2001-203076).

SUMMARY OF THE INVENTION

It is an object of the present invention to provide a method for manufacturing a display device that is highly reliable and has superior electric characteristics, at a low cost with high yield without complicating a process and an apparatus for manufacturing the display device.

According to the present invention, a step due to an opening in a contact is covered with an insulating layer to reduce the step, and is processed into a gentle shape. A wiring or the like is formed to be in contact with the insulating layer and thus the coverage of the wiring or the like is enhanced. In addition, deterioration of a light-emitting element due to contaminants such as water can be prevented by sealing a layer including an organic material that water permeability in a display device with a sealing material. Since the sealing material is formed in a portion of a driver circuit region in the display device, the frame margin of the display device can be narrowed.

As for a display device to which the present invention can be applied, there is a light-emitting display device which includes a light-emitting element having an organic material generating light-emission called electroluminescence (hereinafter, EL) or a medium having a mixture of an organic material and an inorganic material between electrodes, and in which the light-emitting element is connected to a TFT.

One aspect of a display device according to the present invention is a display device including a pixel region; a connection region; a semiconductor layer including an impurity region in the pixel region; a gate insulating layer over the semiconductor layer; a gate electrode layer over the gate insulating layer; a first interlayer insulating layer over the gate electrode layer; a first opening that reaches the impurity region in the gate insulating layer and the first interlayer insulating layer; a source or drain electrode layer in the opening, wherein the source or drain electrode layer covers a portion of the gate electrode layer with the first interlayer insulating layer therebetween; a second interlayer insulating layer over the source or drain electrode layer and the first interlayer insulating layer, wherein the second interlayer insulating layer has a second opening that reaches the source or drain electrode layer, and the second opening is provided over the source or drain electrode layer covering a portion of the gate electrode layer with the first interlayer insulating layer therebetween; a first electrode layer in the second opening; a wiring layer provided over the first interlayer insulating layer in the connection region; the second interlayer insulating layer provided with a third opening, which reaches the wiring layer, over the wiring layer, wherein an upper edge portion of the third opening is covered with an insulating layer; and a second electrode layer in the third opening to be in contact with the insulating layer.

One aspect of a display device according to the present invention is a display device manufactured by forming a semiconductor layer including an impurity region in a pixel region; forming a gate insulating layer in a connection region and over the semiconductor layer; forming a gate electrode layer and a conductive layer over the gate insulating layer; forming a first interlayer insulating layer over the gate electrode layer and the conductive layer, wherein the gate insulating layer and the first interlayer insulating layer each have an opening that reaches the impurity region; forming a source or drain electrode layer to cover the first opening and a portion of the gate electrode layer; forming a wiring layer to cover the conductive layer over the first interlayer insulating layer; forming a second interlayer insulating layer over the first interlayer insulating layer, the wiring layer, the source or drain electrode layer; forming a second opening that reaches the source or drain electrode layer and a third opening that reaches the wiring layer, in the second interlayer insulating layer; forming a first electrode layer in the second opening; forming an insulating layer to cover an upper edge portion of the third opening in the second interlayer insulating layer and a portion of the first electrode layer; and forming a second electrode layer in the third opening to be in contact with the insulating layer.

According to the present invention, a highly reliable display device can be manufactured through a simplified process. Therefore, a display device that exhibits high-precision and high-quality images can be manufactured at a low cost with high yield.

BRIEF DESCRIPTION OF THE DRAWINGS

In the accompanying drawings:

FIGS. 3A to 3C show a manufacturing method of a display device according to the present invention;

FIGS. 4A and 4B show a manufacturing method of a display device according to the present invention;

FIGS. 5A to 5C show a manufacturing method of a display device according to the present invention;

FIGS. 6A and 6B show a manufacturing method of a display device according to the present invention;

FIGS. 22A to 22I are SEM photographs of a sample manufactured in Example 1;

FIGS. 23A to 23H are SEM photographs of a sample manufactured in Example 1;

DETAILED DESCRIPTION OF THE INVENTION

Figure 1A:
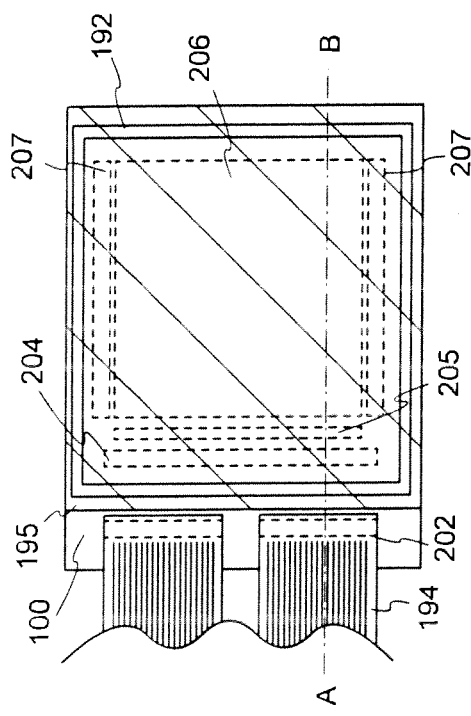
FIGS. 1A and 1B show a display device according to the present invention.

Embodiment Modes according to the present invention will hereinafter be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment modes to be given below. Note that the same reference numerals are used for the same portions through all drawings, and the description thereof is not repeated.

Embodiment Mode 1

A method for forming a thin film transistor in Embodiment Mode 1 is described in detail with reference to FIGS. 1A to 6B.

Figure 16A:
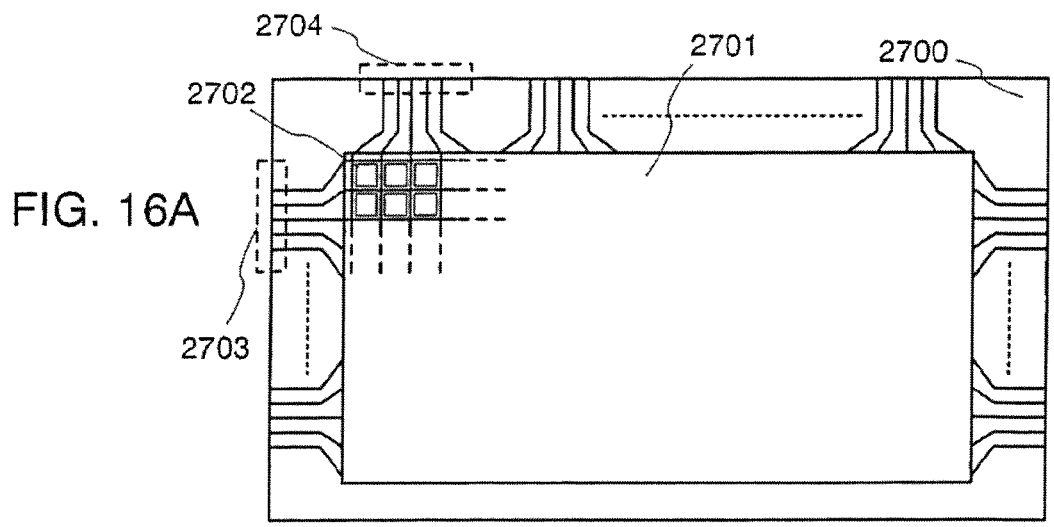
FIGS. 16A to 16C are top views of a display device according to the present invention.

In addition, FIG. 16A shows a top view of a structure of a display panel according to the present invention. A pixel portion 2701 in which pixels 2702 are arranged in matrix, a scanning line input terminal 2703, and a signal line input terminal 2704 are formed over a substrate 2700 having an insulating surface. The number of pixels may be provided according to various standards. The number of pixels of XGA may be 1024×768×3 (RGB), that of UXGA may be 1600×1200×3 (RGB), and that of a full-speck high vision may be 1920×1080×3 (RGB).

The pixels 2702 are arranged in matrix by intersecting a scanning line extended from the scanning line input terminal 2703 with a signal line extended from the signal line input terminal 2704. Each pixel 2702 is provided with a switching element and a pixel electrode connected thereto. A typical example of the switching element is a TFT. A gate electrode side of a TFT is connected to the scanning line, and a source or drain side thereof is connected to the signal line; therefore, each pixel can be controlled independently by a signal inputted from outside.

A TFT includes a semiconductor layer, a gate insulating layer, and a gate electrode as main components. A wiring connected to source and drain regions which are formed in the semiconductor layer accompanies thereto. A top gate type in which a semiconductor layer, a gate insulating layer and a gate electrode layer are sequentially arranged from the substrate side, a bottom gate type in which a gate electrode layer, a gate insulating layer and a semiconductor layer are sequentially arranged from the substrate side, and the like are known as typical structures of a TFT. However, any one of the structures may be applied to the present invention.

Figure 17A:
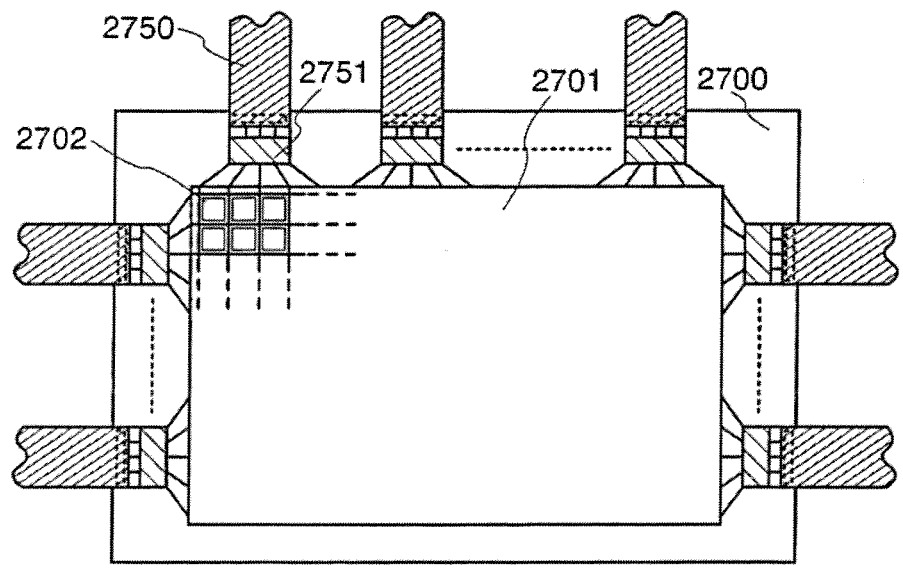
FIGS. 17A and 17B are top views of a display device according to the present invention.
Figure 17B:
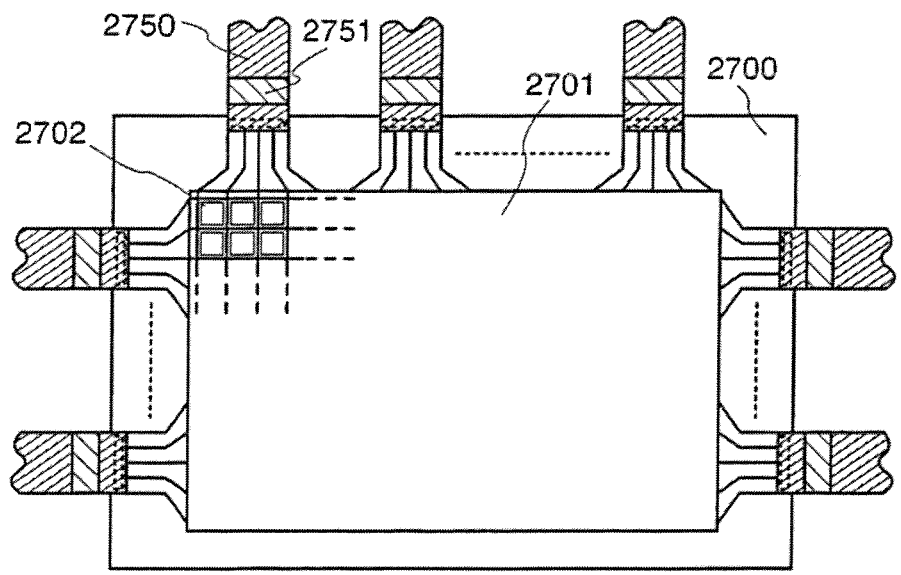

FIG. 16A shows a structure of the display panel that controls a signal to be inputted into the scanning line and the signal line by the external driver circuit. Furthermore, a driver IC 2751 may be mounted on a substrate 2700 by a COG (Chip on Glass) method as shown in FIG. 17A. As another mounting mode, a TAB (Tape Automated Bonding) method may be also employed as shown in FIG. 17B. The driver IC may be formed over a single crystal semiconductor substrate, or may be formed of a circuit having a TFT over a glass substrate. In FIGS. 17A and 17B, the driver IC 2751 is connected to an FPC (flexible printed circuit) 2750.

Figure 16B:
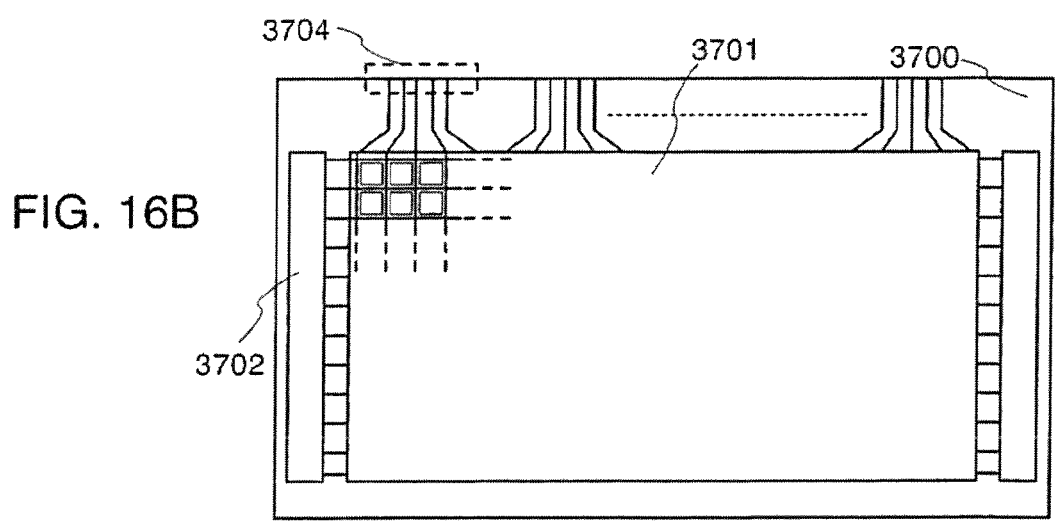

When a TFT provided in a pixel is formed from a crystalline semiconductor, a scanning line driver circuit 3702 may be formed to be integrated over a substrate 3700 as shown in FIG. 16B. In FIG. 16B, a pixel portion 3701 is controlled by an external driver circuit which is connected to a signal line input terminal 3704 in the same manner as FIG. 16A. When a TFT provided in a pixel is formed from a polycrystalline (microcrystalline) semiconductor, a single crystalline semiconductor or the like having high mobility, a scanning line driver circuit 4702 and a signal line driver circuit 4704 can be formed to be integrated over a substrate 4700 in FIG. 16C.

Over a substrate 100 having an insulating surface, a base film 101a is formed to have a film thickness of 10 to 200 nm (preferably, from 50 to 100 nm) using a silicon nitride oxide (SiNO) film by a sputtering method, a physical vapor deposition (PVD) method, a chemical vapor deposition (CVD) method such as a low-pressure CVD (LPCVD) method or a plasma CVD method, or the like, and a base film 101b is stacked thereon to have a film thickness of 50 to 200 nm (preferably, from 100 to 150 nm) using a silicon oxynitride (SiON) film as a base film. In this embodiment mode, a plasma CVD method is used to form the base film 101a and the base film 101b. As the substrate 100, a glass substrate, a quartz substrate, a silicon substrate, a metal substrate such as SUS substrate, or a stainless substrate on the surface of which an insulating film is formed, may be used. Additionally, a plastic substrate having heat-resistance which can withstand a process temperature of this embodiment mode, or a flexible substrate like a film may also be used. As examples of the plastic substrate, substrates made from PET (polyethylene terephthalate), PEN (polyethylene naphthalate) or PES (polyeter sulfide) are given. A substrate made from synthetic resin such as acrylic can be used as the flexible substrate.

The base film can employ silicon oxide, silicon nitride, silicon oxynitride, silicon nitride oxide or the like, and may adopt a single layer, or a two-layer or three-layer stacked structure. Note that in this specification, the silicon oxynitride is a substance which contains oxygen more than nitrogen in the composition ratio, and can be called a silicon oxide containing nitrogen. Similarly, the silicon nitride oxide is a substance which contains nitrogen more than oxygen in the composition ratio, and can be called a silicon nitride containing oxygen. In this embodiment mode, a silicon nitride oxide film is formed to be 50 nm thick using $SiH_4$, $NH_3$, $N_2O$, $N_2$ and $H_2$ as a reactive gas and a silicon oxynitride film is formed to be 100 nm thick using $SiH_4$ and $N_2O$ as a reactive gas over a substrate. The thicknesses of the silicon nitride oxide film and the silicon oxynitride film to be stacked thereon may be set 140 nm and 100 nm, respectively.

Subsequently, a semiconductor film is formed over the base film. The semiconductor film may be formed to have a thickness of from 25 to 200 nm (preferably, from 30 to 150 nm) by a known method (sputtering, LPCVD, plasma CVD, or the like). In this embodiment mode, an amorphous semiconductor film is crystallized by a laser to become a crystalline semiconductor film, and the obtained crystalline semiconductor film is preferably used.

An amorphous semiconductor (hereinafter also refereed to as "AS") manufactured using a semiconductor material gas typified by silane or germane with a vapor phase growth method or a sputtering method; a polycrystalline semiconductor that is formed by crystallizing the amorphous semiconductor utilizing light energy or thermal energy; a semiamorphous (also referred to as microcrystalline, and hereinafter also referred to as "SAS") semiconductor; and the like can be used as a material for forming a semiconductor layer.

The SAS is a semiconductor with an intermediate structure between an amorphous and a crystal structure (including a single crystal and a polycrystal). This is a semiconductor having a third condition that is stable in terms of a free energy, and a crystalline region having a short range order and lattice distortion. A crystalline region of 0.5 to 20 nm can be observed at least in part of region in the film. When silicon is contained as the main component, Raman spectrum is shifted to a wavenumber side lower than 520 $cm^{-1}$. Diffraction peak of (111) and (220) to be caused from a crystal lattice of silicon are observed in X-ray diffraction. At least 1 atomic % or more of hydrogen or halogen is contained to terminate a dangling bond. SAS is formed by carrying out grow discharge decomposition (plasma CVD) on a silicide gas. In addition to $SiH_4$, $Si_2H_6$, $SiH_2Cl_2$, $SiHCl_3$, $SiCl_4$, $SiF_4$, or the like can be used as the silicide gas. In addition, $F_2$ or $GeF_4$ may be mixed. This silicide gas may be diluted with $H_2$ or $H_2$ and one or more of the rare gas element of He, Ar, Kr, and Ne. A dilution ratio ranges from 2 to 1000 times. A pressure ranges approximately from 0.1 to 133 Pa, and a power frequency ranges from 1 to 120 MHz, preferably from 13 to 60 MHz. A substrate heating temperature is preferably 300° C. or less. A substrate heating temperature of 100 to 200° C. is possible. It is desirable that an atmospheric constituent impurity such as oxygen, nitrogen, or carbon is $1 \times 10^{20}$ $cm^{-3}$ or less as an impurity element in the film, specifically an oxygen concentration is $5 \times 10^{19}$ $cm^{-3}$ or less, preferably $1 \times 10^{19}$ $cm^{-3}$ or less. Further, a favorable SAS can be obtained by further promoting lattice distortion by adding a rare gas element such as helium, argon, krypton or neon to enhance stability. In addition, a SAS layer made from a silicide gas containing hydrogen may be stacked over a SAS layer made from a silicide gas containing fluorine as the semiconductor film.

An amorphous semiconductor is typified by hydrogenated amorphous silicon, and a crystalline semiconductor is typified by polysilicon. Polysilicon (polycrystalline silicon) includes a so-called high temperature polysilicon using polysilicon which is formed at a temperature of 800° C. or higher as a main material, a so-called low temperature polysilicon using polysilicon which is formed at a temperature of 600° C. or lower as a main material, a polysilicon crystallized by being added with an element or the like which promotes crystallization, and the like. As described above, obviously, a semiamorphous semiconductor or a semiconductor which contains a crystal phase in a portion of the semiconductor layer can also be used.

When a crystalline semiconductor film is used as the semiconductor film, a known method (a laser crystallization method, a thermal crystallization method, a thermal crystallization method using an element promoting crystallization such as nickel, or the like) may be employed as a method for manufacturing the crystalline semiconductor film. A microcrystalline semiconductor which is a SAS can be crystallized by being irradiated with laser light to enhance the crystallinity. In the case where an element promoting crystallization is not used, the hydrogen is released until the hydrogen concentration contained in an amorphous semiconductor film becomes $1 \times 10^{20}$ $atoms/cm^3$ or less by heating the amorphous semiconductor film for one hour at a temperature of 500° C. in a nitrogen atmosphere before irradiating the amorphous semiconductor film with laser light. This is because an amorphous semiconductor film is damaged when the amorphous semiconductor film containing much hydrogen is irradiated with laser light. As a heat treatment for crystallization, a heating furnace, laser irradiation, light-irradiation from a lamp (lamp-annealing) and the like can be employed. As the heating method, there is employed RTA method such as GRTA (Gas Rapid Thermal Anneal) or LRTA (Lamp Rapid Thermal Anneal).

Any method can be used for introducing a metal element into the amorphous semiconductor film without limitations as long as the method is capable of making the metal element exist on the surface of or inside the amorphous semiconductor film. For example, a sputtering method, a CVD method, a plasma treatment method (including a plasma CVD method), an adsorption method, or a method for applying a metal salt solution can be employed. Among them, the method using a solution is simple and easy and advantageous in terms of easy concentration adjustment of the metal element. It is preferable to form an oxide film by UV light irradiation in oxygen atmosphere, a thermal oxidation method, a treatment with ozone water including a hydroxyl radical or hydrogen peroxide, or the like in order to improve wettability of the surface of the amorphous semiconductor layer and to spread the aqueous solution over the entire surface of the amorphous semiconductor layer.

The semiconductor film is irradiated with the laser light having any one of second to fourth harmonics of the fundamental wave from a continuous wave solid-state laser. Thus, a crystal having a large grain size can be obtained. For example, typically, it is preferable to use the second harmonic (532 nm) or the third harmonic (355 nm) of an Nd:$YVO_4$ laser (fundamental wave 1064 nm). Specifically, the laser light emitted from the continuous wave $YVO_4$ laser is converted into the harmonic by a non-linear optical element to obtain laser light having the output of several W or more. It is preferable to shape the laser light into rectangular or elliptical on an irradiated surface through an optical system to irradiate the semiconductor film. The laser light needs to have the power density of approximately 0.001 to 100 $MW/cm^2$ (preferably, from 0.1 to 10 $MW/cm^2$).

The scanning speed is set in the range of approximately 0.5 to 2000 cm/sec (preferably, 10 to 200 cm/sec) for the irradiation.

The shape of the laser beam is preferably linear. Thus, throughput can be increased. In addition, the laser beam may be emitted with an incident angle θ (0°<θ<90°) with respect to the semiconductor film. This is because interference of laser beams can be prevented.

In this way, the laser beam is scanned relatively to the semiconductor film and thereby, laser irradiation can be conducted. In laser irradiation, a marker can be formed so as to overlap laser beams with good accuracy or control the starting position and finishing position of laser irradiation. The marker may be formed over the substrate at the same time as the amorphous semiconductor film.

The laser may be a known continuous wave or pulsed gas laser, solid-state laser, copper vapor laser or gold vapor laser. As the gas laser, there are an excimer laser, an Ar laser, a Kr laser, a He—Cd laser and the like. As the solid-state laser, there are a YAG laser, a $YVO_4$ laser, a YLF laser, a $YAlO_3$ laser, a $Y_2O_3$ laser, a glass laser, a ruby laser, an alexandrite laser, a Ti: Sapphire laser, and the like.

Moreover, a pulsed laser may be employed to conduct laser crystallization. In this case, the pulse repetition rate is set to 0.5 MHz or more. This frequency band is extremely higher than the frequency band of several ten Hz to several hundred Hz, which is usually used. It is said that it takes several ten to several hundred nanoseconds to completely solidify the semiconductor film after the semiconductor film is irradiated with the pulsed laser light. When the pulsed laser light has the above described frequency band, it is possible to irradiate it with next pulsed laser light after the semiconductor film is melted by the previous pulsed laser light and before the semiconductor film is solidified. Therefore, the interface between the solid phase and the liquid phase can be continuously moved in the semiconductor film, and the semiconductor film having a crystal grain continuously grown toward the scanning direction is formed. Specifically, it is possible to form an aggregation of crystal grains each of which has a width of 10 to 30 μm in the scanning direction and a width of approximately 1 to 5 μm in a direction perpendicular to the scanning direction. It is also possible to form a semiconductor film having almost no crystal grain boundaries at least in the channel direction of a thin film transistor by forming a single crystal grain long extended along the scanning direction.

The irradiation of the laser light may be conducted in an inert gas atmosphere such as a rare gas or nitrogen. This can suppress the roughness of a semiconductor surface by the irradiation of the laser light and can reduce variations in a threshold value generated by variations in the interface state density.

The amorphous semiconductor film may be crystallized by combining a heat treatment and laser light irradiation, or the heat treatment or the laser light irradiation may be separately performed plural times.

In this embodiment mode, on the base film 101b, an amorphous semiconductor film is formed and crystallized to form a crystalline semiconductor film. An amorphous silicon formed using $SiH_4$ and $H_2$ as a reactive gas, is used as the amorphous semiconductor film. In this embodiment mode, the base film 101a, the base film 101b and the amorphous semiconductor film are continuously formed by changing reactive gases while keeping vacuum (without breaking the vacuum) in the same chamber at the same temperature of 330° C.

An oxide film formed on the amorphous semiconductor film is removed. Then, an oxide film is formed to be 1 to 5 nm thick by UV light irradiation in an oxygen atmosphere, a thermal oxidation method, a treatment using ozone water including hydroxyl radical or hydrogen peroxide or the like. In this embodiment mode, Ni is used as the element for promoting crystallization. An aqueous solution including Ni acetate of 10 ppm is applied by a spin coating method.

In this embodiment mode, a heat treatment is conducted at 650° C. for six minutes by a RTA method. Thereafter, an oxide film formed on the semiconductor film is removed and the semiconductor film is irradiated with laser light. The amorphous semiconductor film is crystallized by the above described crystallization to become a crystalline semiconductor film.

When crystallization using a metal element is conducted, a gettering process is conducted so as to reduce or remove the metal element. In this embodiment mode, an amorphous semiconductor film is used as a gettering sink to getter the metal element. An oxide film is formed on the crystalline semiconductor film first by UV light irradiation in an oxygen atmosphere, a thermal oxidation method, a treatment using ozone water including hydroxyl radical or hydrogen peroxide or the like. The oxide film is preferably made thicker by a heat treatment. In this embodiment mode, the oxide film is formed first and then, is made thicker by RTA at 650° C. for six minutes. Thereafter, an amorphous semiconductor film of 30 nm thick is formed by a plasma CVD method (350 W and 35 Pa in this embodiment mode).

Figure 2A:
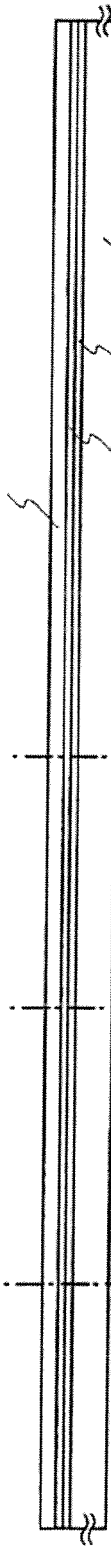
FIGS. 2A to 2D show a manufacturing method of a display device according to the present invention.

After that, a heat treatment at 650° C. for six minutes is conducted by RTA to reduce or remove the metal element. The heat treatment may be conducted in a nitrogen atmosphere. The amorphous semiconductor film serving as a gettering sink and the oxide film formed on the amorphous semiconductor film are removed using hydrofluoric acid or the like, thereby obtaining a crystalline semiconductor film 102 in which the metal element is reduced or removed (FIG. 2A). In this embodiment mode, TMAH (tetramethyl ammonium hydroxide) is used for removing the amorphous semiconductor film serving as a gettering sink.

The obtained semiconductor film may be doped with a minute amount of an impurity element (boron or phosphorus) in order to control a threshold value of a thin film transistor. This doping of an impurity element may be conducted to the amorphous semiconductor film before crystallization. If an impurity element is added into the amorphous semiconductor film, the impurity element can be activated by the heat treatment for crystallization. In addition, defects or the like generated in doping can be improved.

The crystalline semiconductor film 102 is patterned using a mask. In this embodiment mode, the oxide film formed on the crystalline semiconductor film 102 is removed and then a new oxide film is formed. Then, a photo mask is formed and patterning is conducted by a photolithography method to form semiconductor layers 103 to 106.

An etching process in the patterning may be either plasma etching (dry etching) or wet etching; however, the plasma etching is suitable for processing a large substrate. A gas containing fluorine such as $CF_4$ or $NF_3$ or a gas containing chlorine such as $Cl_2$ or $BCl_3$ is used as the etching gas, and an inert gas such as He or Ar may be added appropriately. In addition, if an etching process using atmospheric pressure discharge is applied, local discharge processing is possible and a mask layer is not required to be formed over a whole surface of the substrate.

In the present invention, a conductive layer for forming a wiring layer or an electrode layer, a mask layer for forming a predetermined pattern, or the like may be formed by a method by which a pattern can be selectively formed, such as a droplet discharging method. By the droplet discharging (jetting) method (also referred to as an inkjet method according to the system thereof), a predetermined pattern (a conductive layer, an insulating layer or the like) can be formed by selectively discharging (jetting) droplets of a composition prepared for a specific purpose. In this case, a process for controlling wettability or adhesion may be performed in a formation region. Additionally, a method for transferring or drawing a pattern, for example, a printing method (a method for forming a pattern, e.g., a screen printing or an offset printing) or the like can be used.

In this embodiment mode, a resin material such as an epoxy resin, an acrylic resin, a phenol resin, a novolac resin, a melamine resin, or an urethane resin is used as a mask. Alternatively, the mask may also be made of an organic material such as benzocyclobutene, parylene, flare and polyimide having a light transmitting property; a compound material formed by polymerization of a siloxane polymer or the like; a composition material containing a water-soluble homopolymer and a water-soluble copolymer; and the like. In addition, a commercially available resist material containing a photosensitive agent may also be used. For example, it is possible to use a novolac resin, which is a typical positive resist, including a naphthoquinonediazide compound that is a photosensitive agent; a base resin that is a negative resist, diphenylsilanediol, an acid generating material, and the like. The surface tension and the viscosity of any material are appropriately adjusted by controlling the solvent concentration, adding a surfactant, or the like, when a droplet discharging method is used.

The oxide film on the semiconductor layer is removed and then a gate insulating layer 107 covering the semiconductor layers 103 to 105 is formed. An insulating film containing silicon is formed to be 10 to 150 nm thick by a plasma CVD method or a sputtering method as the gate insulating layer 107. A known material, e.g., an oxide material or a nitride material of silicon typified by silicon nitride, silicon oxide, silicon oxynitride or silicon nitride oxide, may be formed for the gate insulating layer 107, and the gate insulating layer 107 may have a stacked-layer structure or a single layer structure. In this embodiment mode, a three-layer stacked structure of a silicon nitride film, a silicon oxide film and a silicon nitride film is used as the gate insulating layer. In addition to that, a single layer of a silicon oxynitride film or a two-layer stacked structure may be employed. Preferably, a silicon nitride film having a dense film quality is used. A silicon oxide film having a thin thickness, 1 to 100 nm thick, preferably 1 to 10 nm thick, more preferably 2 to 5 nm, may be formed between the semiconductor layer and the gate insulating layer. As the method for forming the thin silicon oxide film, a thermal oxide film is formed by oxidizing a surface of the semiconductor region by GRTA, LRTA or the like, and thus the silicon oxide film having a thin film thickness can be formed. Note that a reactive gas containing a rare gas element such as argon may be mixed in an insulating film to be formed so as to form a dense insulating film with less gate-leak current at a low temperature.

Figure 2B:
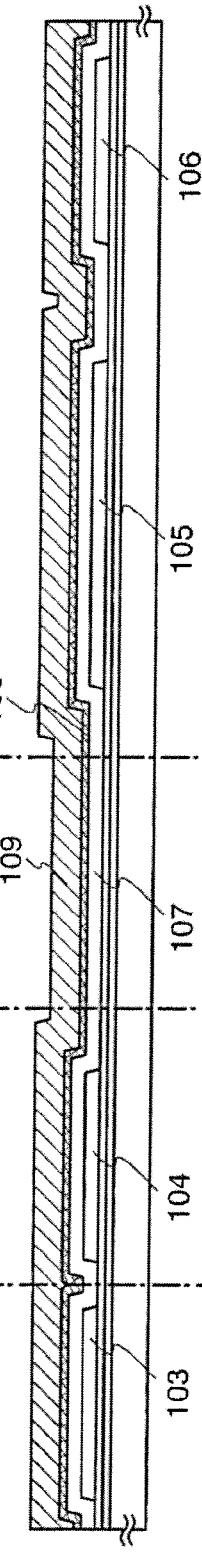

Then, a first conductive film 108 of 20 to 100 nm thick is formed to serve as a gate electrode layer over the gate insulating layer 107 and a second conductive film 109 of 100 to 400 nm thick is formed thereover (FIG. 2B). The first and second conductive films 108 and 109 can be formed by a known method such as sputtering, vapor deposition or CVD. An element selected from tantalum (Ta), tungsten (W), titanium (Ti), molybdenum (Mo), aluminum (Al), copper (Cu), chrome (Cr) and neodymium (Nd), or an alloy material or a compound material mainly containing the elements may be used to form the first and second conductive films 108 and 109. A semiconductor film typified by a polysilicon film doped with an impurity element such as phosphorus or an AgPdCu alloy may be used as the first and second conductive films 108 and 109. A three-layer structure may be employed without being limited to the two-layer structure, in which, for example, a tungsten film of 50 nm thick as the first conductive film, a aluminum-silicon (Al—Si) alloy film of 500 nm as the second conductive film, and a titanium nitride film of 30 nm thick as the third conductive film are formed sequentially. In the case of the three-layer structure, tungsten nitride may be used instead of the tungsten film as the first conductive film, an aluminum-titanium (Al—Ti) alloy film may be used instead of the aluminum-silicon (Al—Si) film as the second conductive film, or a titanium film may be used instead of the titanium nitride film as the third conductive film. Alternatively, a single layer structure may be adopted. In this embodiment mode, tantalum nitride (TaN) of 30 nm thick as the first conductive film 106 and tungsten of 370 nm thick as the second conductive film 107 are formed, respectively.

Figure 2C:
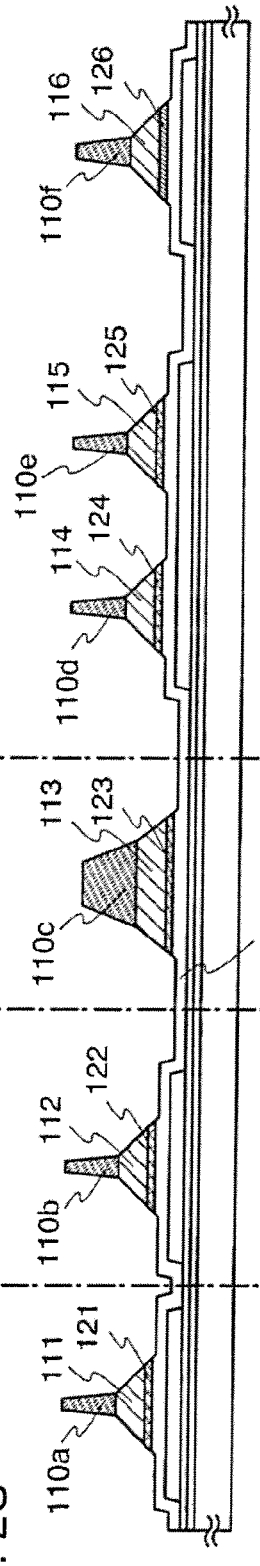

Then, masks 110a, 110b, 110c, 110d and 110f are formed using resist by a photolithography method, and the first and second conductive films 108 and 109 are patterned to form first gate electrode layers 121, 122, a conductive layer 123, first gate electrode layers 124 to 126, and conductive layers 111 to 116 (FIG. 2C). The first gate electrode layers 121 an 122, the conductive layer 123, the first gate electrode layers 124 to 126, and the conductive layers 111 to 116 can be etched to have desired tapered shapes by appropriately adjusting an etching condition (electric power applied to a coil-shaped electrode layer, electric power applied to an electrode layer on a substrate side, electrode temperature on a substrate side, or the like) by an ICP (Inductively Coupled Plasma) etching method. As the tapered shape, the angle or the like can be controlled depending on the shape of the masks 110a to 110f. As the etching gas, a gas containing chlorine typified by $Cl_2$, $BCl_3$, $SiCl_4$, $CCl_4$, or the like, a gas containing fluorine typified by $CF_4$, $CF_5$, $SF_6$, $NF_3$, or the like, or $O_2$ can be appropriately used. In this embodiment mode, the second conductive film 109 is etched using an etching gas including $CF_5$, $Cl_2$ and $O_2$ and the first conductive film 108 is etched continuously using an etching gas including $CF_5$ and $Cl_2$.

The conductive layers 111 to 116 are patterned using the masks 110a, 110b, 110c, 110d, and 110f. At this time, the conductive layers are etched with high selectivity of the second conductive film 109 forming the conductive layer and the first conductive film 108 forming the first gate electrode layer. By this etching, the conductive layers 111 to 116 are etched to form the second gate electrode layers 131 and 132, the conductive layer 133, and the second gate electrode layers 134 to 136. In this embodiment mode, the third conductive layer also has a tapered shape, and the taper angle thereof is larger than those of the first gate electrode layers 121 and 122, the conductive layer 123, the first gate electrode layers 124 to 126. Note that the taper angle is an angle of a side face with respect to the surfaces of the first gate electrode layer, the second gate electrode layer and the conductive layer. Therefore, if the taper angle is made large to be 90 degrees, the conductive layer has a vertical side face and the tapered shape is lost. In this embodiment mode, $Cl_2$, $SF_6$ and $O_2$ are used as an etching gas for forming the second gate electrode layer.

In this embodiment mode, the first gate electrode layers, the conductive layers and the second gate electrode layers are formed to have tapered shapes and thus, the gate electrode layers with two layers both have tapered shapes. However, the present invention is not limited thereto, and only one layer of the gate electrode layers may have a tapered shape, and the other thereof may have a vertical side face formed by anisotropic etching. As in this embodiment mode, the taper angles may be different between the gate electrode layers to be stacked or may be the same. The coverage of a film to be stacked thereover is enhanced due to the taper shape and defects are reduced, thereby enhancing reliability.

Figure 2D:
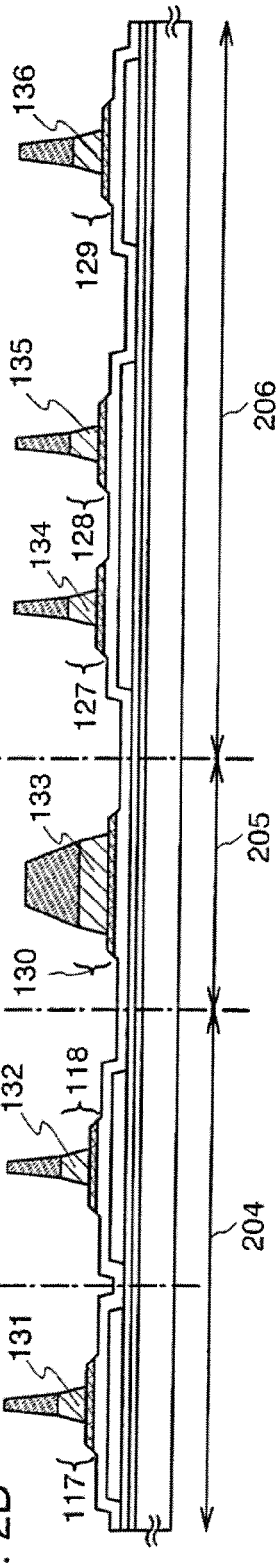

Through the above-mentioned steps, a gate electrode layer 117 including the first gate electrode layer 121 and the second gate electrode layer 131, and a gate electrode layer 118 including the first gate electrode layer 122 and the second gate electrode layer 132 can be formed in a peripheral driver circuit region 204; a gate electrode layer 127 including the first gate electrode layer 124 and the second gate electrode layer 134, a gate electrode layer 128 including the first gate electrode layer 125 and the second gate electrode layer 135, and a gate electrode layer 129 including the first gate electrode layer 126 and the second gate electrode layer 136 can be formed in a pixel region 206; a conductive layer 130 including the conductive layer 123 and the conductive layer 133 can be formed in a connection region 205 (FIG. 2D). In this embodiment mode, the gate electrode layer is formed by dry etching; however, wet etching may be employed.

The gate insulating layer 107 is etched to some extent by the etching process for forming the gate electrode layer, and thus the thickness thereof is reduced in some cases.

In forming the gate electrode layer, a thin film transistor that can operate at high speed can be formed by narrowing the width of the gate electrode layer. Two methods for making the width in the channel direction of the gate electrode layer thinner are shown hereinafter.

The first method is as follows: a mask for the gate electrode layer is formed and then the mask is slimed in the width direction by etching, ashing or the like to form a mask having a thinner width. The gate electrode layer can be formed to have a thin shape by using the mask that has been formed to have a thin shape.

The second method is as follows: a normal mask is formed and the gate electrode layer is formed using the mask. The obtained gate electrode layer is side-etched in the width direction to be more thinned. Thus, the gate electrode layer having a thin width can be formed finally. Through the above described steps, a thin film transistor having a short channel length can be formed later, and the thin film transistor that can operate at high speed can be manufactured.

An impurity element 151 imparting n-type conductivity is added using the gate electrode layers 117, 118, 127, 128 and 129 and the conductive layer 130 as masks to form first n-type impurity regions 140a, 140b, 141a, 141b, 142a, 142b, 142c, 143a and 143b (FIG. 3A). In this embodiment mode, phosphine ($PH_3$) (the composition ratio of P is 5%) is used as a doping gas containing an impurity element, and the doping is conducted under the conditions of gas flow rate of 80 sccm, beam current of 54 μA/cm, accelerating voltage of 50 kV, and a dose amount of $7.0\times10^{13}$ ions/cm². Here, the first n-type impurity regions 140a, 140b, 141a, 141b, 142a, 142b, 142c, 143a and 143b are doped with the impurity element imparting n-type conductivity such that the impurity element is included in the regions to have the concentration of about $1\times10^{17}$ to $5\times10^{18}$/cm³. In this embodiment mode, phosphorus (P) is used as the impurity element imparting n-type conductivity.

In this embodiment mode, a region in which the impurity region overlaps the gate electrode layer with the gate insulating layer therebetween is referred to as Lov region, while a region in which the impurity region does not overlap the gate electrode layer with the gate insulating layer therebetween is referred to as Loff region. In FIGS. 3A to 3C, the impurity regions are shown by a portion without hatching and a portion with hatching. This does not mean that the portion without hatching is not doped with the impurity element, but this is made for easily understanding that the concentration distribution of the impurity element in the regions reflects masks or doping conditions. Note that this is true in the other drawings in this specification.

Masks 153a, 153b, 153c and 153d covering the semiconductor layer 103, a portion of the semiconductor layer 105 and the semiconductor layer 106 are formed. An impurity element 152 imparting n-type conductivity is added using the masks 153a, 153b, 153c and 153d and the gate electrode layer 132 as masks to form second n-type impurity regions 144a, 144b, third n-type impurity regions 145a, 145b, second n-type impurity regions 147a, 147b, 147c, and third n-type impurity regions 148a, 148b, 148c, 148d. In this embodiment mode, $PH_3$ (the composition ratio of P is 5%) is used as a doping gas containing an impurity element, and the doping is conducted under the conditions of gas flow rate of 80 sccm, beam current of 540 μA/cm, accelerating voltage of 70 kV, and a dose amount of $5.0\times10^{15}$ ions/cm². Here, the second n-type impurity regions 144a, 144b are doped with the impurity element imparting n-type conductivity such that the impurity element is included into the regions to have the concentration of about $5\times10^{19}$ to $5\times10^{20}$/cm³. The third impurity regions 145a, 145b are formed to include the impurity element imparting n-type conductivity in the concentration almost equal to or slightly higher than those of the third n-type impurity regions 148a, 148b, 148c, 148d. In addition, a channel forming region 146 is formed in the semiconductor layer 104, and channel forming regions 149a, 149b are formed in the semiconductor layer 105.

The second n-type impurity regions 144a, 144b, 147a, 147b, 147c are each a high concentration n-type impurity region and serve as a source or a drain. On the other hand, the third n-type impurity regions 145a, 145b, 148a, 148b, 148c 148d are each a low concentration impurity region, that is, an LDD (Lightly Doped Drain) region. The n-type impurity regions 145a, 145b are overlapped with the first gate electrode layer 122 with the gate insulating layer 107 therebetween, and thus it is a Lov region, which relieves an electric field in a neighborhood of a drain and can control deterioration of on-current by hot carriers. As a result, a thin film transistor that can operate at high speed can be formed. On the other hand, the third n-type impurity regions 148a, 148b, 148c and 148d are formed in an Loff region that is not overlapped with the gate electrode layers 127 and 128, and thus the regions relieve an electric field in a neighborhood of a drain, and can control deterioration due to hot carriers and can reduce off-current. As a result, a highly reliable semiconductor device that consumes less power can be manufactured.

The masks 153a, 153b, 153c, 153d are removed and masks 155a, 155b covering the semiconductor layers 103, 105 are formed. An impurity element 154 imparting p-type conductivity is added using the masks 155a, 155b, the gate electrode layers 117 and 129 as masks to form first p-type impurity regions 160a, 160b, 163a, 163b and second p-type impurity regions 161a, 161b, 164a, 164b. In this embodiment mode, boron (B) is used as the impurity element. Diborane ($B_2H_6$) (the composition ratio of B is 15%) is used as a doping gas containing an impurity element, and the doping is conducted under the conditions of gas flow rate of 70 sccm, beam current of 180 μA/cm, accelerating voltage of 80 kV, and a dose amount of $2.0\times10^{15}$ ions/cm². Here, the first p-type impurity regions 160a, 160b, 163a, 163b, and the second p-type impurity regions 161a, 161b, 164a, 164b are doped with the impurity element imparting p-type conductivity such that the impurity element is included into the regions to have the concentration of about $1\times10^{20}$ to $5\times10^{21}$/cm³. In this embodiment mode, the second p-type impurity regions 161a, 161b, 164a, 164b are formed to have a concentration lower than those of the first p-type impurity regions 160a, 160b, 163a, 163b in a self-alignment manner depending on the shapes of the gate electrode layers 117 and 129. A channel forming region 162 is formed in the semiconductor layer 103, and a channel forming region 165 is formed in the semiconductor layer 106.

The second n-type impurity regions 144a, 144b, 147a, 147b, 147c are each a high concentration n-type impurity region and serve as a source or a drain. On the other hand, the second p-type impurity regions 161a, 161b, 164a, 164b are each a low concentration impurity region, that is, an LDD (Lightly Doped Drain) region. The second p-type impurity regions 161a, 161b, 164a, 164b are overlapped with the first gate electrode layers 121 and 126 with the gate insulating layer 107 therebetween, and thus it is a Lov region, which relieves an electric field in a neighborhood of a drain and can control deterioration of on-current due to hot carriers.

The masks 155a and 155b are removed by $O_2$ ashing or using a resist peeling solution and the oxide film is also removed. After that, an insulating film, so-called sidewall may be formed to cover the side of the gate electrode layer. The sidewall can be formed from an insulating film containing silicon by a plasma CVD method or a low pressure CVD method (LPCVD).

A heat treatment, irradiation of intense light or laser irradiation may be conducted to activate the impurity element. Plasma damage to the gate insulating layer or to an interface between the gate insulating layer and the semiconductor layer may be recovered as well as the activation.

Thereafter, an interlayer insulating layer is formed to cover the gate electrode layer and the gate insulating layer. In this embodiment mode, a stacked structure of the insulating film 167 and the insulating film 168 is employed (FIG. 4A). A silicon nitride oxide film of 200 nm thick is formed as the insulating film 167, and a silicon oxynitride film of 800 nm thick is formed as the insulating film 168 to be stacked. In addition, a three-layer stacked structure may be employed, for example, a silicon oxynitride film of 30 nm thick, a silicon nitride oxide film of 140 nm thick and a silicon oxynitride film of 800 nm thick may be stacked to cover the gate electrode layer and the gate insulating layer. In this embodiment mode, the insulating films 167 and 168 are formed sequentially by plasma CVD in the same way as the base film. The insulating films 167 and 168 are not limited in particular, and may be formed of a silicon nitride film, a silicon nitride oxide film, a silicon oxynitride film or a silicon oxide film formed by sputtering or plasma CVD, and may have a single layer of another insulating film containing silicon or a stacked structure of three-layer of other insulating films containing silicon.

Further, the step for hydrogenating the semiconductor layers is performed by a heat treatment at a temperature of 300 to 550° C. for 1 to 12 hours in a nitrogen atmosphere. This step is preferably performed at a temperature of 400 to 500° C. This step is a step for terminating dangling bonds of the semiconductor layer due to hydrogen contained in the insulating film 167 serving as the interlayer insulating layer. In this embodiment mode, the heat treatment is conducted at 410° C.

The insulating films 167 and 168 can be formed using a material selected from aluminum nitride (AlN), aluminum oxynitride (AlON), aluminum nitride oxide having more nitrogen content than oxygen content (AlNO), aluminum oxide, diamond like carbon (DLC), and a nitrogen-containing carbon film (CN) film and other substances containing an inorganic insulating material. Further, siloxane resin may be employed. The siloxane resin is a resin containing Si—O—Si bond. Siloxane includes a skeleton formed by the bond of silicon (Si) and oxygen (O), in which an organic group containing at least hydrogen (such as an alkyl group or aromatic hydrocarbon) is included as a substituent. In addition, a fluoro group may be used as the substituent. Further, a fluoro group and an organic group containing at least hydrogen may be used as the substituent. An organic insulating material may be employed, for example, polyimide, acrylic, polyamide, polyimide amide, resist, benzocyclobutene or polysilazane can be used. A coated film formed by a coating method that can provide favorable flatness may be used.

Thereafter, contact holes (openings) that reach the semiconductor layer are formed in the insulating films 167 and 168 and the gate insulating layer 107 with a mask of resist. Etching may be conducted once or multiple times depending on the selectivity of a material to be used. In this embodiment mode, first etching is conducted to remove the insulating film 168, under a condition that the selectivity of the insulating film 168 including silicon oxynitride and the insulating film 167 including silicon nitride oxide and the gate insulating layer 107 can be obtained. Next, the insulating film 167 and the gate insulating layer 107 are removed by second etching to form openings that reach the first p-type impurity regions 160a, 160b, 163a, 163b and the second n-type impurity regions 144a, 144b, 147a, 147b, which are each a source region or a drain region. In this embodiment mode, the first etching is wet etching and the second etching is dry etching. As an etchant for wet etching, a hydrofluoric acid based solution such as a mixed solution of ammonium hydrogen fluoride and ammonium fluoride may be used. As an etching gas, a gas containing chlorine typified by $Cl_2$, $BCl_3$, $SiCl_4$, $CCl_4$, or the like, a gas containing fluorine typified by $CF_4$, $SF_6$, $NF_3$, or the like, or $O_2$ can be appropriately used. An inert gas may be added into the etching gas to be used. As the inert element to be added, one or a plurality of elements selected from He, Ne, Ar, Kr, and Xe can be used.

A conductive film is formed to cover the openings and then etched to form source or drain electrode layers 169a, 169b, 170a, 170b, 171a, 171b, 172a, 172b and a wiring 156 electrically connected to a portion of each source or drain region. These source or drain electrode layers can be formed by forming a conductive film by a PVD method, a CVD method, a vapor deposition method, or the like, and etching the conductive film into a desired shape. In addition, the conductive layer can be formed selectively at a predetermined position by a droplet discharging method, a printing method, an electroplating method, or the like. Moreover, a reflow method or a damascene method can be used. As a material for the source or drain electrode layers, a metal such as Ag, Au, Cu, Ni, Pt, Pd, Ir, Rh, W, Al, Ta, Mo, Cd, Zn, Fe, Ti, Si, Ge, Zr, or Ba; an alloy of the metal; or a metal nitride of the metal is used. In addition, a stacked structure of these materials may be adopted. In this embodiment mode, titanium (Ti) of 100 nm thick, an aluminum-silicon (AL-Si) alloy of 700 nm thick, and titanium (Ti) of 200 nm thick are stacked and patterned into a desired shape.

Through the above described steps, an active matrix substrate can be manufactured, in which a p-channel thin film transistor 173 having a p-type impurity region and an n-channel thin film transistor 174 having an n-type impurity region are formed in the Lov regions in the peripheral driver circuit region 204; a conductive layer 177 is formed in a connection region; a multi channel type n-channel thin film transistor 175 having n-type impurity region is formed in the Loff region and a p-channel thin film transistor 176 having a p-type impurity region is formed in the Lov region in the pixel region 206 (FIG. 4B).

The active matrix substrate can be used for a light-emitting device having a self light-emitting element, a liquid crystal display device having a liquid crystal element, and other display devices. In addition, the active matrix substrate can also be used for various processors typified by CPU (central processing unit), and a semiconductor device such as a card having an ID chip.

The thin film transistor may have a single-gate structure having one channel forming region, a double-gate structure having two channel forming regions or a triple-gate structure having three channel forming regions without being limited to this embodiment mode. The thin film transistor in the peripheral driver circuit region may also have any one of a single-gate structure, a double-gate structure and a triple-gate structure.

The present invention is not limited to the method for forming a TFT shown in this embodiment mode. The present invention can be applied to a top-gate type (planar type), a bottom-gate type (inversely staggered type), a dual-gate type having two gate electrode layers arranged above and below of a channel region with gate insulating films interposed therebetween, and other structures.

Next, insulating films 180 and 181 are formed as second interlayer insulating layers (FIG. 5A). FIGS. 5A to 5C show manufacturing steps of a display device, in which a region 201 to be cut out by scribing, an external terminal connection region 202 to be attached with an FPC, a wiring region 203 that is a region for leading a wiring in the peripheral portion, a peripheral driver circuit region 204, a connection region 205, and a pixel region 260 are provided. Wirings 179a and 179b are formed in the wiring region 203, and a terminal electrode layer 178 to be connected with an external terminal is formed in the external terminal connection region 202.

The insulating films 180 and 181 can be formed using a material selected from silicon oxide, silicon nitride, silicon oxynitride, silicon nitride oxide, aluminum nitride (AlN), aluminum oxynitride (MON), aluminum nitride oxide having more nitrogen content than oxygen content (AlNO), aluminum oxide, diamond like carbon (DLC), a nitrogen-containing carbon (CN) film, a PSG (phosphorus glass), a BPSG (boron phosphorus glass), an alumina film and other substances containing an inorganic insulating material. Further, a siloxane resin may be employed. A photosensitive or non-photosensitive organic insulating material may be employed, for example, polyimide, acrylic, polyamide, polyimide amide, resist or benzocyclobutene, polysilazane, or a low-k material that is low dielectric can be used.

In this embodiment mode, a silicon oxynitride film of 200 nm thick is formed as the insulating film 180 by a CVD method. The insulating film 181 is preferably formed by a coating method such as spin coating, because a layer that is superior in heat-resistance, insulative property and planarity is needed as the interlayer insulating film for planarizing, A coated film of siloxane resin is used as the material of the insulating film 181 in this embodiment mode. The film after baking can be referred to as a silicon oxide film containing an alkyl group (SiOx) (x=1, 2 . . . ). This silicon oxide film containing an alkyl group (SiOx) can withstand a heat treatment of 300° C. or more.

Dip coating, spraying coating, a doctor knife, a roll coater, a curtain coater, a knife coater, a CVD method, a vapor deposition method or the like can be used for forming the insulating films 180 and 181. In addition, the insulating films 180 and 181 may be formed by a droplet discharging method. A material solution can be saved when the droplet discharging method is adopted. A method capable of transferring or drawing a pattern like the droplet discharging method, for example, a printing method (a method by which a pattern is formed, such as screen printing or offset printing), or the like can also be used.

As shown in FIG. 5B, openings are formed in the insulating films 180 and 181 that serve as the second interlayer insulating layer. The insulating films 180 and 181 are required to be etched widely in the connection region 205, the wiring region 203, the external terminal connection region 202, the region to be cut out 201 and the like. However, the area of the opening in the pixel region 206 is still smaller than that in the connection region 205 or the like, and becomes minute. Therefore, a margin of etching condition can be widened by conducting a photolithography process for forming the opening in the pixel region and a photolithography process for forming the opening in the connection region. Consequently, the yield can be improved. Contact holes in the pixel region can be formed with high accuracy by widening the margin of the etching condition.

Specifically, openings having large areas are formed in the insulating film 180 and 181 formed partially in the connection region 205, the wiring region 203, the external terminal connection region 202, the region to be cut out 201 and a portion of the peripheral driver circuit region 204. Thus, masks are formed to cover the insulating film 180 and 181 formed in the pixel region 206, and in parts of the connection region 205 and the peripheral driver circuit region 204. Parallel-plate RIE (reactive ion etching) system or ICP etching system can be used for etching. Note that the time for etching may be set such that the wiring layer or the first interlayer insulating layer is over etched. Variation in film thickness within the substrate and variation in etching rate can be reduced by setting it such that the wiring layer or the first interlayer insulating layer is over etched. In this way, the opening 182, 183 are formed in the connection region 205 and the external terminal connection region 202, respectively.

As shown in FIG. 5B, a minute opening, in other words, a contact hole, is formed in the insulating films 180 and 181 in the pixel region 206 (FIG. 5C). At this time, a mask is formed to cover the pixel region 206, a portion of the connection region 205, a portion of the peripheral driver circuit region 204 and the pixel region 206. The mask is a mask for forming the opening in the pixel region 206, and is provided with a minute opening in a desired position thereof. A resist mask can, for example, be used as the mask.

The insulating films 180 and 181 are etched with the parallel-plate RIE (reactive ion etching) system. Note that the time for etching may be set such that the wiring layer or the first interlayer insulating layer is over etched. Variation in film thickness within the substrate and variation in etching rate can be reduced by setting it such that the wiring layer or the first interlayer insulating layer is over etched.

An ICP system may be used for the etching system. Through the above described steps, an opening 184 that reaches the source or drain electrode layer 172a is formed in the pixel region 206. In the present invention, the source or drain electrode layer 172a is formed to cover the gate electrode layer 126 having a large total thickness in which a large number of thin films are stacked in the thin film transistor 176, with the insulating films 167 and 168 therebetween. Thus, since the opening 184 is not required to be formed deep, the process for forming the opening can be shortened, and thus the controllability can be enhanced. In addition, an electrode layer to be formed in the opening can be formed with favorable coverage and thus reliability can be enhanced, because the electrode layer does not need to widely cover the opening having a large angle.

This embodiment mode describes the case in which the insulating films 180 and 181 are etched using the mask covering the connection region 205, the wiring region 203, a portion of the external terminal connection region 202, the region to be cut out 201, and a portion of the peripheral driver circuit region 204 and having a desired opening in the pixel region 206. However, the present invention is not limited thereto. For example, the area of the opening in the connection region 204 is large, and thus the amount to be etched is large. The opening having a large area may be etched plural times. If an opening that is deeper than other openings is formed, etching may be conducted plural times similarly.

In this embodiment mode, the formation of the openings in the insulating films 180 and 181 are conducted multiple times as shown in FIGS. 5B and 5C; however, only one-time etching may be conducted. In this case, an ICP system is used to conduct etching with ICP power of 7000 W, bias power of 1000 W, pressure of 0.8 Pa, with the use of $CF_4$ of 240 sccm and $O_2$ of 160 sccm as the etching gas. The bias power is preferably 1000 to 4000 W. At this time, an advantageous effect that the process can be simplified is obtained, because one-time etching is enough for forming the opening.

Then, a first electrode 185 (also referred to as a pixel electrode) is formed to be in contact with the source or drain electrode layer 172a. The first electrode layer serves as an anode or a cathode, and may be formed with a film made from an element selected from Ti, TiN, $TiSi_xN_y$, Ni, W, $WSi_x$, $WN_x$, $WSi_xN_y$, NbN, Cr, Pt, Zn, Sn, In and Mo, an alloy material or a compound material mainly containing the element; or a stacked structure of such films to have a total thickness of 100 to 800 nm.

In this embodiment mode, a light-emitting element is used as a display element, and light emitted from the light-emitting element is extracted from the first electrode layer 185 side. Thus, the first electrode layer 185 is light-transmitting. A transparent conductive film is formed as the first electrode layer 185 and etched into a desired shape, thereby obtaining the first electrode layer 185. Indium tin oxide containing silicon oxide (also referred to as ITSO), zinc oxide, tin oxide, indium oxide or the like may be used for the first electrode layer 185 used in the present invention. In addition, a transparent conductive film such as an indium zinc oxide alloy in which indium oxide is mixed with zinc oxide (ZnO) of 2 to 20% can be used. A titanium nitride film or a titanium film may be used for the first electrode layer 185 in addition to the above described transparent conductive films. In this case, after the transparent conductive film is formed, a titanium nitride film or a titanium film is formed to have such a thickness that can transmit light (preferably about 5 to 30 nm thick). In this embodiment mode, ITSO containing indium tin oxide and silicon oxide are used as the first electrode layer 185. In this embodiment mode, the ITSO film is formed to be 185 nm thick by sputtering using, as a target, indium tin oxide mixed with silicon oxide ($SiO_2$) of 1 to 10% and setting the flow of Ar gas at 120 sccm; $O_2$ gas, 5 sccm; pressure, 0.25 Pa; and power, 3.2 kW. The first electrode layer 185 may be cleaned and polished by CMP or by using a porous material such as polyvinyl alcohol so that the surface thereof is planarized. In addition, after polishing with a CMP method, ultraviolet ray irradiation, an oxygen plasma treatment, or the like may be carried out on the surface of the first electrode layer 185.

A heat treatment may be performed after forming the first electrode layer 185. With the heat treatment, water included in the first electrode layer 185 is released. Accordingly, degasification or the like is not generated from the first electrode layer 185. Even when a light emitting material which is easily deteriorated by water is formed over the first electrode layer, the light emitting material is not deteriorated; therefore, a highly reliable display device can be manufactured. In this embodiment mode, ITSO is used for the first electrode layer 185, and it remains an amorphous state even when baking is performed, unlike ITO (indium tin oxide) which is crystallized by being baked. Hence, ITSO has higher planarity than ITO, and short-circuit with a cathode is not easily generated even when a layer containing an organic compound is thin.

Next, an insulator (an insulating layer) 186 (also, referred to as a bank, a partition wall, a wall, an embankment or the like) covering an edge portion of the first electrode layer 185 and the source or drain electrode layer is formed (FIG. 6B). Insulators 187a, 187b are formed in the external terminal connection region 202 in the same step. In this embodiment mode, acrylic is used for the insulator 186. When the insulator 186 is formed from the same material in the same process as the insulating film 181, manufacturing cost can be reduced. Further, the cost can also be reduced by commonly using a coating apparatus or an etching apparatus.

The insulator 186 is formed with an inorganic insulating material such as silicon oxide, silicon nitride, silicon oxynitride, aluminum oxide, aluminum nitride, aluminum oxynitride, or other inorganic insulating materials, or acrylic acid, methacrylic acid, or a derivative thereof, a heat resistant high molecular weight compound such as polyimide, an aromatic polyamide, or polybenzimidazole or siloxane resin. A photosensitive or nonphotosensitive material such as acrylic or polyimide may be used. The insulator 186 preferably has a shape in which a radius curvature changes continuously. Accordingly, the coverage of an electroluminescent layer 188 and a second electrode layer 189 which are formed over the insulator 186 is enhanced.

In the connection region 205, the insulator 186 is formed to cover upper edge portions of the insulating films 180 and 181 on the side face of the opening 182. The upper edge portions of the insulating films 180 and 181 that have been processed to have steps by patterning have rapid steps. Therefore, the coverage of the second electrode layer 189 to be formed thereon is not favorable. As in the present invention, the steps in the periphery of the opening is covered with the insulator 186 to smooth the steps, thereby enhancing the coverage of the second electrode layer 189 to be stacked thereon. In the connection region 205, a wiring layer to be formed in the same process and from the same material as the second electrode layer is electrically connected to the wiring layer 156. In this embodiment mode, the second electrode layer 189 is directly in contact with the wiring layer 156 to be electrically connected; however, may be electrically connected via another wiring.

It is preferable to perform deaeration by carrying out vacuum heating before forming an electroluminescent layer (a layer including an organic compound) 188 to further improve reliability. For example, it is desirable to perform a heat treatment at 200 to 400° C., preferably, 250 to 350° C. in a low pressure atmosphere or inert atmosphere before evaporating an organic compound material in order to eliminate the gas contained in the substrate. It is preferable to form the electroluminescent layer 188 by a vapor deposition method or a droplet discharging method in a low pressure without being exposed to the atmosphere. According to the heat treatment, water contained in or adhering to a conductive film, which is to be the first electrode layer, or the insulating layer (bank) can be released. The heat treatment can be conducted with the above-mentioned heat treatment when vacuum is kept and the substrate can be transferred within a vacuum chamber, and the above-mentioned heat treatment may be performed once after forming the insulating layer (bank). Here, when the interlayer insulating film and the insulating layer (bank) are formed of a substance having high heat resistance, a step for enhancing reliability by heat treatment can be sufficiently performed.

Figure 1B:
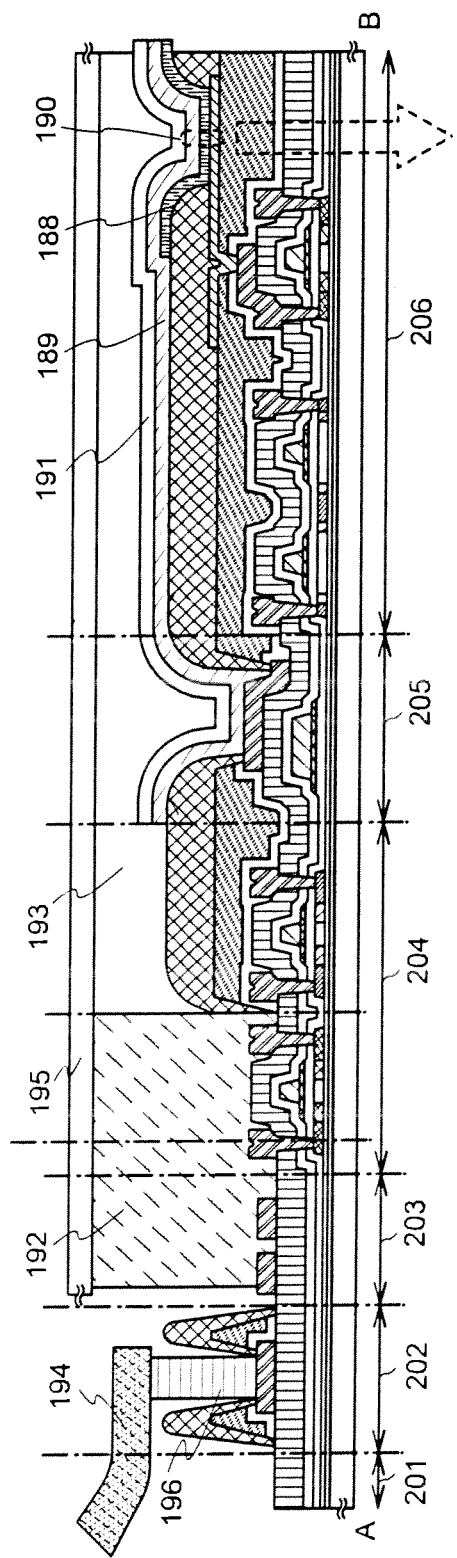

The electroluminescent layer 188 is formed over the first electrode layer 185. Note that although only one pixel is shown in FIGS. 1A and 1B, electroluminescent layers corresponding to each color of R (red), G (green) and B (blue) are separately formed in this embodiment mode. In this embodiment mode, as the electroluminescent layer 188, materials which show luminescence of each color of red (R), green (G) and blue (B) are selectively formed by a vapor deposition method using a vapor deposition mask for each, or the like. The materials, which show luminescence of each color red (R), green (G) and blue (B), can be also formed by a droplet discharging method (a low molecular or high molecular weight material, or the like) and, in this case, separate coating of RGB can be carried out without using a mask, which is preferable.

Next, the second electrode layer 189 formed of a conductive film is provided over the electroluminescent layer 188. As the second electrode layer 189, a material with a low work function (Al, Ag, Li, Ca, or an alloy thereof, such as MgAg, MgIn, AlLi, CaF$_2$, or CaN) may be used. In this manner, a light-emitting element 190 including the first electrode layer 185, the electroluminescent layer 188 and the second electrode layer 189 is formed.

In the display device according to this embodiment mode shown in FIGS. 1A and 1B, light emitted from the light emitting element 190 is emitted in the direction shown by the arrow in FIG. 1B from the side of the first electrode layer 185.

It is effective to provide a passivation film 191 so as to cover the second electrode layer 189. The passivation film 191 is formed of an insulating film containing silicon nitride, silicon oxide, silicon oxynitride (SiON), silicon nitride oxide (SiNO), aluminum nitride (AlN), aluminum oxynitride (AlON), aluminum nitride oxide (AlNO) of which nitrogen content is larger than oxygen content, aluminum oxide, diamond like carbon (DLC), or a carbon film containing nitrogen (CN), and a single layer of the insulating film or a stacked layer of the films can be used. In addition, a siloxane resin may be used.

In this case, it is preferable to use a film with good coverage as the passivation film, and a carbon film, a DLC film, in particular, is effective. Since a DLC film can be formed at temperatures ranging from a room temperature to 100° C. or less, it can be easily formed even over the electroluminescent layer 188 with low heat resistance. A DLC film can be formed by a plasma CVD method (typically, an RF plasma CVD method, a microwave CVD method, an electron cyclotron resonance (ECR) CVD method, a hot-filament CVD method, or the like), a combustion flame method, a sputtering method, an ion beam vapor deposition method, a laser vapor deposition method, or the like. As a reactive gas to be used for deposition, a hydrogen gas and a hydrocarbon based gas (for example, $CH_4$, $C_2H_2$, $C_6H_6$ or the like) are used and ionized by glow discharge, and then deposition is carried out with accelerative collision of ions with a cathode to which a negative self-bias is applied. In addition, the CN film may be formed by using $C_2H_4$ gas and $N_2$ gas as a reactive gas. A DLC film has high blocking effect to oxygen and thus can control oxidation of the electroluminescent layer 188. Therefore, a problem that the electroluminescent layer 188 oxidizes can be prevented during a subsequent sealing step.

Figure 18:
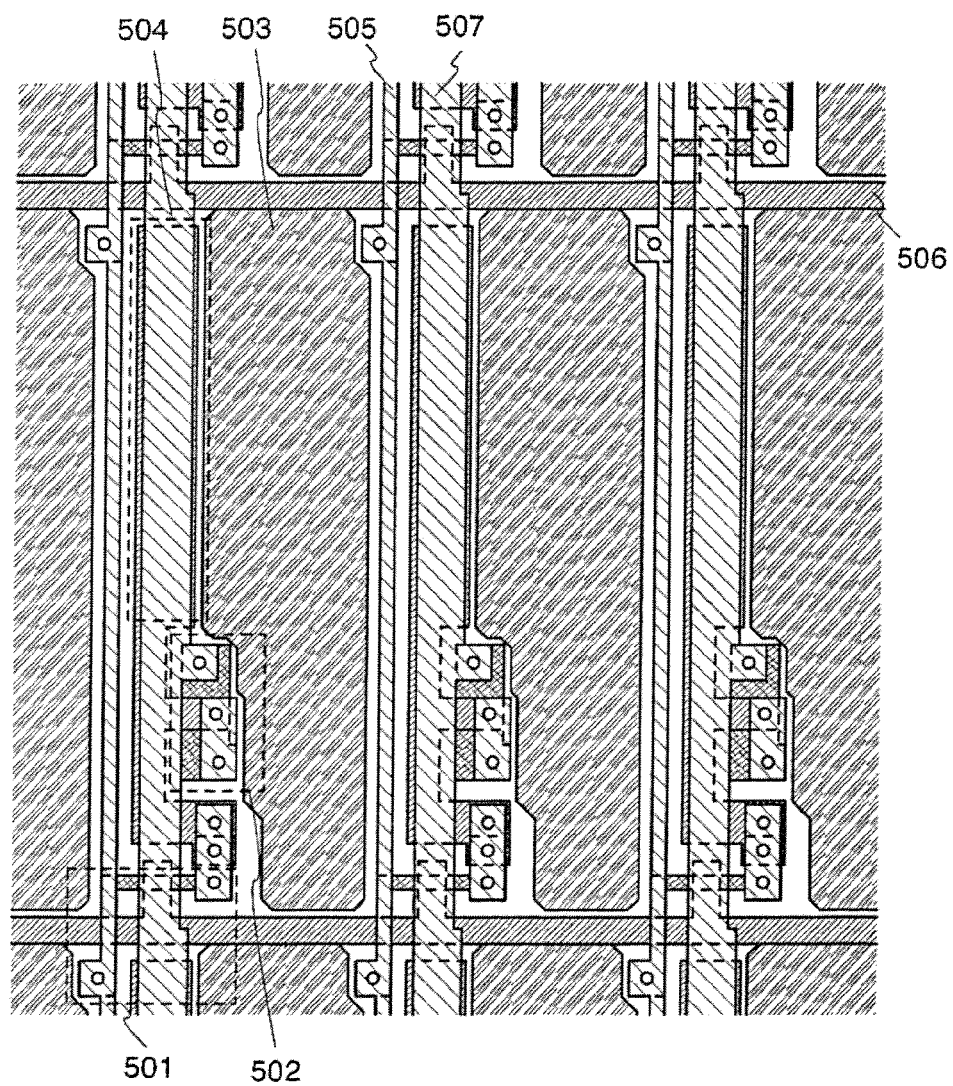
FIG. 18 is a top view of a display device according to the present invention.

FIG. 18 is a top view of a pixel region of the display device formed in this embodiment mode. In FIG. 18, a pixel 2702 includes thin film transistors 501, 502, a capacitor 504, a light-emitting element 503, a gate wiring layer 506, a source or drain wiring layer 505 and a power supply line 507.

The light emitting element is sealed by bonding the substrate 100 where the light emitting element 190 is formed to a sealing substrate 195 with a sealing material 192 (FIGS. 1A and 1B). Water is prevented from entering through a cross-section by the sealing material; therefore, the light emitting element is prevented from deteriorating, which leads to the higher reliability of the display device. As the sealing material 192, a visible light curing, ultraviolet curing or thermosetting resin is preferably used. For example, an epoxy resin such as a bisphenol A liquid resin, a bisphenol A solid resin, a resin containing bromo-epoxy, a bisphenol F resin, a bisphenol AD resin, a phenol resin, a cresol resin, a novolac resin, a cyclic aliphatic epoxy resin, an epibis epoxy resin, a glycidyl ester resin, a glycidyl amine resin, a heterocyclic epoxy resin, or a modified epoxy resin can be used. Note that a region surrounded with the sealing material may be filled with a filler 193, and nitrogen or the like may be encapsulated therein by sealing the light emitting element in a nitrogen atmosphere. The filler 193 does not necessarily have light-transmitting properties, since a bottom emission type is employed in this embodiment mode. In the case of a structure in which light is extracted through the filler 193, the filler needs to have light-transmitting properties. Typically, a visible light curing, ultraviolet curing, or thermosetting epoxy resin may be used. Through the above described steps, a display device having a display function using a light emitting element in this embodiment mode is completed. Further, the filler in a liquid state may be dropped and can fill the inside of the display device.

Figure 19:
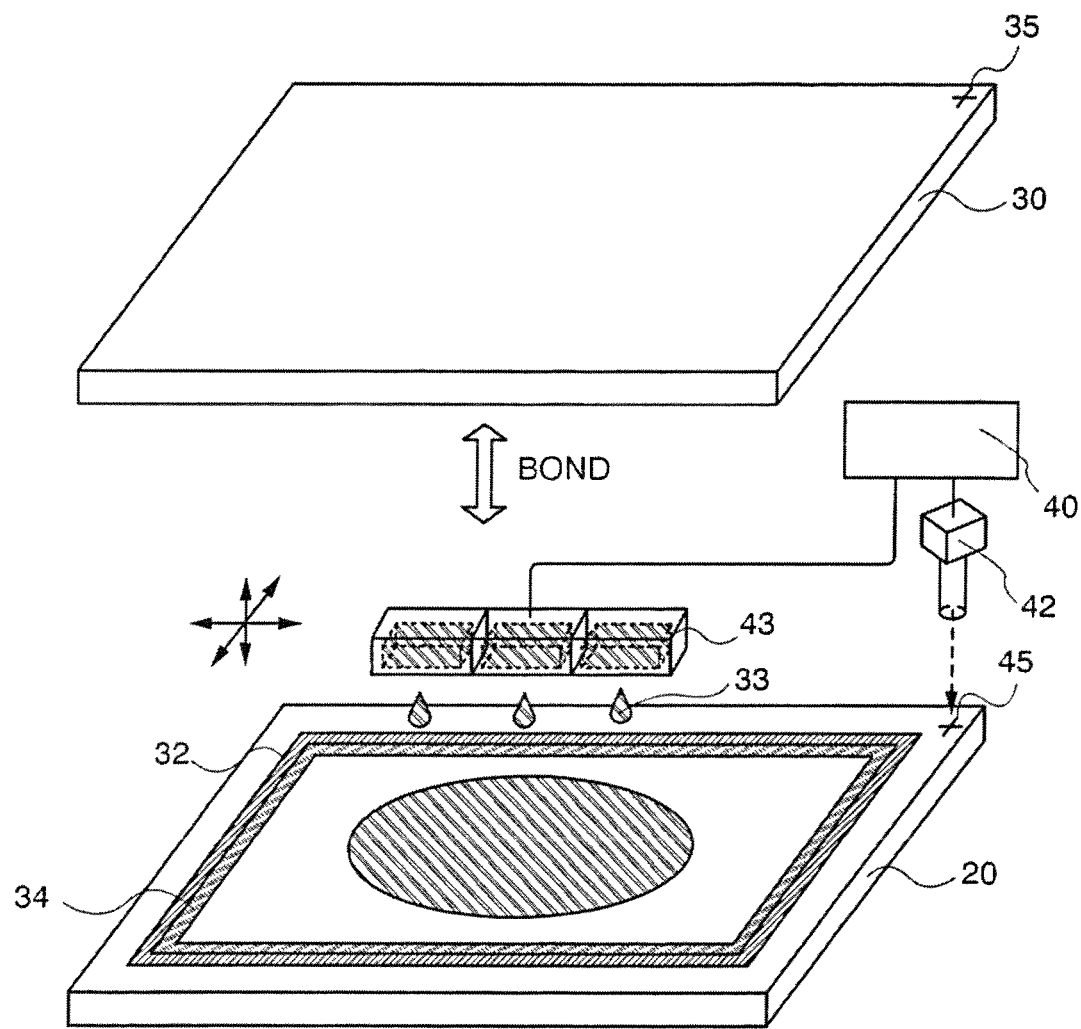
FIG. 19 shows a dropping method that can be applied to the present invention.

A dropping method (a method by which a filler is injecting by being dropped) using a dispenser method is described with reference to FIG. 19. The dropping method in FIG. 19 includes a control device 40, an imaging means 42, a head 43, a filler 33, markers 35, 45, a barrier layer 34, a sealing material 32, a TFT substrate 30, and an opposite substrate 20. A closed loop is formed by the sealing material 32, and the filler 33 is dropped thereinto once or plural times from the head 43. If the viscosity of the filler material is high, the filler is discharged continuously and attached to a formation region with the filler extended. On the other hand, if the viscosity of the filler material is low, the filler is discharged intermittently and dropped as shown in FIG. 19. The barrier layer 34 may be provided so as to prevent the sealing material 32 from reacting with the filler 33. Then, the substrates are attached in vacuum, and then cured by ultraviolet rays to be filled with the filler. When a hygroscopic material such as a drying agent is used as the filler, a further absorption effect of water is obtained and deterioration of an element can be prevented.

A drying agent is provided in an EL display panel so as to prevent deterioration of an element due to water. In this embodiment mode, the drying agent is provided in a concave portion formed to surround the pixel region in the sealing substrate, so as not to hinder thinning. In addition, a drying agent is also provided in a region corresponding to a gate wiring layer, and the area of water absorption is large, which leads to high absorption efficiency. Further, since the drying agent is provided on the gate wiring layer that does not emit light for itself, light-extraction efficiency is not reduced.

Note that this embodiment mode shows the case in which the light-emitting element is sealed with the glass substrate. The sealing treatment is a treatment to protect the light emitting element from water. Therefore, any of a method by which a light emitting element is mechanically sealed with a cover material, a method by which a light emitting element is sealed with a thermosetting resin or an ultraviolet curing resin, and a method by which a light emitting element is sealed with a thin film of such as a oxide or nitride of a metal or the like having high barrier capabilities, can be used. As for the cover material, glass, ceramics, plastic, or metal can be used. However, when light is emitted to the cover material side, the cover material needs to have light-transmitting properties. Enclosed space is formed by attaching the cover material to the substrate over which the above-mentioned light emitting element is formed with a sealing material such as a thermosetting resin or an ultraviolet curing resin and then by curing the resin with a heat treatment or an ultraviolet irradiation treatment. It is also effective to provide a hydroscopic material typified by barium oxide in the enclosed space. The hydroscopic material may be provided on the sealing material or over a bank or in the peripheral part thereof so as not to block light emitted from the light emitting element. Further, it is also possible to fill the space between the cover material and the substrate over which the light emitting element is formed with a thermosetting resin or an ultraviolet curing resin. In this case, it is effective to add a hydroscopic material typified by barium oxide in the thermosetting resin or the ultraviolet curing resin.

In this embodiment mode, in the external terminal connection region 202, an FPC 194 is connected to the terminal electrode layer 178 with an anisotropic conductive layer 196, so as to make an electrical connection to the outside.

In this embodiment mode, the display device includes the above-mentioned circuits. However, the present invention is not limited thereto. As a peripheral driver circuit, an IC chip may be mounted by a COG method or TAB method mentioned above. Additionally, a single or a plurality of gate line driver circuits and source line driver circuits may be used.

In the display device of the present invention, a method for driving a screen is not specifically limited, for example, a dot sequential driving system, a line sequential driving system, a plane sequential driving system, or the like may be employed. Typically, the line sequential driving system is employed, and a time division gray-scale driving system or an area gray-scale driving system may be utilized as needed. The video signal to be inputted into a source line of the display device may be either an analog signal or a digital signal, and the driver circuit or the like may be designed corresponding to the video signal as needed.

Further, in a display device using a digital video signal, there are two kinds of driving systems in which a video signal inputted into a pixel is one with constant voltage (CV) and in which a video signal inputted into a pixel is one with constant current (CC). Further, as for the driving system using a video signal with constant voltage (CV), there are two kinds of systems in which voltage applied to a light emitting element is constant (CVCV), and in which current applied to a light emitting element is constant (CVCC). In addition, as for the driving system using a video signal with constant current (CC), there are two kinds of systems in which voltage applied to a light emitting element is constant (CCCV), and in which current applied to a light emitting element is constant (CCCC).

According to the present invention, a highly reliable display device can be manufactured through a simplified process. Therefore, a display device that exhibits high-precision and high-quality images can be manufactured at a low cost with high yield.

Embodiment Mode 2

Embodiment Mode according to the present invention is described with reference to FIGS. 7A to 9. Embodiment Mode 2 describes an example in which a second interlayer insulating film is not formed in the display device manufactured in Embodiment Mode 1. Therefore, the description of the same portions and the portions having the same function is omitted.

As shown in Embodiment Mode 1, thin film transistors 173 to 176, a conductive layer 177, and insulating films 167 and 168 are formed over a substrate 100. A source or drain electrode layer to be connected to a source or drain region of a semiconductor layer is formed in each thin film transistor. A first electrode layer 395 is formed to be in contact with a source or drain electrode layer 172b in the thin film transistor 176 provided in a pixel region 206 (FIG. 7A).

The first electrode layer 395 serves as a pixel electrode, and may be formed from the same material in the same process as the first electrode layer 185 in Embodiment Mode 1. In this embodiment mode, light is extracted through the first electrode layer as in Embodiment Mode 1, and thus ITSO that is a transparent conductive film is used as the first electrode layer 395 and patterned.

Figures 7A, 7B:
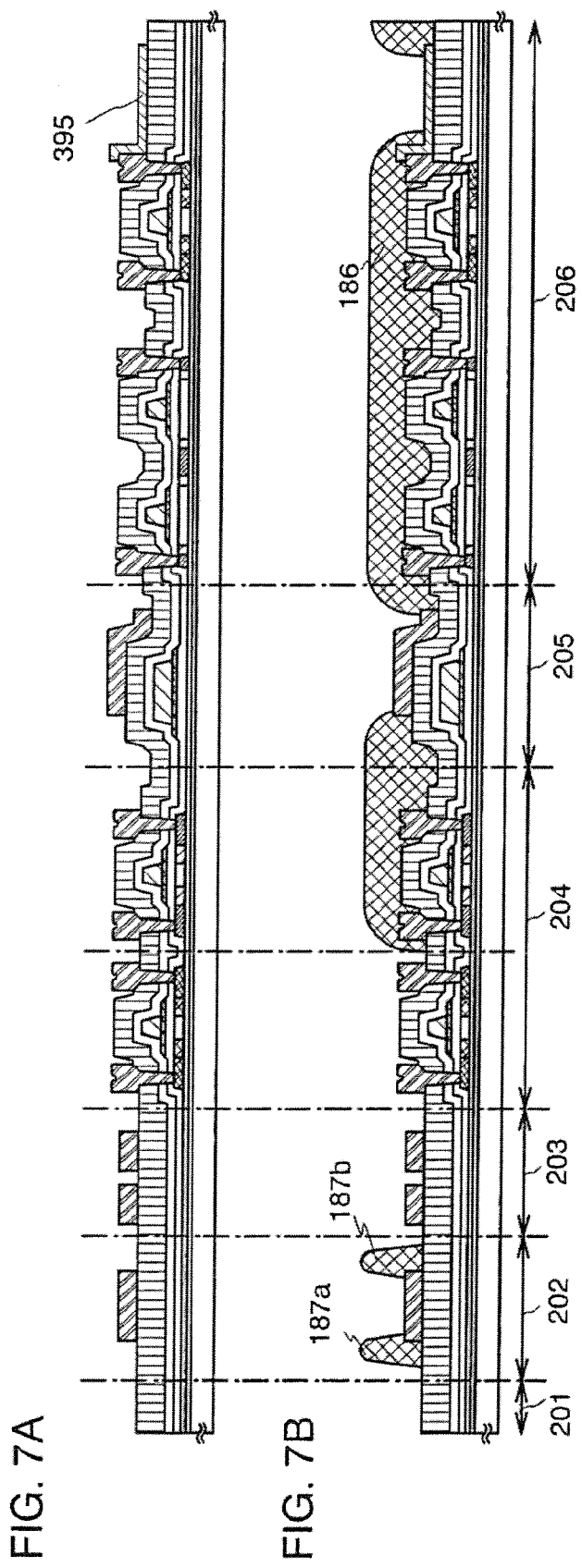
FIGS. 7A and 7B show a manufacturing method of a display device according to the present invention.
Figure 8:
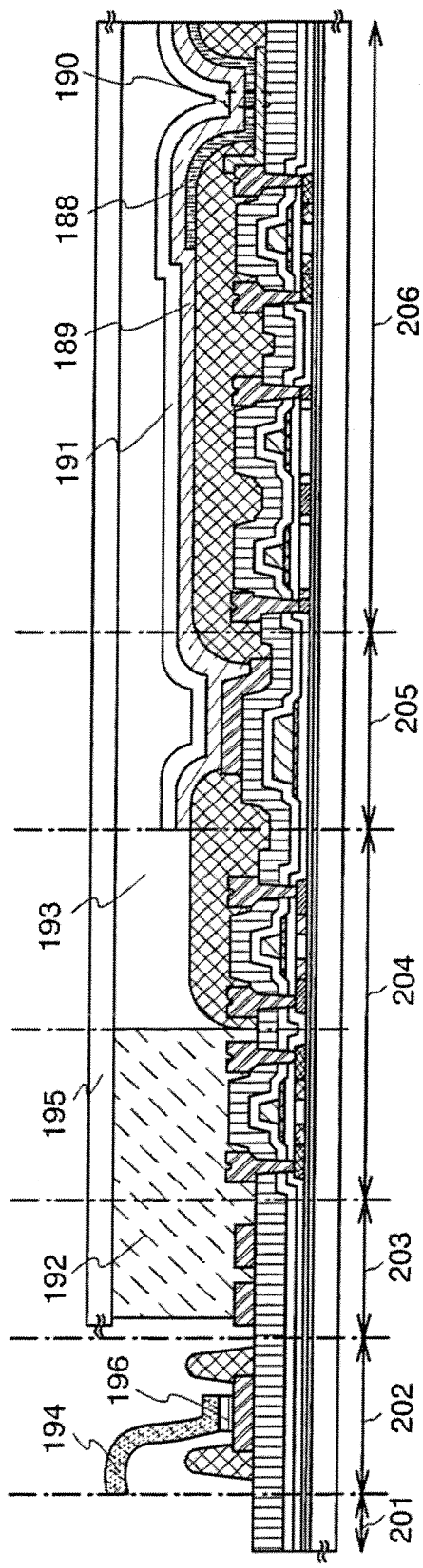
FIG. 8 shows a display device according to the present invention.

An insulator 186 is formed to cover an edge portion of the first electrode layer 395 and the thin film transistors (FIG. 7B). Acrylic is used for the insulator 186 in this embodiment mode. An electroluminescent layer 188 is formed over the first electrode layer and a second electrode layer 189 is stacked thereover to obtain a light-emitting element 190. The second electrode layer 189 is electrically connected to a wiring layer 156 in a connection region 205. A terminal electrode layer 178 is bonded to an FPC 194 by an anisotropic conductive layer 196 in an external terminal connection region 202. A passivation film 191 is formed to cover the second electrode layer 189. The substrate 100 is attached to a sealing substrate 195 by a sealing material 192, and a filler 193 fills a display device (FIG. 8).

Figure 9:
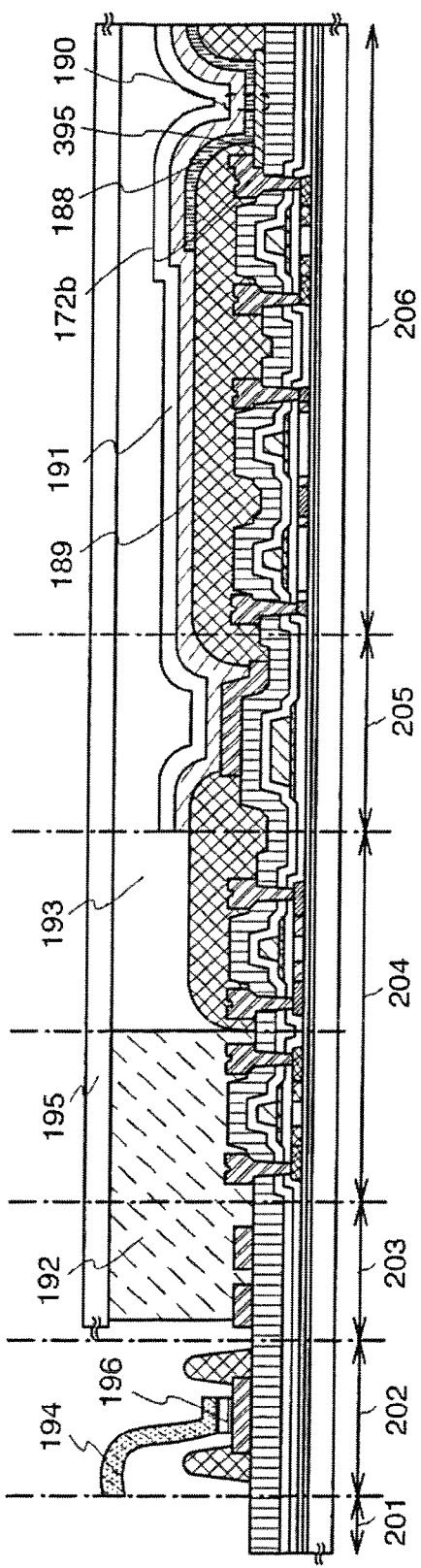
FIG. 9 shows a display device according to the present invention.

In the display device shown in FIG. 9, the first electrode layer 395 can selectively formed over the insulating film 168 before forming the source or electrode layer 172*b* to be connected to the thin film transistor 176. In this case, the source or drain electrode layer 172*b* is connected to the first electrode layer 395 by stacking the source or drain electrode layer 172*b* over the first electrode layer. When the first electrode layer 395 is formed before forming the source or drain electrode layer 172*b*, the first electrode layer 395 can be formed in a flat region; therefore, there are advantages of good coverage, good film formation conditions, and good planarity since it is possible to sufficiently conduct a polishing treatment such as CMP.

According to the present invention, a highly reliable display device can be manufactured through a simplified process. Therefore, a display device that exhibits high-precision and high-quality images can be manufactured at a low cost with high yield.

Embodiment Mode 3

Embodiment Mode according to the present invention is described with reference to FIGS. 10A to 10C. Embodiment Mode 3 describes an example in which a gate electrode layer of a thin film transistor has a different structure in the display device manufactured in Embodiment Mode 1. Therefore, the description of the same portions and the portions having the same function is omitted.

Figures 10A, 10B, 10C:
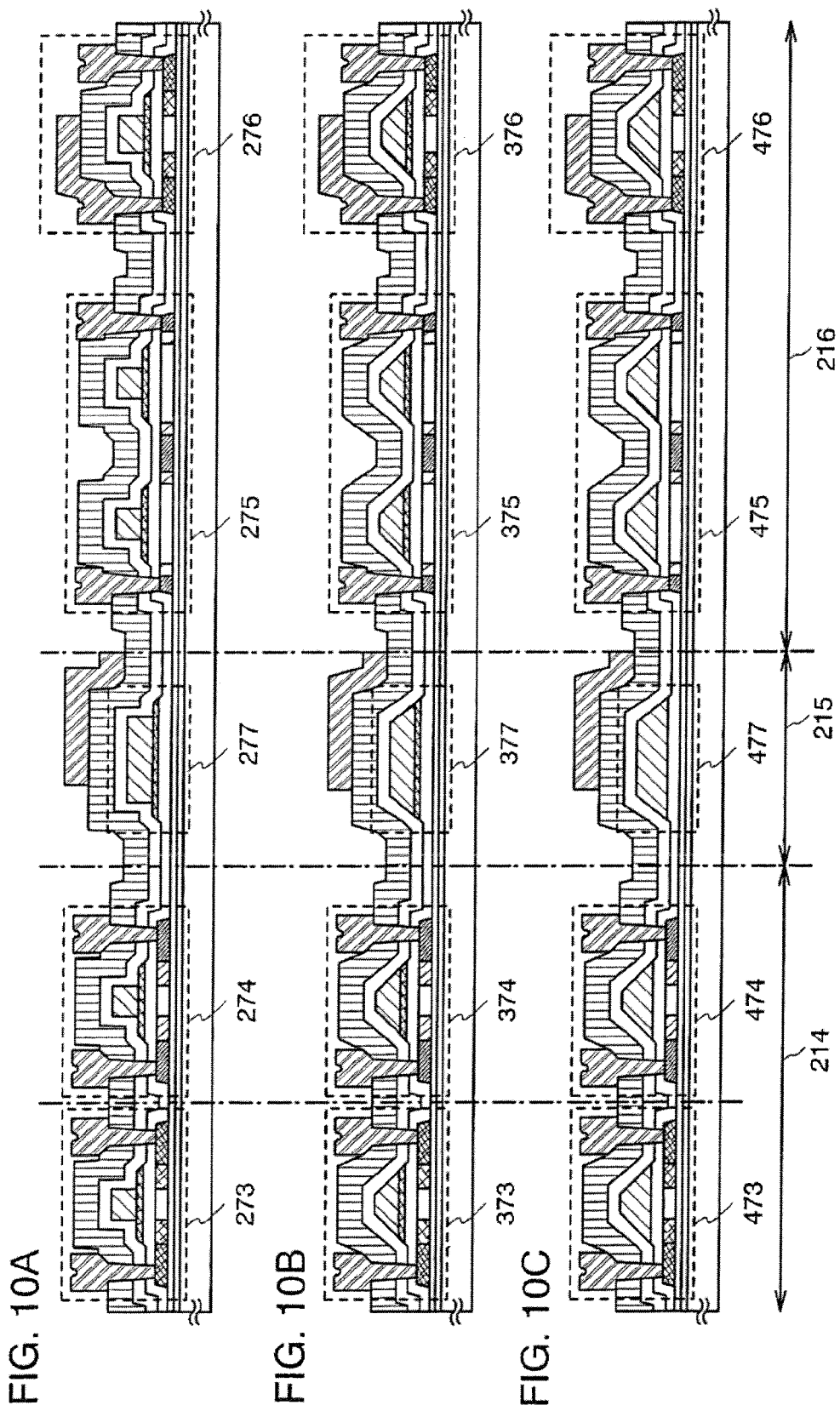
FIGS. 10A to 10C show a display device according to the present invention.

FIGS. 10A to 10C show a display device that is being formed in a manufacturing process and corresponds to the display device shown in FIG. 4B described in Embodiment Mode 1.

In FIG. 10A, thin film transistors 273, 274 are formed in a peripheral driver circuit region 214, a conductive layer 277 is formed in a connection region 215, and thin film transistors 275, 276 are formed in a pixel region 216. A gate electrode layer of a thin film transistor in FIG. 10A has a stacked structure of two conductive films, in which an upper gate electrode layer is patterned to have a width narrower than a lower gate electrode layer. The lower gate electrode layer has a tapered shape but the upper gate electrode layer does not have a tapered shape. In this manner, the gate electrode layer may have a tapered shape or the angle in the side thereof may substantially be vertical, in other words, the gate electrode layer may not have a tapered shape.

In FIG. 10B, thin film transistors 373, 374 are formed in the peripheral driver circuit region 214, a conductive layer 377 is formed in the connection region 215, and thin film transistors 375, 376 are formed in the pixel region 216. The gate electrode layer of the thin film transistor in FIG. 10B also has a stacked structure of two conductive films and the upper and lower gate electrode layers have a continuous tapered shape.

In FIG. 10C, thin film transistors 473, 474 are formed in the peripheral driver circuit region 214, a conductive layer 477 is formed in the connection region 215, and thin film transistors 475, 476 are formed in the pixel region 216. The gate electrode layer of the thin film transistor in FIG. 10C has a single layer structure and has a tapered shape. Like this, the gate electrode layer may have a single layer structure.

As described above, the gate electrode layer can have various structures depending on the structure and shape thereof. Thus, the obtained display device can have various structures. When an impurity region in the semiconductor layer is formed in a self alignment manner with a gate electrode layer as a mask, the structure of the impurity region or a concentration distribution is varied depending on the structure of the gate electrode layer. If a thin film transistor is designed in consideration of the above, the thin film transistor having desired functions can be obtained.

This embodiment mode can be freely combined with Embodiment Modes 1 and 2.

Embodiment Mode 4

A display device having a light emitting element can be manufactured by applying the present invention. Light is emitted from the light emitting element in bottom emission, top emission, or dual emission. In this embodiment mode, examples of a dual emission type and a top emission type will be described with reference to FIG. 11 and FIG. 12.

Figure 12:
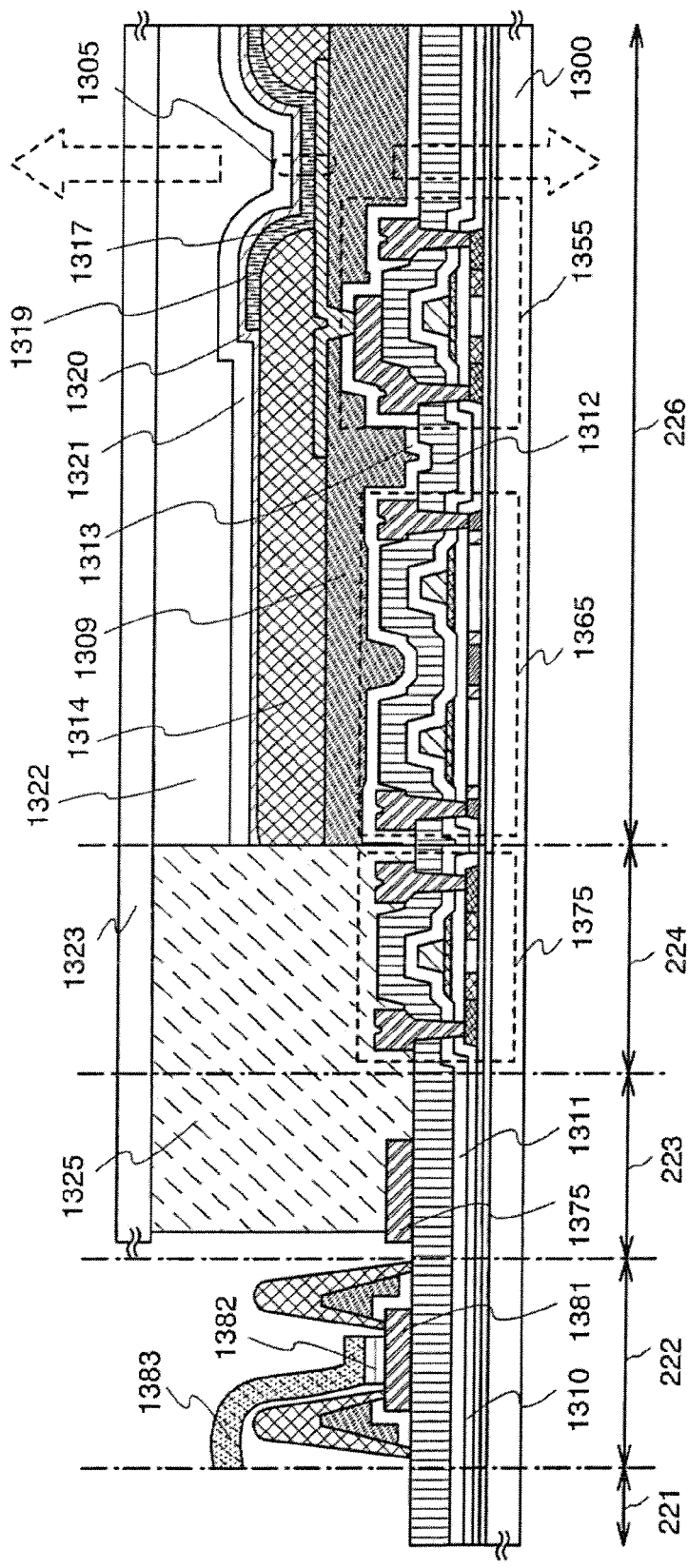
FIG. 12 shows a display device according to the present invention.

A display device shown in FIG. 12 includes an element substrate 1300; TFTs 1355, 1365 and 1375; a first electrode layer 1317; an electroluminescent layer 1319; a second electrode layer 1320; a transparent conductive film 1321; a filler 1322; a sealing material 1325; a gate insulating layer 1310; insulating films 1309, 1311 to 1313; an insulator 1314; a sealing substrate 1323; a wiring layer 1375; a terminal electrode layer 1381; an anisotropic conductive layer 1382; and an FPC 1383. The display device includes a region to be cut out 221, an external terminal connection region 222, a wiring region 223, a peripheral driver circuit region 224 and a pixel region 226. The filler 1322 can be formed by a dropping method using a composition in liquid form as in the case of the dropping method in FIG. 19. The light emitting display device is sealed by attaching the element substrate 1300 provided with the filler to the sealing substrate 1323 by a drop method.

The display device shown in FIG. 12 is a dual emission type, and has a structure in which light is emitted in directions indicated by arrows, namely, to the both sides of the element substrate 1300 and the sealing substrate 1323. In this embodiment mode, a transparent conductive film is formed and etched to have a desired shape to form the first electrode layer 1317. A transparent conductive film can be used as the first electrode layer 1317. In addition to the transparent conductive film, a titanium nitride film or a titanium film may be used as the first electrode layer 1317. In this case, a titanium nitride film or a titanium film is formed to have a film thickness which allows to transmit light (preferably, approximately from 5 to 30 nm) after forming the transparent conductive film. In this embodiment mode, ITSO is used as the first electrode layer 1317.

Then, a second electrode layer 1320 formed with a conductive film is formed over the electroluminescent layer 1319. As the second electrode layer 1320, a material having a low work function (Al, Ag, Li, Ca; an alloy thereof such as MgAg, MgIn, AlLi; or a compound thereof such as $CaF_2$, or CaN) may be used. In the display device shown in FIG. 12, a metal thin film with a thinned film thickness (MgAg: a film thickness of 10 nm) as the second electrode layer 1320, and ITSO having a film thickness of 100 nm as the transparent conductive film 1321 are stacked so that light can be transmitted. As the transparent conductive film 1321, a film similar to the above-mentioned first electrode layer 1317 can be used.

Figure 11:
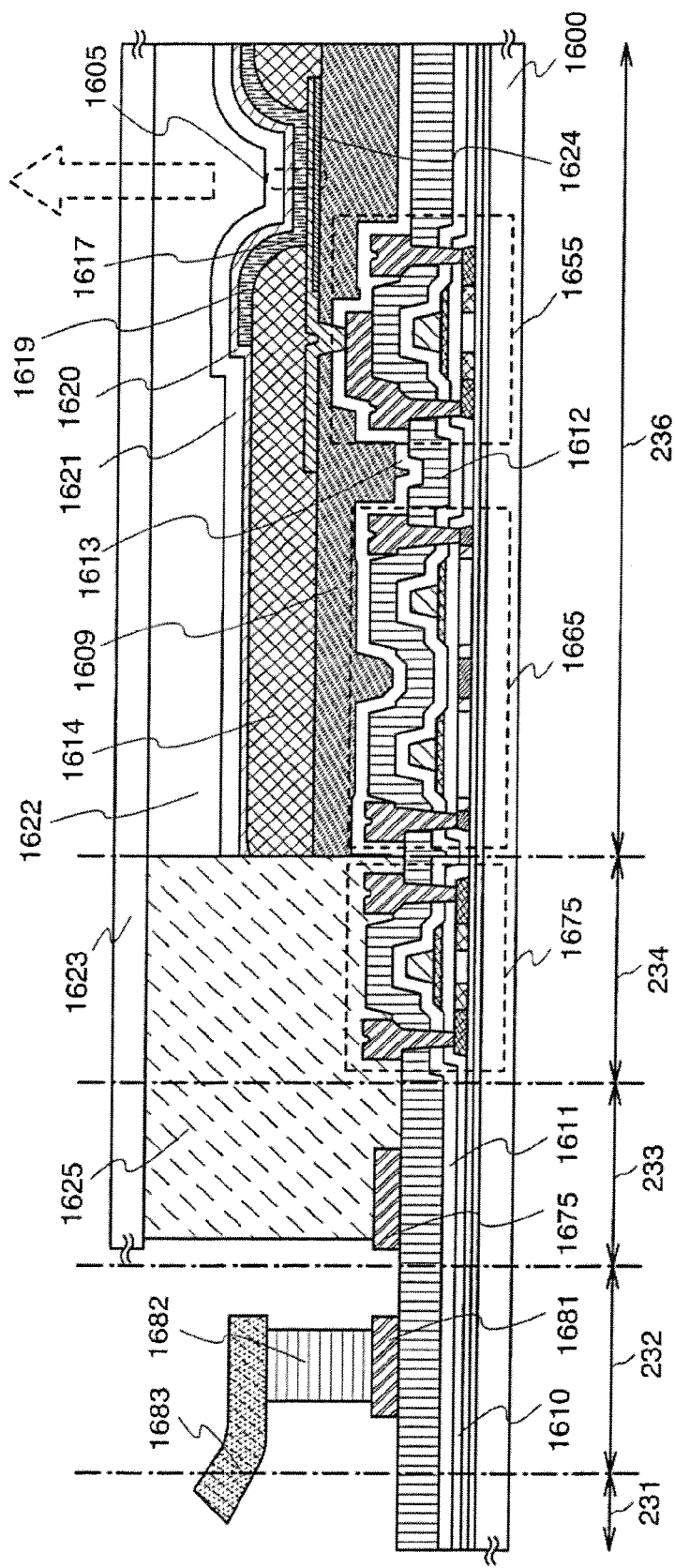
FIG. 11 shows a display device according to the present invention.

A display device shown in FIG. 11 is a one-side emission type, and has a structure in which top emission is performed in a direction indicated by an arrow. The display device shown in FIG. 11 includes an element substrate 1600, TFTs 1655, 1665 and 1675, a reflective metal layer 1624, a first electrode layer 1617, an electroluminescent layer 1619, a second electrode layer 1620, a transparent conductive film 1621, a filler 1622, a sealing material 1625, a gate insulating layer 1610, insulating films 1611 to 1613 and 1609, an insulator 1614, a sealing substrate 1623, a wiring layer 1675, a terminal electrode layer 1681, an anisotropic conductive layer 1682 and an FPC 1683. In the display device in FIG. 11, the insulating layer stacked over the terminal electrode layer 1681 is etched to be removed. In this manner, the structure in which a moisture permeable insulating layer is not provided in the periphery of the terminal electrode layer can enhance the reliability. In addition, the display device includes a region to be cut out 231, an external terminal connection region 232, a wiring region 233, a peripheral driver circuit region 234 and a pixel region 236. In this case, in the dual emission type display device shown in FIG. 12, the reflective metal layer 1624 is formed under the first electrode layer 1617. The first electrode layer 1617 functioning as an anode, which is formed of a transparent conductive film, is formed over the reflective metal layer 1624. As the metal layer 1624, it may be at least reflective; therefore, Ta, W, Ti, Mo, Al, Cu or the like may be used. It is preferable to use a substance having high reflectivity in a visible light range, and in this embodiment mode, a TiN film is used. The present invention is applied to the insulating layer 1609 and the bank 1614; thus, the display device can provide high definition display without display unevenness owing to the uniform thickness distribution and the high planarity of the insulating 1609.

The second electrode layer 1620 formed of a conductive film is provided over the electroluminescent layer 1619. As the second electrode layer 1620, a material having a low work function (Al, Ag, Li, Ca; an alloy thereof such as MgAg, MgIn, AlLi; or a compound thereof such as $CaF_2$, or CaN) may be used so as to be used as a cathode. In this embodiment mode, a metal thin film with thinned film thickness as the second electrode layer 1620 (MgAg: a film thickness of 10 nm) and ITSO having a film thickness of 110 nm as the transparent conductive film 1621 are stacked so that light can be transmitted.

A mode of a light emitting element which can be applied in this embodiment mode is shown in FIG. 13A to 13D. The light emitting element has a structure in which an electroluminescent layer 860 is interposed between a first electrode layer 870 and a second electrode layer 850. The materials of the first electrode layer and the second electrode layer are required to be selected considering the work functions. The first electrode layer and the second electrode layer can be either an anode or a cathode depending on the pixel structure. In this embodiment mode, in the case where a driving TFT has a p-channel conductivity, the first electrode layer may preferably serve as an anode and the second electrode layer may serve as a cathode. Since the driving TFT has an n-channel conductivity, the first electrode layer may preferably be used as a cathode and the second electrode layer may preferably be used as an anode.

Figure 13A:
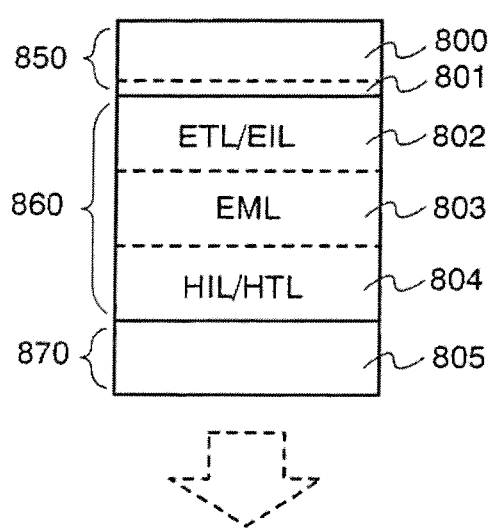
FIGS. 13A to 13D show a structure of a light-emitting element that can be applied to the present invention.
Figure 13B:
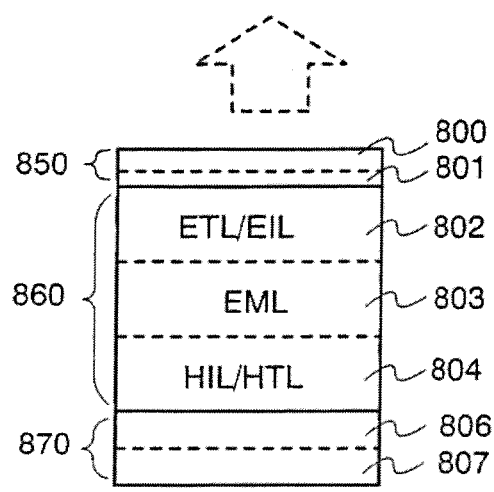

FIGS. 13A and 13B show the case where the first electrode layer 870 is an anode and the second electrode layer 850 is a cathode. The electroluminescent layer 860 preferably has a structure in which an HIL (hole injection layer)/HTL (hole transport layer) 804, an EML (light emitting layer) 803, an ETL (electron transport layer)/EIL (electron injection layer) 802, and a second electrode layer 850 are stacked in order from the side of the first electrode layer 870. FIG. 13A shows a structure in which light is emitted from the first electrode layer 870 which includes an electrode layer 805 having a light-transmitting conductive oxide material, and the second electrode layer has a structure in which an electrode layer 801 containing an alkali metal or an alkaline earth metal such as LiF or MgAg and an electrode layer 800 made of a metal material such as aluminum are stacked in order from the side of the electroluminescent layer 860. FIG. 13B shows a structure in which light is emitted from the second electrode layer 850, and in which the first electrode layer includes an electrode layer 807 made of a metal such as aluminum or titanium, or a metal material containing such a metal and nitrogen of concentration in stoichiometric proportion or less, and the second electrode layer 806 made of a conductive oxide material containing silicon oxide at a concentration of 1 to 15 atomic %. The second electrode layer is constituted by an electrode layer 801 containing an alkali metal or an alkaline earth metal such as LiF or MgAg and an electrode layer 800 made of a metal material such as aluminum from the side of the electroluminescent layer 860; each layer is formed to have a thickness of 100 nm or less to transmit light; thus, the light can be emitted from the second electrode layer 850.

Figure 13C:
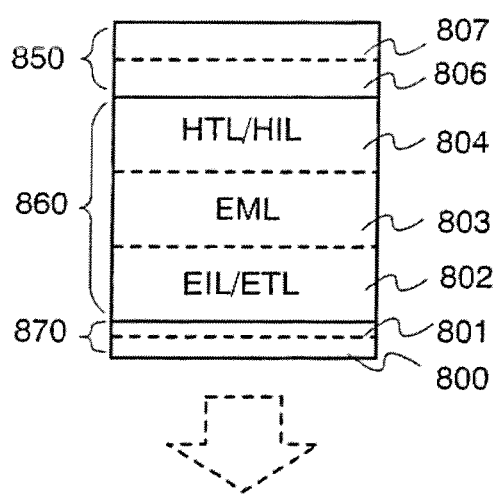
Figure 13D:
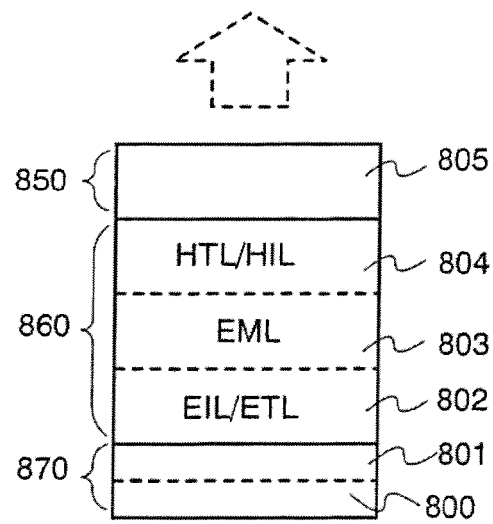

FIGS. 13C and 13D show the case where the first electrode layer 870 is a cathode and the second electrode layer 850 is an anode. The electroluminescent layer 860 preferably has a structure in which an EIL (electron injection layer)/an ETL (electron transport layer) 802, an EML (light emitting layer) 803, an HTL (hole transport layer)/HIL (hole injection layer) 804, and the second electrode layer 850 which is an anode are stacked in order from the cathode side. FIG. 13C shows a structure in which light is emitted from the first electrode layer 870. The first electrode layer 870 includes an electrode layer 801 containing an alkali metal or an alkaline earth metal such as LiF or MgAg and an electrode layer 800 made of a metal material such as aluminum from the side of the electroluminescent layer 860; each layer is formed to have a thickness of 100 nm or less to transmit light; thus, the light can be emitted from the first electrode layer 870. The second electrode layer includes the second electrode layer 806 made of a conductive oxide material containing silicon oxide at a concentration of 1 to 15 atomic % and an electrode layer 807 made of a metal such as aluminum or titanium, or a metal material containing such a metal and nitrogen of concentration in stoichiometric proportion or less, from the side of the electroluminescent layer 860. FIG. 13D shows a structure in which light is emitted from the second electrode layer 850. The first electrode layer 870 includes an electrode layer 801 containing an alkali metal or an alkaline earth metal such as LiF or MgAg and an electrode layer 800 made of a metal material such as aluminum from the side of the electroluminescent layer 860; the first electrode layer 870 is formed thick enough to reflect the light produced in the electroluminescent layer 860. The second electrode layer 850 includes an electrode layer 805 made of a light-transmitting conductive oxide material. The electroluminescent layer may have a single layer structure or a mixed structure instead of a stacked structure.

As the electroluminescent layer, materials each displaying luminescence of red (R), green (G), and blue (B) are selectively formed by a vapor deposition method using a vapor deposition mask, respectively. The materials (low molecular weight materials or high molecular weight materials or the like) each displaying luminescence of red (R), green (G), and blue (B) can be formed by a droplet discharging method in the same manner as a color filter. This case is preferable since RGB can be separately colored without using masks.

In the case of the top emission type, when ITO or ITSO having light-transmitting property is used as the second electrode layer, BzOs—Li in which Li is added to benzoxazole derivatives (BzOs) or the like can be used. $Alq_3$ doped with a dopant corresponding to respective luminescent colors of R, and B (DCM or the like for R, and DMQD or the like for G) may be used for the EML, for example.

Note that the electroluminescent layer is not limited to the above-mentioned materials. For example, hole injection properties can be enhanced by co-evaporating an oxide such as molybdenum oxide (MoOx: x=2 to 3) and α-NPD or rubrene instead of using CuPc or PEDOT. An organic material (including a low molecular weight material or a high molecular weight material) or a composite material of an organic material and an inorganic material can be used as the material of the electroluminescent layer. A material forming the light emitting element will be described below in detail.

As a substance having high electron transport properties among charge injection transport materials, for example, a metal complex having a quinoline skeleton or a benzoquinoline skeleton such as tris(8-quinolinolato) aluminum ($Alq_3$), tris(4-methyl-8-quinolinolato) aluminum ($Almq_3$), bis(10-hydroxybenzo[h]-quinolinato) beryllium ($BeBq_2$), bis(2-methyl-8-quinolinolato)-4-phenylphenolato-aluminum (BAlq), and the like can be given. As a substance having high hole transport properties, for example, an aromatic amine compound (in other words, a compound having the bond of benzene ring-nitrogen) such as 4,4'-bis[N-(1-naphthyl)-N-phenyl-amino]-biphenyl (α-NPD), 4,4'-bis[N-(3-methylphenyl)-N-phenyl-amino]-biphenyl (TPD), 4,4',4"-tris(N,N-diphenyl-amino)-triphenylamine (TDATA), or 4,4',4"-tris[N-(3-methylphenyl)-N-phenyl-amino]-triphenylamine (MTDATA) can be used.

As a substance having high electron injection properties among charge injection transport materials, a compound of an alkali metal or an alkaline earth metal such as lithium fluoride (LiF), cesium fluoride (CsF), or calcium fluoride ($CaF_2$) can be given. In addition to this, it may be a mixture of a substance having high electron transport properties such as $Alq_3$ and an alkaline earth metal such as magnesium (Mg).

As a substance having high hole injection properties among charge injection transport materials, for example, a metal oxide such as molybdenum oxide (MoOx), vanadium oxide (VOx), ruthenium oxide (RuOx), tungsten oxide (WOx), or manganese oxide (MnOx) is used. In addition, phthalocyanine ($H_2Pc$) or a phthalocyanine compound such as copper phthalocyanine (CuPc) can be used.

The light emitting layer may perform color display by providing each pixel with light emitting layers having different emission wavelength ranges. Typically, a light emitting layer corresponding to each color of R (red), G (green), or B (blue) is formed. On this occasion, color purity can be improved and a pixel portion can be prevented from having a mirror surface (reflection) by providing the light emission side of the pixel with a filter which transmits light of an emission wavelength range. By providing a filter, a circularly polarizing plate or the like that is conventionally required can be omitted, and further, the loss of light emitted from the light emitting layer can be eliminated. Further, change in hue, which occurs when a pixel portion (display screen) is obliquely seen, can be reduced.

Various materials can be used for the light emitting material. As a low molecular weight organic light emitting material, 4-dicyanomethylene-2-methyl-6-[2-(1,1,7,7-tetramethyl-9-julolidyl)ethenyl]-4H-pyran; (DCJT); 4-dicyanomethylene-2-t-butyl-6-[2-(1,1,7,7-tetramethyljulolidine-9-yl-ethenyl)]-4H-pyran; (DCJTB); periflanthene; 2,5-dicyano-1,4-bis[2-(10-methoxy-1,1,7,7-tetramethyljulolidine-9-yl)ethenyl]benzene; N,N'-dimethylquinacridon (DMQd); coumarin 6; coumarin 545T; tris(8-quinolinolato)aluminum ($Alq_3$); 9,9'-bianthryl; 9,10-diphenylanthracene (DPA); 9,10-bis(2-naphthyl)anthracene (DNA); and the like can be used. Another substance can also be used.

On the other hand, a high molecular weight organic light emitting material is physically stronger than a low molecular weight material and is superior in durability of the element. In addition, a high molecular weight organic light emitting material can be formed by coating; therefore, the element can be relatively manufactured easily. The structure of a light emitting element using a high molecular weight organic light emitting material basically has the same structure as in the case of using a low molecular weight organic light emitting material, that is, a cathode, an organic light emitting layer, and an anode are stacked in order. However, a two-layer structure is employed in many cases when a light emitting layer using a high molecular weight organic light emitting material is formed. This is because it is difficult to form such a stacked structure as in the case of using a low molecular weight organic light emitting material. Specifically, the light emitting element using a high molecular weight organic light emitting material, has a structure of a cathode, a light emitting layer, a hole transport layer, and an anode in order.

The emission color is determined depending on a material forming the light emitting layer; therefore, a light emitting element which displays desired luminescence can be formed by selecting an appropriate material for the light emitting layer. As a high molecular weight electroluminescent material which can be used for forming a light emitting layer, a polyparaphenylene-vinylene-based material, a polyparaphenylene-based material, a polythiophene-based material, or a polyfluorene-based material can be used.

As the polyparaphenylene vinylene-based material, a derivative of poly(paraphenylenevinylene) [PPV], for example, poly(2,5-dialkoxy-1,4-phenylenevinylene) [RO-PPV]; poly(2-(2'-ethyl-hexoxy)-5-methoxy-1,4-phenylenevinylene) [MEH-PPV]; poly(2-(dialkoxyphenyl)-1,4-phenylenevinylene) [ROPh-PPV]; and the like can be used. As the polyparaphenylene-based material, a derivative of polyparaphenylene [PPP], for example, poly(2,5-dialkoxy-1,4-phenylene) [RO-PPP]; poly(2,5-dihexoxy-1,4-phenylene); and the like can be used. As the polythiophene-based material, a derivative of a derivative of polythiophene [PT], for example, poly(3-alkylthiophene) [PAT]; poly(3-hexylthiophen) [PHT]; poly(3-cyclohexylthiophen) [PCHT]; poly(3-cyclohexyl-4-methylthiophene) [PCHMT]; poly(3,4-dicyclohexylthiophene) [PDCHT]; poly[3-(4-octylphenyl)-thiophene] [POPT]; poly[3-(4-octylphenyl)-2,2bithiophene] [PTOPT]; and the like can be used. As the polyfluorene-based material, a derivative of polyfluorene [PF], for example, poly(9,9-dialkylfluorene) [PDAF]; poly(9,9-dioctylfluorene) [PDOF]; and the like can be used.

When a high molecular weight organic light emitting material having hole transport properties is formed between an anode and a high molecular weight organic light emitting material having light emitting properties, hole injection properties from the anode can be enhanced. Generally, a high molecular weight organic light emitting material having hole transport properties which is dissolved in water with an acceptor material is applied by spin coating or the like. In addition, the high molecular weight light emitting material having hole injection properties is insoluble in an organic solvent; therefore, it can be formed over the above-mentioned high molecular weight organic light emitting material having light emitting properties. As the high molecular weight organic light emitting material having hole transport properties, a mixture of PEDOT and camphor sulfonic acid (CSA) that serves as an acceptor material, a mixture of polyaniline [PANI] and polystyrene sulfonic acid [PSS] that serves as an acceptor material, or the like can be used.

The light emitting layer can be made to emit single color or white light. When a white light emitting material is used, color display can be made possible by applying a structure in which a filter (a coloring layer) which transmits light having a specific wavelength to the light emitting side of a pixel is provided.

In order to form a light emitting layer that emits white light, for example, $Alq_3$, $Alq_3$ partially doped with Nile red that is a red light emitting colorant, $Alq_3$, p-EtTAZ, TPD (aromatic diamine) are stacked in order by a vapor deposition method to obtain white light. In the case where an EL is formed by an application method using spin coating, the layer formed by spin coating is preferably baked by vacuum heating. For example, an aqueous solution of poly(ethylene dioxythiophene)/poly(styrene sulfonic acid) solution (PEDOT/SS) may be entirely applied and baked to form a film that functions as a hole injection layer. Then, a polyvinyl carbazole (PVK) solution doped with a luminescent center colorant (1,1,4,4-tetraphenyl-1,3-butadiene (TPB); 4-dicyanomethylene-2-methyl-6-(p-dimethylamino-styryl)-4H-pyran (DCM1); Nile red; coumarin 6; or the like) may be entirely applied and baked to form a film that functions as the light emitting layer.

The light emitting layer may be formed as a single layer. For example, a 1,3,4-oxadiazole derivative (PBD) having electron transport properties may be dispersed in polyvinyl carbazole (PVK) having hole transport properties. Further, white light emission can be obtained by dispersing PBD of 30 wt % as an electron transporting agent and dispersing an appropriate amount of four kinds of colorants (TPB, coumarin 6, DCM1, and Nile red). In addition to the light emitting element from which white light emission can be obtained as shown here, a light emitting element which can provide red light emission, green light emission, or blue light emission can be manufactured by appropriately selecting materials of the light emitting layer.

Further, a triplet light emitting material containing a metal complex or the like as well as a singlet light emitting material may be used for the light emitting layer. For example, among pixels emitting red, green, and blue light, a pixel emitting red light whose luminance is reduced by half in a relatively short time is formed of a triplet light emitting material and the rest are formed of a singlet light emitting material. A triplet light emitting material has a feature of good luminous efficiency and less power consumption to obtain the same luminance. When a triplet light emitting material is used for a red pixel, only a small amount of current needs to be supplied to a light emitting element. Thus, reliability can be improved. A pixel emitting red light and a pixel emitting green light may be formed of a triplet light emitting material and a pixel emitting blue light may be formed of a singlet light emitting material to achieve low power consumption. Low power consumption can be further achieved by forming a light emitting element which emits green light that has high visibility with a triplet light emitting material.

A metal complex used as a dopant is an example of a triplet light emitting material, and a metal complex having platinum that is a third transition series element as a central metal, a metal complex having iridium as a central metal, and the like are known. A triplet light emitting material is not limited to the compounds. A compound having the above described structure and an element belonging to any of the Groups 8 to 10 of the periodic table as a central metal can also be used.

The above described materials for forming the light emitting layer are just examples. A light emitting element can be formed by appropriately stacking functional layers such as a hole injection transport layer, a hole transport layer, an electron injection transport layer, an electron transport layer, a light emitting layer, an electron blocking layer and a hole blocking layer. Further, a mixed layer or a mixed junction may be formed by combining these layers. The layer structure of the light emitting layer can be varied. Instead of providing a specific electron injection region or light emitting region, modification such as providing an electrode layer for the purpose or providing a dispersed light emitting material is acceptable as long as it does not deviate from the scope of the present invention.

A light emitting element formed with the above described materials emits light by being forward biased. A pixel of a display device formed with a light emitting element can be driven by a simple matrix mode or an active matrix mode. In any event, each pixel emits light by applying a forward bias thereto at a specific timing; however, the pixel is in a non-light-emitting state for a certain period. The reliability of the light emitting element can be improved by applying a reverse bias in the non-light-emitting time. In the light emitting element, there is a deterioration mode in which emission intensity is decreased under specific driving conditions or a deterioration mode in which a non-light-emitting region is enlarged in the pixel and luminance is apparently decreased. However, the progression of the deterioration can be slowed down by alternating current driving where bias is applied forward and reversely. Thus, the reliability of the light emitting device can be improved. Additionally, either of digital driving and analog driving can be applied.

A color filter (coloring layer) may be formed over the sealing substrate. The color filter (coloring layer) can be formed by a vapor deposition method or a droplet discharging method. With the use of the color filter (coloring layer), high-definition display can also be performed. This is because a broad peak can be modified to be sharp in light emission spectrum of each RGB by the color filter (coloring layer).

The case of forming a material displaying luminescence of R, G, and B is shown above; however, full color display can be performed by forming a material displaying a single color light-emission and combining a color filter and a color conversion layer. The color filter (coloring layer) or the color conversion layer is formed over, for example, a second substrate (a sealing substrate) and may be attached to the substrate.

Naturally, display may be performed with single color light-emission. For example, an area color type display device may be manufactured by using single color light-emission. The area color type is suitable for a passive matrix type display portion, and characters and symbols can be mainly displayed.

In the above-mentioned structure, it is possible to use a low work function material as a cathode, for example, Ca, Al, CaF, MgAg, AlLi, or the like is desirable. Any of a single layer type, a stacked type, a mixed type having no interface between layers can be used for the electroluminescent layer. The electroluminescent layer may be formed by a singlet material, a triplet material, or a mixture of the materials; or a charge injection transport material and a light emitting material including an organic compound or an inorganic compound, which includes one layer or plural layers of a low molecular weight organic compound material, an intermediate molecular weight organic compound (which means an organic compound having no sublimation properties, and the number of molecules is 20 or less or the length of linked molecules is 10 μm or less), and a high molecular weight organic compound, which are defined by the number of molecules, and may be combined with an electron injection transport inorganic compound or a hole injection transport inorganic compound. The first electrode layer is formed with a transparent conductive film which transmits light, and for example, a transparent conductive film in which zinc oxide (ZnO) of 2 to 20% is mixed in indium oxide is used in addition to ITO or ITSO. A plasma treatment in an oxygen atmosphere or a heat treatment in vacuum atmosphere may be preferably performed before forming the first electrode layer. The bank (also referred to as a partition wall or mound) is formed with a material containing silicon, an organic material or a compound material. Additionally, a porous film may be used. However, when a photosensitive material or a non-photosensitive material such as acrylic or polyimide is used to form the bank, the side face thereof has a shape in which a radius curvature changes continuously, and an upper layer thin film is formed without disconnection due to a step, which is preferable.

According to the present invention, a highly reliable display device can be manufactured through a simplified process. Therefore, a display device that exhibits high-precision and high-quality images can be manufactured at a low cost with high yield.

This embodiment mode can be freely combined with Embodiment Modes 1 to 3.

Embodiment Mode 5

Figure 15:
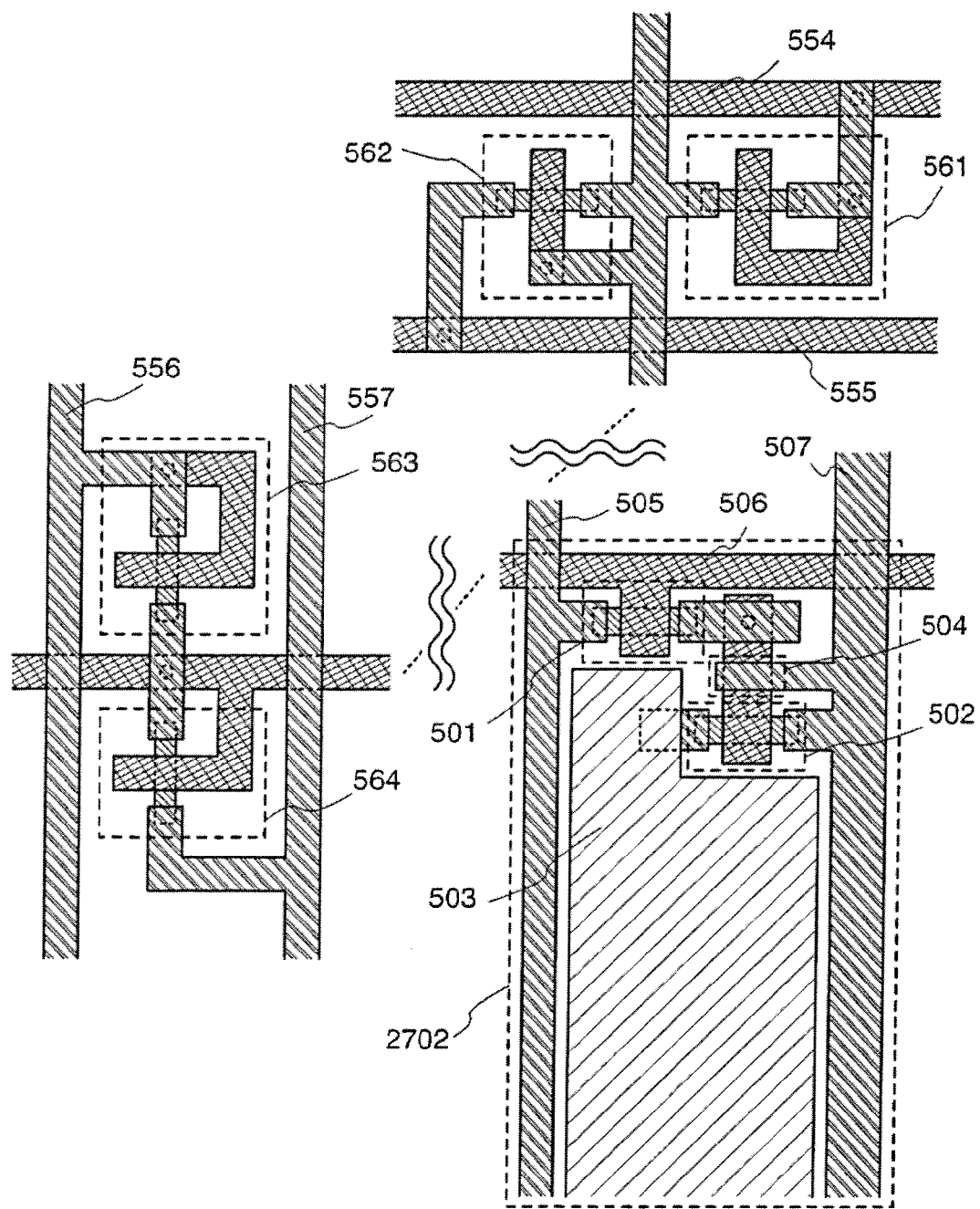
FIG. 15 is a top view for describing a display device according to the present invention.

One mode in which protective diodes are provided for a scan line input terminal portion and a signal line input terminal portion is explained with reference to FIG. 15. TFTs 501 and 502, a capacitor 504, and a light emitting element 503 are provided in a pixel 2702 in FIG. 15. This TFT has the same structure as that in Embodiment Mode 1.

Figure 14:
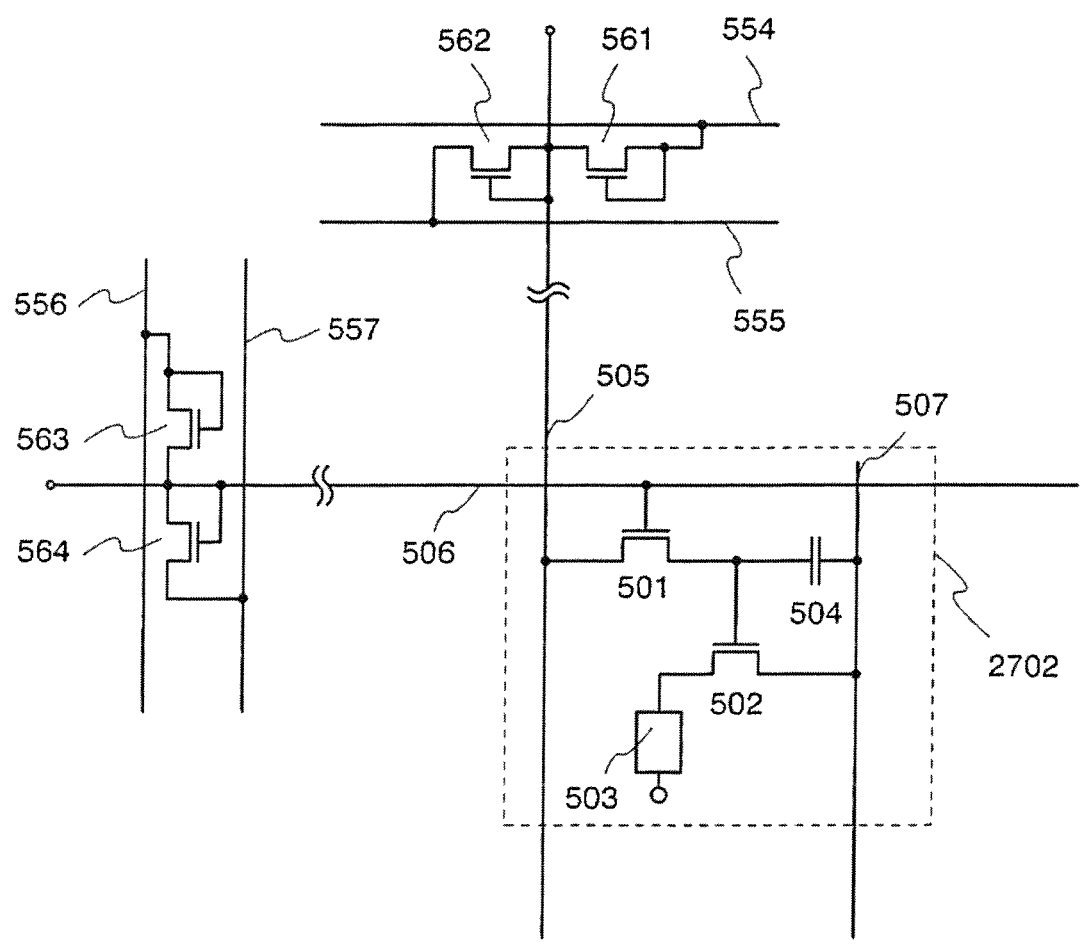
FIG. 14 is an equivalent circuit of an EL display device that is shown in FIG. 15.

Protective diodes 561 and 562 are provided for the signal line input terminal portion. These protective diodes are manufactured in the same step as that of the TFT 501 or 502 and are operated as diodes by being each connected to a gate and one of a drain and a source. FIG. 14 shows an equivalent circuit diagram of the top view shown in FIG. 15.

The protective diode 561 includes a gate electrode layer, a semiconductor layer and a wiring layer. The protective diode 562 has the similar structure. Common potential wirings 554 and 555 connecting to the protective diode are formed in the same layer as that of the gate electrode layer. Therefore, it is necessary to form a contact hole in the insulating layer to electrically connect the common potential wirings 554 and 555 to the wiring layer.

A mask layer may be formed and etching-processed to form a contact hole in the insulating layer. In this case, when etching at atmospheric pressure discharge is applied, a local electric discharging process can be performed, and the mask layer is not necessarily formed over the entire surface of the substrate.

A signal wiring layer is formed in the same layer as that of a source and drain wiring layer 505 in the TFT 501 and has a structure in which the signal wiring layer connected thereto is connected to the source or drain side.

The input terminal portion of the scanning signal line side also has the same structure. The protective diodes provided in an input stage can be formed at the same time. Note that the position of disposing a protective diode is not limited to this embodiment mode and can also be provided between the driver circuit and the pixel.

Embodiment Mode 6

Figure 16C:
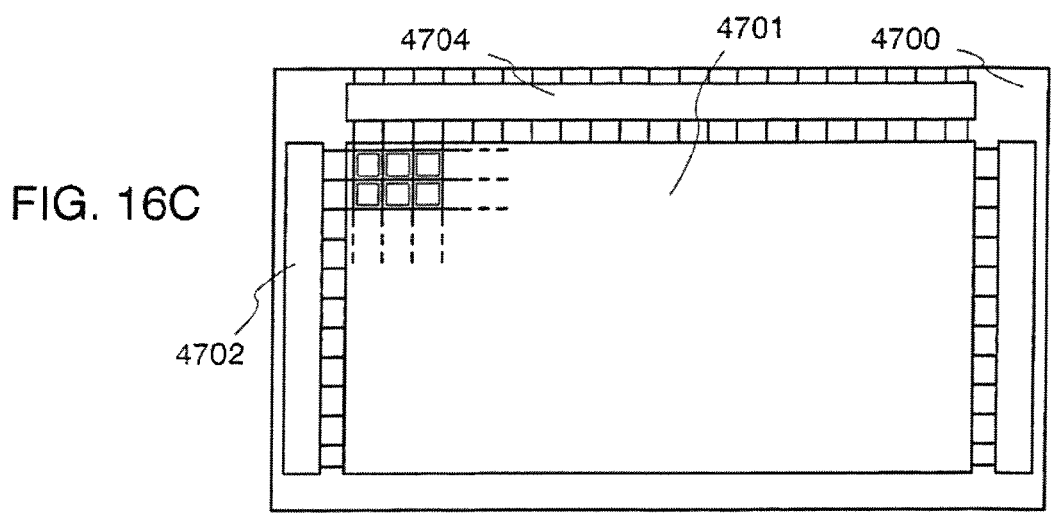

A television device can be completed with a display device formed according to the present invention. A display panel can be formed in any manner as follows: as the structure shown in FIG. 16A, only a pixel portion is formed, and a scan line driver circuit and a signal line driver circuit are mounted by a TAB method as shown in FIG. 17B; as the structure shown in FIG. 16A, only a pixel portion is formed, and a scan line driver circuit and a signal line driver circuit are mounted by a COG method as shown in FIG. 17A; a TFT is formed of a SAS, a pixel portion and a scan line driver circuit are formed to be integrated over a substrate, and a signal line driver circuit is separately mounted as a driver IC as shown in FIG. 16B; a pixel portion, a signal line driver circuit, and a scan line driver circuit are formed to be integrated over the substrate as shown in FIG. 16C; or the like.

Another structure of an external circuit includes a video signal amplifier circuit which amplifies a video signal among signals received by a tuner; a video signal processing circuit which converts the signal output therefrom into a chrominance signal corresponding to each color of red, green, and blue; a control circuit which converts the video signal into an input specification of a driver IC; and the like on the input side of the video signal. The control circuit outputs the signal into the scan line side and the signal line side, respectively. In the case of digital driving, a signal dividing circuit may be provided on the signal line side, so that an input digital signal is provided by dividing into m-pieces.

Among signals received from the tuner, an audio signal is transmitted to an audio signal amplifier circuit, and the output thereof is supplied for a speaker through an audio signal processing circuit. The control circuit receives control information on a receiving station (a receiving frequency) or sound volume from an input portion and transmits the signal to the tuner or the audio signal processing circuit.

Figure 20A:
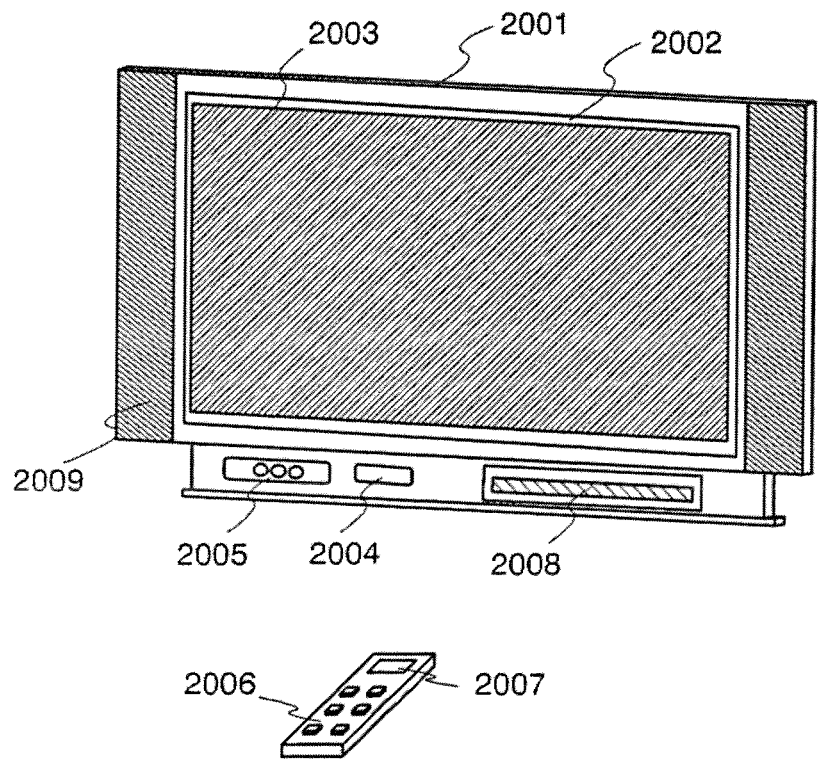
FIGS. 20A and 20B show an electronic device to which the present invention can be applied.
Figure 20B:
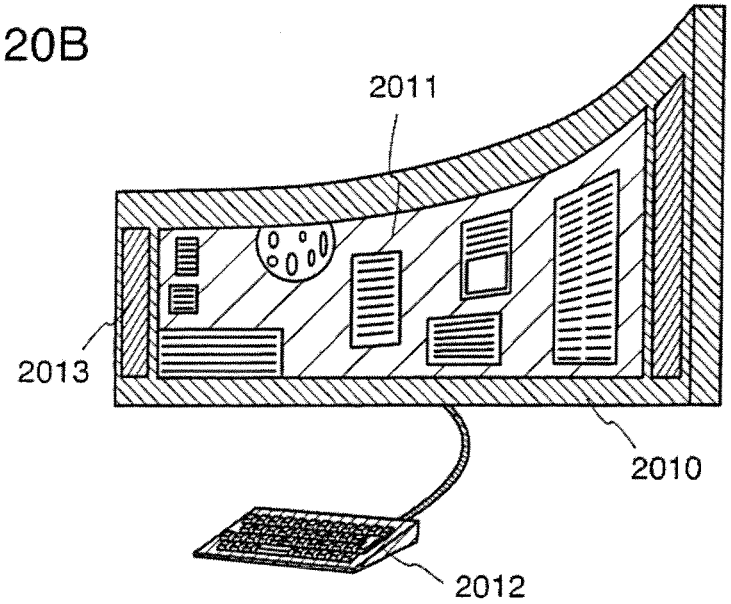

As shown in FIGS. 20A and 20B, a television device can be completed by incorporating a display module into a chassis. The display panel in which an FPC is attached as shown in FIG. 1 is generally called an EL display module. An EL television device can be completed when the EL display module as in FIG. 1 is used. A main screen 2003 is formed by using the display module, and a speaker unit 2009, operation switches, and the like are provided as other attached equipments. In such a manner, the television device can be completed according to the present invention.

In addition, reflected light of light entered from exterior may be shielded by using a wave plate and a polarizing plate. In the case of a top emission display device, an insulating layer which is to be a bank may be colored to be used as a black matrix. The bank can be formed by a droplet discharging method or the like, and a black resin pigment, a resin material such as polyimide, which is mixed with carbon black, or the like may be used, or a stacked structure thereof may also be used. Depending on a droplet discharging method, different materials may be discharged on the same region plural times to form the bank. Quarter or half wave plates may be used as wave plates and may be designed to be able to control light. As the structure, a TFT element substrate, a light emitting element, a sealing substrate (sealing material), wave plates (quarter or half wave plates), a polarizing plate are stacked in order, in which light emitted from the light emitting element is emitted outside from the polarizing plate side through the above components. The wave plate or polarizing plate may be provided on a side where light is emitted or may be provided on the both sides in the case of a dual emission type display device in which light is emitted from the both faces. In addition, an anti-reflective film may be provided on the outer side of the polarizing plate. Consequently, a higher definition and higher accurate image can be displayed.

As shown in FIG. 20A, a display panel 2002 using a display element is incorporated into a chassis 2001. By using a receiver 2005, in addition to reception of general TV broadcast, information communication can also be carried out in one direction (from a transmitter to a receiver) or in the both directions (between a transmitter and a receiver or between receivers) by connecting to a communication network by a fixed line or wirelessly through a modem 2004. The operation of the television device can be carried out by switches incorporated in the chassis or by a remote control device 2006, which is separated from the main body. A display portion 2007 that displays information to be output may be also provided in this remote control device.

In addition, in the television device, a structure for displaying a channel, sound volume, or the like may be additionally provided by forming a sub-screen 2008 as a second display panel in addition to the main screen 2003. In this structure, the main screen 2003 is formed of an EL display panel superior in a viewing angle, and the sub-screen may be formed of a liquid crystal display panel capable of displaying the sub-screen with low power consumption. In order to prioritize low power consumption, a structure in which the main screen 2003 is formed of a liquid crystal display panel, the sub-screen is formed of an EL display panel, and the sub-screen is able to flash on and off may be also applied. According to the present invention, a display device with high reliability can be manufactured using such a large substrate even when many TFTs and electronic parts are used.

FIG. 20B shows a television device having a large display portion of, for example, 20 inches to 80 inches, which includes a chassis 2010, a keyboard 2012 which is an operation portion, a display portion 2011, a speaker unit 2013, and the like. The invention is applied to manufacturing the display portion 2011. FIG. 20B shows a television device having a curved display portion since a bendable material is used for the display portion. Thus, a television device having a desired shape can be manufactured since the shape of the display portion can be freely designed.

According to the present invention, a display device can be manufactured through a simplified process and thus the manufacturing cost can be reduced. Hence, even a television device with a large screen display portion can be formed with low cost by applying the present invention. Accordingly, a high-performance and highly reliable television device can be manufactured with high yield.

Note that the present invention is not limited to the television device and is applicable to various usages especially to the display mediums having a large area such as an information display board at a station, an airport, or the like, or an advertisement display board on the street as well as a monitor of a personal computer.

Embodiment Mode 7

Various display devices can be manufactured by applying the present invention. In other words, the present invention can be applied to various electronic devices in which these display devices are incorporated into display portions.

The electronic devices include a camera such as a video camera or a digital camera, a projector, a head mounted display (a goggle type display), a car navigation system, a car stereo, a personal computer, a game machine, a portable information terminal (a mobile computer, a cellular phone, an electronic book, or the like), an image reproducing device provided with a recording medium (specifically a device that is capable of playing a recording medium such as a Digital Versatile Disc (DVD) and that has a display device that can display the image) or the like. FIGS. 21A to 21D show the examples thereof.

Figure 21A:
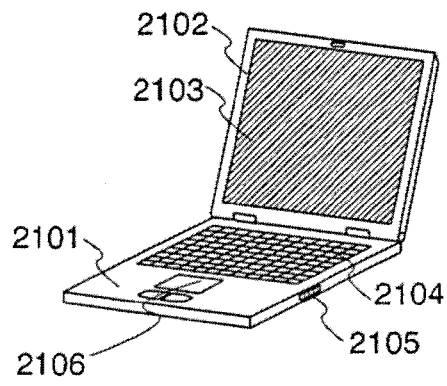
FIGS. 21A to 21D show an electronic device to which the present invention can be applied.

FIG. 21A shows a computer, which includes a main body 2101, a chassis 2102, a display portion 2103, a keyboard 2104, an external connection port 2105, a pointing mouse 2106 and the like. According to the present invention, a computer by which an image with high reliability and high resolution can be displayed can be completed even if the computer is miniaturized and a pixel becomes minute.

Figure 21B:
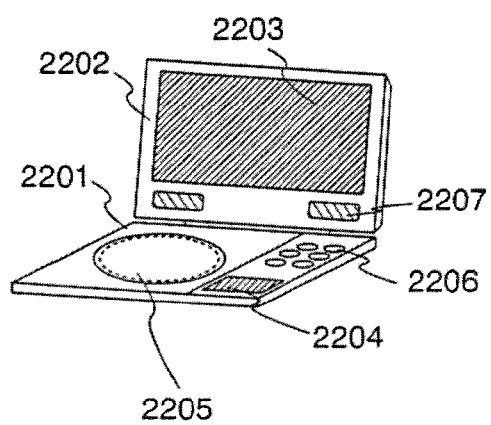

FIG. 21B shows an image reproducing device provided with a recording medium (specifically a DVD player), which includes a main body 2201, a chassis 2202, a display portion A 2203, a display portion B 2204, a recording medium (such as a DVD) reading portion 2205, operation keys 2206, a speaker portion 2207 and the like. The display portion A 2203 mainly displays image information and the display portion B 2204 mainly displays character information. According to the present invention, an image reproducing device by which an image with high reliability and high resolution can be displayed can be completed even when the image reproducing device is miniaturized and a pixel becomes minute.

Figure 21C:
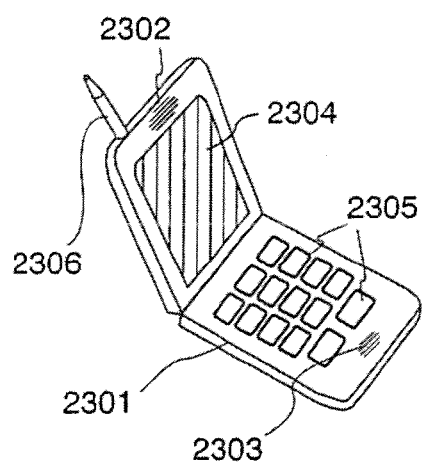

FIG. 21C shows a cellular phone, which includes a main body 2301, an audio output portion 2302, an audio input portion 2303, a display portion 2304, operation switches 2305, an antenna 2306 and the like. According to the present invention, a cellular phone by which an image with high reliability and high resolution can be displayed can be completed even when the cellular phone is miniaturized and a pixel becomes minute.

Figure 21D:
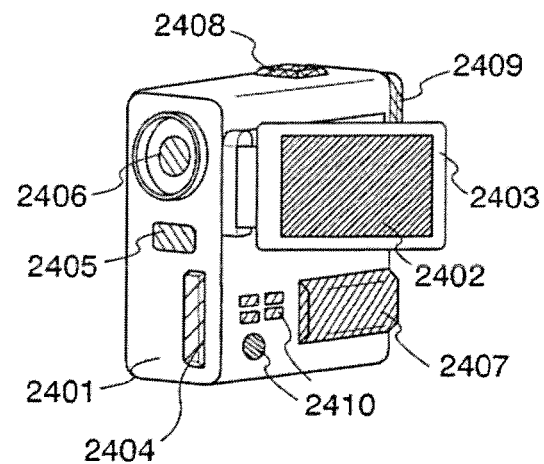

FIG. 21D shows a video camera, which includes a main body 2401, a display portion 2402, a chassis 2403, an external connection port 2404, a remote control receiving portion 2405, an image receiving portion 2406, a battery 2407, an audio input portion 2408, an eyepiece 2409, operation keys 2410 and the like. According to the present invention, a video camera by which an image with high reliability and high resolution can be displayed can be completed even when the video camera is miniaturized and a pixel is minute. This embodiment mode can be freely combined with the above embodiment modes.

EXAMPLES

Example 1

As for the etching process for forming an opening in the second interlayer insulating layer used in the present invention, an experiment is carried out changing etching conditions. The experimental results are shown below.

A sample is formed as follows: a source or drain electrode layer and a second interlayer insulating layer are formed, a mask of resist is formed thereover and etched to form an opening reaching the source or drain electrode layer in the second interlayer insulating layer, as described in Embodiment Mode 1. A titanium film is formed as the source or drain electrode layer and a silicon oxide film containing an alkyl group with a siloxane resin is formed by a coating method as the second interlayer insulating layer. A mask is formed for patterning and etching is conducted under nine etching conditions A to I. SEM photographs of the openings after etching by a scanning electron microscope are shown in FIGS. 22A to 22I. The state of residue that remains in the bottom of the opening is evaluated with three levels. The sample having no residue is shown by Level 1, the sample having less residue is shown by Level 2, and the sample having much residue is shown by Level 3. Each condition and each level of the residue is shown in Table 1.

TABLE 1

| | Power | | | Gas flow rate | | |
|---|---|---|---|---|---|---|
| Condition | ICP (W) | Bias (W) | Pressure (Pa) | $CF_4$ (sccm) | $O_2$ (sccm) | Residue level |
| A | 3000 | 2000 | 1 | 120 | 280 | 3 |
| B | 5000 | 3000 | 1 | 180 | 220 | 1 |
| C | 7000 | 4000 | 1 | 240 | 160 | 1 |
| D | 3000 | 3000 | 3 | 240 | 160 | 2 |
| E | 5000 | 4000 | 3 | 120 | 280 | 3 |
| F | 7000 | 2000 | 3 | 180 | 220 | 2 |
| G | 3000 | 4000 | 5 | 180 | 220 | 2 |
| H | 5000 | 2000 | 5 | 240 | 160 | 2 |
| I | 7000 | 3000 | 5 | 120 | 280 | 3 |

As apparent from FIGS. 22A to 22I and Table 1, in the sample in Condition B, a favorable opening having no residue can be formed. Moreover, as the second interlayer insulating layer, a two-layer stacked structure of a silicon oxynitride film and a silicon oxide film containing an alkyl group is formed, and the titanium film, the silicon oxynitride film and the silicon oxide film containing an alkyl group are stacked to form a sample. A mask of resist is formed in the sample and an opening to reach the titanium film is formed by etching. Each etching is conducted under eight etching conditions J to Q. Like the above described experiment, each condition is shown in Table 2 and SEM photographs of the openings after etching are shown in FIGS. 23A to 23H.

TABLE 2

| | Power | | | Gas flow rate | |
|---|---|---|---|---|---|
| Condition | ICP (W) | Bias (W) | Pressure (Pa) | $CF_4$ (sccm) | $O_2$ (sccm) |
| J | 5000 | 3000 | 1 | 180 | 220 |
| K | 5000 | 3000 | 0.8 | 180 | 220 |
| L | 5000 | 3000 | 1 | 240 | 160 |
| M | 5000 | 3000 | 0.8 | 240 | 160 |
| N | 5000 | 4000 | 0.8 | 240 | 160 |
| O | 7000 | 4000 | 0.8 | 240 | 160 |
| P | 7000 | 2000 | 0.8 | 240 | 160 |
| Q | 7000 | 1000 | 0.8 | 240 | 160 |

As apparent from FIGS. 23A to 23F, in the samples in Condition O, P and Q, favorable openings having less residue can be formed. As the experimental results, the selectivity of the titanium film and the silicon oxide film containing an alkyl group depends on a gas flow of $CF_4$ and $O_2$, and there is a tendency that the selectivity is enhanced by increasing the $O_2$ flow rate. Similarly, the selectivity of the silicon oxide film containing an alkyl group with a siloxane resin and the silicon oxynitride film depends on a gas flow of $CF_4$ and $O_2$, and there is a tendency that the selectivity is enhanced by increasing the $O_2$ flow rate. The uniformity of etching rate of the silicon oxide film including an alkyl group with the use of a siloxane resin depends on a pressure, and the pressure is made low and high vacuum is made to increase the uniformity. The residue due to an etching defect in the openings depends on the pressure and the flow rate of $CF_4$ and $O_2$, the pressure is made low to make high vacuum and the flow rate of $CF_4$ is reduced, thereby reducing the residue. In consideration of the above, an etching condition can be set. An opening having superior flatness that can obtain a favorable contact of the first electrode layer, and the source and drain electrode layer can be formed through a simplified process.

Example 2

Insulating films for forming a display device are formed continuously and an evaluated result of an interface state therebetween is shown in Example 2.

In Example 2, as an insulating film, a silicon nitride oxide (SiNO) film is formed as a first insulating film, and a silicon oxynitride (SiON) film is stacked thereover as a second insulating film. The first and second insulating films are formed continuously by changing reactive gases at the same temperature of 330° C. while keeping the vacuum (without breaking the vacuum) in the same chamber.

In Example 2, over a glass substrate, a silicon nitride oxide (SiNO) film of 200 nm thick is formed with each gas flow of $SiH_4$ of 80 sccm, $NH_3$ of 750 sccm, $H_2$ of 400 sccm, $N_2$ of 400 sccm, $N_2O$ of 60 sccm as a reactive gas; the pressure of 65 Pa; the frequency of 18.56 MHz; and the power of 730 W. Then, a silicon oxynitride (SiON) film of 800 nm thick is formed continuously with each gas flow of $SiH_4$ of 75 sccm, $N_2O$ of 1200 sccm as a reactive gas; the pressure of 70 Pa; the frequency of 13.56 MHz; and the power of 120 W. After that, the films are taken into the air and an amorphous silicon (a-Si) film is formed as a cap film for protection, with each gas flow of $SiH_4$ of 220 sccm and $H_2$ of 220 sccm as a reactive gas; the pressure of 160 Pa; the frequency of 13.56 MHz; and the power of 160 W.

Figure 24:
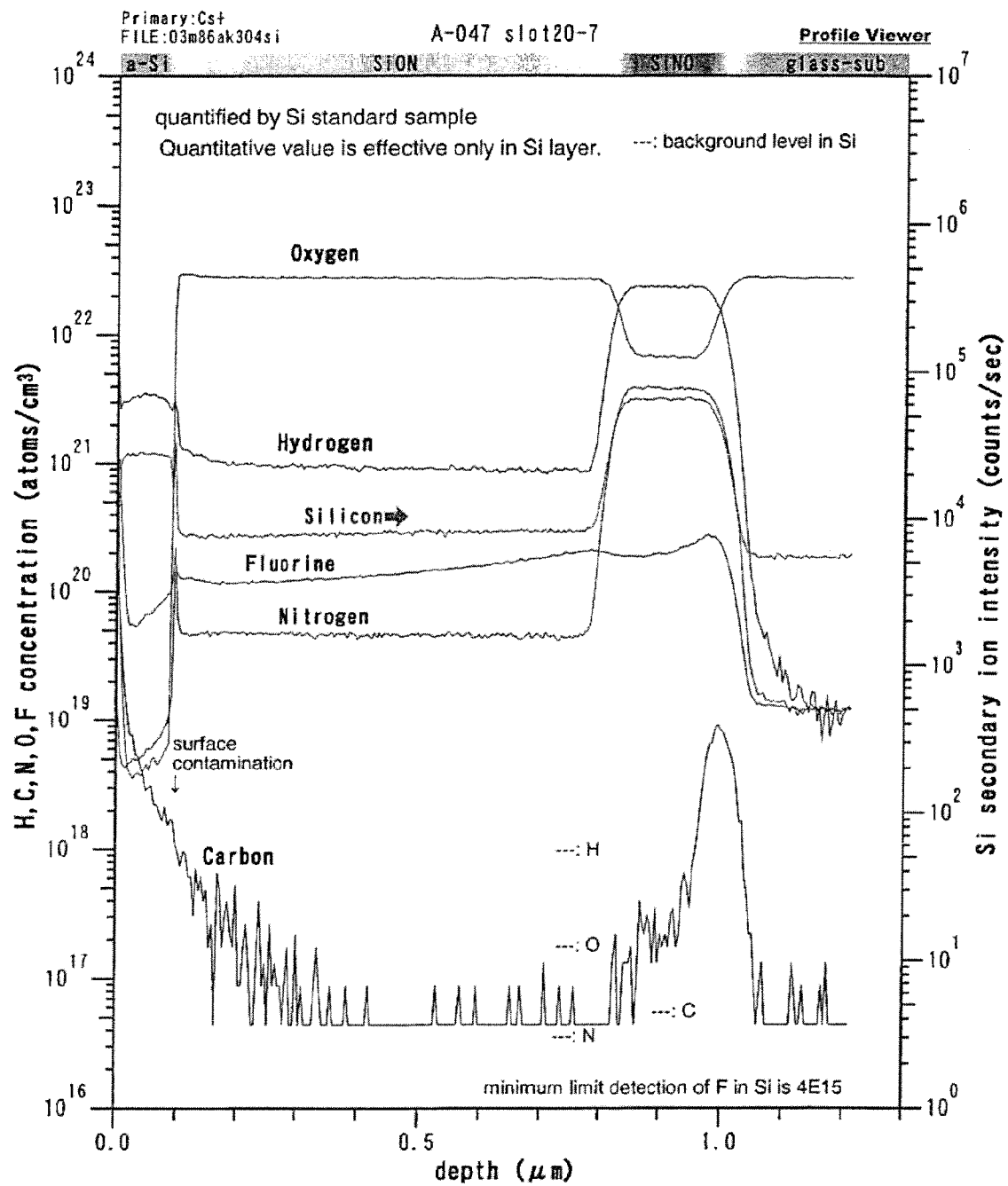
FIG. 24 shows an SIMS analysis result of a sample manufactured in Example 2.
Figure 25:
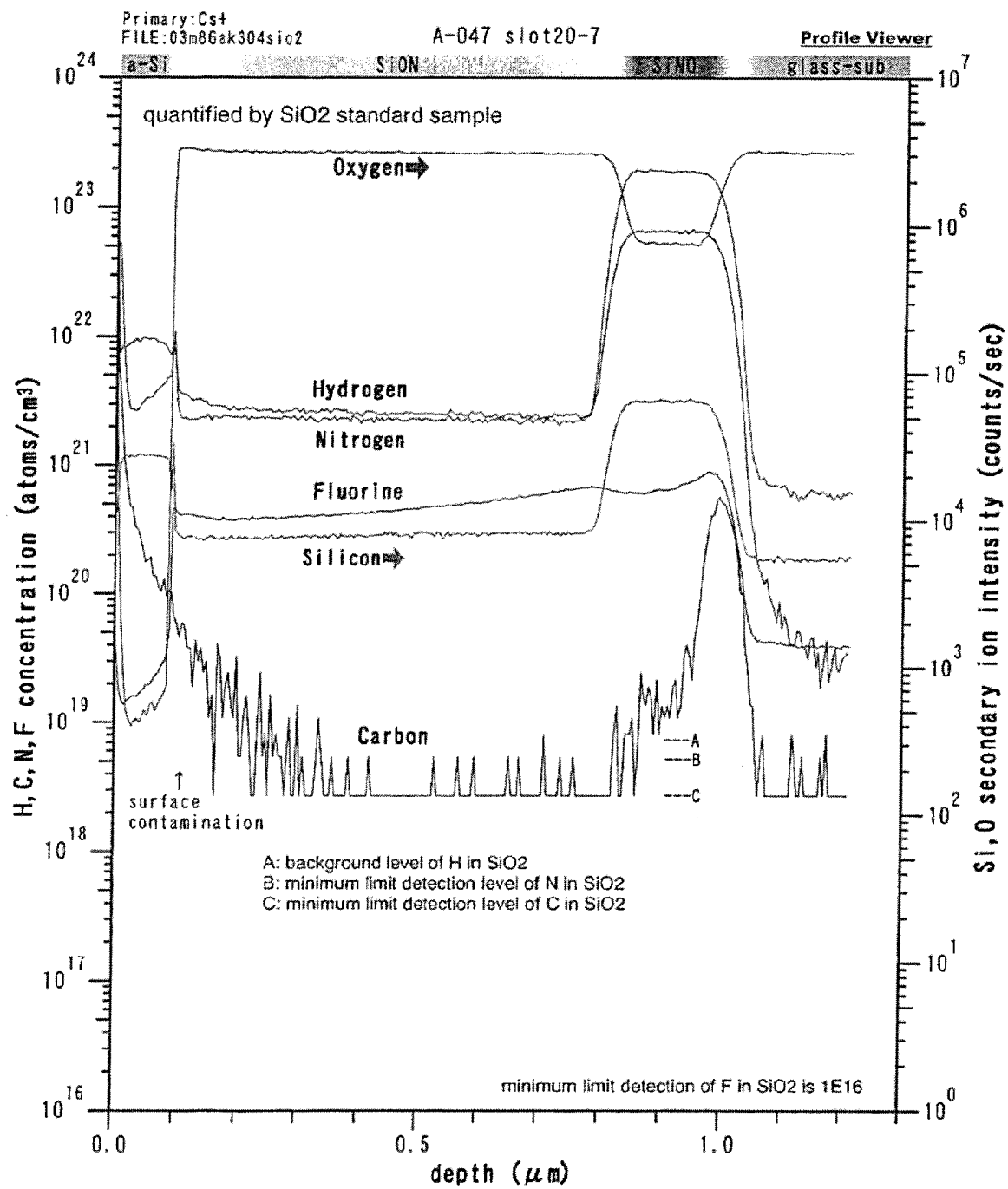
FIG. 25 shows an SIMS analysis result of a sample manufactured in Example 2.
Figure 26:
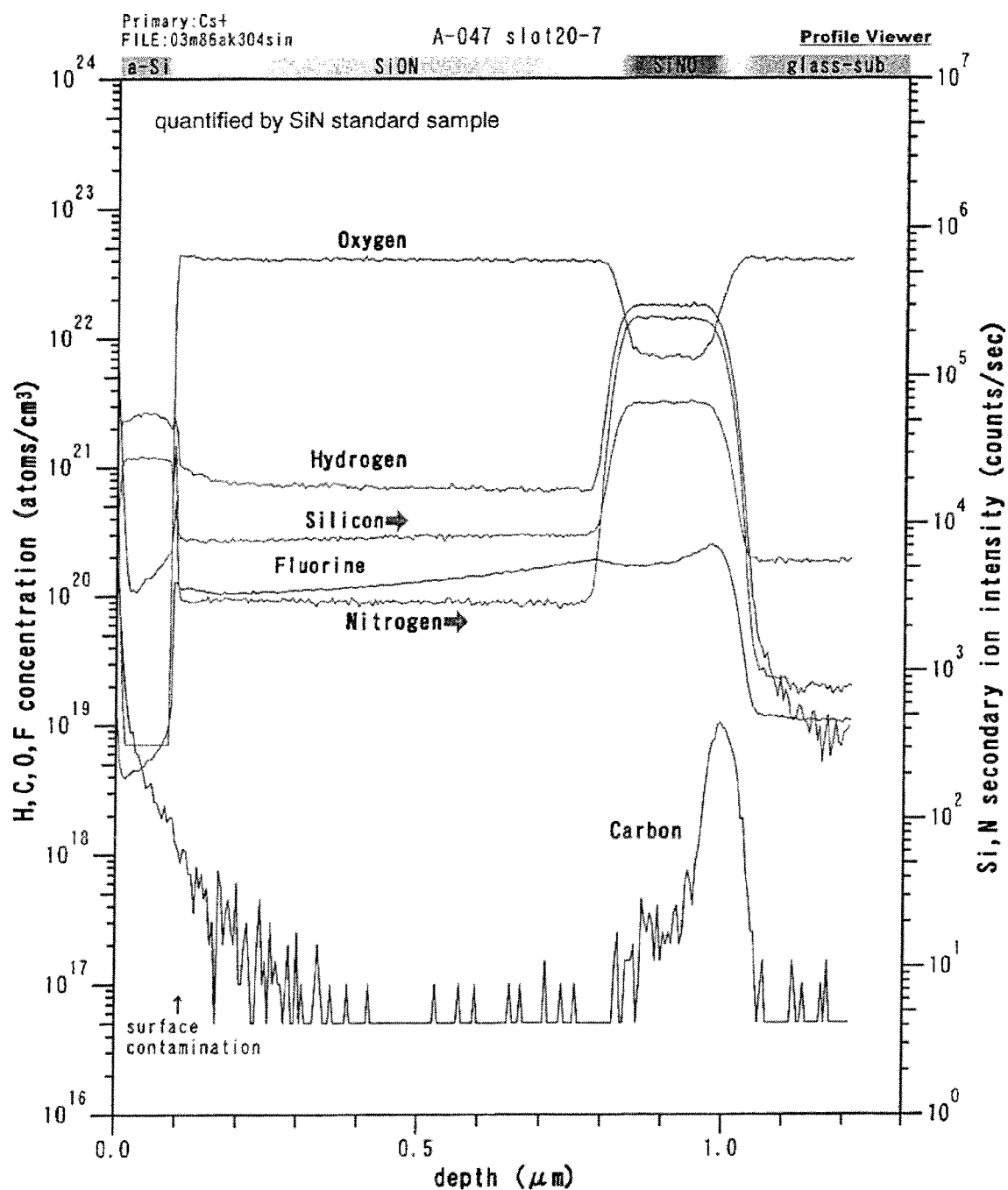
FIG. 26 shows an SIMS analysis result of a sample manufactured in Example 2.

The samples in which SiNO, SiON and a-Si are in order stacked over the glass substrate are analyzed using a SIMS (secondary ion mass spectrometry). As the stacked layer of SiNO and SiON, the interface state of the stacked layer and the impurity concentration (H, C, N, O, F) included in each film are measured. The measurement results are shown in FIGS. 24 to 26. FIG. 24 shows data quantified by Si standard sample, FIG. 25 shows data quantified by $SiO_2$ standard sample, and FIG. 26 shows data quantified by SiN standard sample.

As the SiNO film, the hydrogen concentration is $1.8 \times 10^{22}$ atoms/cm$^3$, the carbon concentration is $2.0 \times 10^{17}$ atoms/cm$^3$, the oxygen concentration is $7.4 \times 10^{21}$ atoms/cm$^3$, and the fluorine concentration is $1.8 \times 10^{20}$ atoms/cm$^3$. As the SiON film, the hydrogen concentration is $2.5 \times 10^{21}$ atoms/cm$^3$, the carbon concentration is $2.7 \times 10^{18}$ atoms/cm$^3$, the nitrogen concentration is $2.3 \times 10^{21}$ atoms/cm$^3$, and the fluorine concentration is $4.4 \times 10^{20}$ atoms/cm$^3$. As the a-Si film, the hydrogen concentration is $3.5 \times 10^{21}$ atoms/cm$^3$, the carbon concentration is $2.9 \times 10^{18}$ atoms/cm$^3$, the nitrogen concentration is $6.7 \times 10^{19}$ atoms/cm$^3$, the oxygen concentration is $4.2 \times 10^{18}$ atoms/cm$^3$, and the fluorine concentration is $6.0 \times 10^{18}$ atoms/cm$^3$.

As apparent from FIGS. 24 to 26, the interface impurity concentration of the SiNO film and the SiON film do not show a pileup phenomenon caused by high concentration impurities due to contamination. Thus, it is observed that the interface state is favorable. In addition, it is not observed that a component of the reactive gas (such as $NH_3$) used in forming the SiNO film is diffused into the SiON film. Therefore, it is confirmed that insulating films can be formed with a favorable interface state without contamination of the interface, when the insulating films are continuously stacked in the same chamber without being exposed to the air. When such insulating films are used as one component for forming a display device, the reliability of the display device can be enhanced.

What is claimed is:

1. A display module comprising:
   a pixel region, a wiring region and an external terminal connection region,
   the pixel region comprising:
      a transistor including a semiconductor region, a gate insulating layer, a gate electrode, a source electrode and a drain electrode;
      an interlayer insulating layer over the source electrode and the drain electrode;
      a first electrode over the interlayer insulating layer, wherein the first electrode is electrically connected with one of the source electrode and the drain electrode, and wherein the first electrode includes a reflective metal layer and a transparent conductive film over and in contact with the reflective metal layer;
      an insulator partly overlapping the first electrode;
      an electroluminescent layer over the first electrode and the insulator;
      a second electrode over the electroluminescent layer and the insulator; and
   the wiring region comprising:
      a first wiring over and in direct contact with a same layer on which the source electrode and the drain electrode are formed; and
      a sealing material in direct contact with the first wiring;
   the external terminal connection region comprising:
      a terminal electrode over and in direct contact with the same layer on which the source electrode and the drain electrode are formed;
      an anisotropic conductive layer in direct contact with the terminal electrode; and
      a flexible printed circuit in direct contact with the anisotropic conductive layer.

2. The display module according to claim 1, wherein the sealing material contains a resin.

3. The display module according to claim 1, wherein the same layer is a silicon oxynitride layer.

4. The display module according to claim 1, wherein the reflective metal layer includes one of Ta, W, Ti, Mo, Al, and Cu.

5. The display module according to claim 1, wherein a cross-sectional width of the transparent conductive film is larger than a cross-sectional width of the reflective metal layer.

6. The display module according to claim 1, further comprising a connection region between the pixel region and the wiring region, wherein the second electrode is in direct contact with a second wiring through an opening, and wherein the second wiring is over and in direct contact with the same layer on which the source electrode and the drain electrode are formed.

7. The display module according to claim 1, wherein the second electrode includes one of MgAg, MgIn, AlLi, CaF$_2$, and CaN.

8. The display module according to claim 1, wherein the display module is incorporated in a chassis of one selected from the group consisting of a television device, a computer, an image reproducing device, a cellular phone, and a video camera.

9. A display module comprising:
   a pixel region, a wiring region and an external terminal connection region,
   the pixel region comprising:
      a transistor including a semiconductor region, a gate insulating layer, a gate electrode, a source electrode and a drain electrode;
      an interlayer insulating layer over the source electrode and the drain electrode;
      a first electrode over the interlayer insulating layer, wherein the first electrode is electrically connected with one of the source electrode and the drain electrode, and wherein the first electrode includes a reflective metal layer and a transparent conductive film over and in contact with the reflective metal layer;
      an insulator partly overlapping the first electrode;
      an electroluminescent layer over the first electrode and the insulator;
      a second electrode over the electroluminescent layer and the insulator; and
   the wiring region comprising:
      a first wiring over and in direct contact with a same layer on which the source electrode and the drain electrode are formed; and
      a sealing material in direct contact with the first wiring, wherein the sealing material does not overlap the insulator;
   the external terminal connection region comprising:
      a terminal electrode over and in direct contact with the same layer on which the source electrode and the drain electrode are formed;
      an anisotropic conductive layer in direct contact with the terminal electrode; and
      a flexible printed circuit in direct contact with the anisotropic conductive layer.

10. The display module according to claim 9, wherein the sealing material contains a resin.

11. The display module according to claim 9, wherein the same layer is a silicon oxynitride layer.

12. The display module according to claim 9, wherein the reflective metal layer includes one of Ta, W, Ti, Mo, Al, and Cu.

13. The display module according to claim 9, wherein a cross-sectional width of the transparent conductive film is larger than a cross-sectional width of the reflective metal layer.

14. The display module according to claim 9, further comprising a connection region between the pixel region and the wiring region, wherein the second electrode is in direct contact with a second wiring through an opening, and wherein the second wiring is over and in direct contact with the same layer on which the source electrode and the drain electrode are formed.

15. The display module according to claim 9, wherein the second electrode includes one of MgAg, MgIn, AlLi, CaF?, and CaN.

16. The display module according to claim 9, wherein the display module is incorporated in a chassis of one selected from the group consisting of a television device, a computer, an image reproducing device, a cellular phone, and a video camera.

* * * * *